US012648124B2

(12) United States Patent
Harada et al.

(10) Patent No.: US 12,648,124 B2
(45) Date of Patent: Jun. 2, 2026

(54) PILLAR-SHAPED SEMICONDUCTOR DEVICE AND METHOD FOR PRODUCING THE SAME

(71) Applicant: Unisantis Electronics Singapore Pte. Ltd., Singapore (SG)

(72) Inventors: Nozomu Harada, Tokyo (JP); Kenichi Kanazawa, Tokyo (JP); Yisuo Li, Singapore (SG)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 714 days.

(21) Appl. No.: 17/902,620

(22) Filed: Sep. 2, 2022

(65) Prior Publication Data

US 2023/0058135 A1     Feb. 23, 2023

Related U.S. Application Data

(63) Continuation of application No. PCT/JP2020/009721, filed on Mar. 6, 2020.

(51) Int. Cl.
H10B 10/00     (2023.01)

(52) U.S. Cl.
CPC .................................. H10B 10/125 (2023.02)

(58) Field of Classification Search
CPC .. H10D 62/105; H10D 62/107; H10D 62/114; H10D 62/153; H10D 30/64; H01L 21/761; H01L 21/76; H10B 10/125
See application file for complete search history.

(56) References Cited

U.S. PATENT DOCUMENTS

| | | | |
|---|---|---|---|
| 6,274,894 B1 * | 8/2001 | Wieczorek | ........... H10D 62/021 |
| | | | 257/E21.409 |
| 8,530,960 B2 | 9/2013 | Masuoka et al. | |
| 2010/0219483 A1 | 9/2010 | Masuoka et al. | |

(Continued)

FOREIGN PATENT DOCUMENTS

| | | | |
|---|---|---|---|
| EP | 2246895 A1 | 11/2010 | |
| JP | 02-188966 A | 7/1990 | |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) Ultra-High-Density LSI's", IEEE Transaction on Electron Devices, vol. 38, No. 3, pp. 573-578 (1991).

(Continued)

*Primary Examiner* — Suberr L Chi
(74) *Attorney, Agent, or Firm* — Crowell & Moring LLP

(57)     ABSTRACT

A method for forming a first impurity region 3 connected to lower portions of first semiconductor pillars and second impurity regions 4a and 4b connected to lower portions of second semiconductor pillars includes forming a semiconductor layer 100 having an impurity concentration lower than an impurity concentration of each of the first impurity region 3 and the second impurity regions 4a and 4b in impurity boundary regions of the first impurity region 3 and the second impurity regions 4a and 4b in a vertical direction and a horizontal direction.

3 Claims, 42 Drawing Sheets

(56) References Cited

U.S. PATENT DOCUMENTS

| | | | |
|---|---|---|---|
| 2014/0070377 A1* | 3/2014 | Yu ....................... | H01L 21/0245 |
| | | | 117/89 |
| 2015/0325444 A1 | 11/2015 | Masuoka et al. | |
| 2015/0372058 A1* | 12/2015 | Park ..................... | H10D 30/025 |
| | | | 438/238 |
| 2016/0042783 A1 | 2/2016 | Masuoka et al. | |
| 2016/0056174 A1 | 2/2016 | Masuoka et al. | |
| 2016/0197181 A1 | 7/2016 | Masuoka et al. | |
| 2018/0197964 A1* | 7/2018 | Masuoka .......... | H10D 30/6728 |
| 2019/0148387 A1 | 5/2019 | Masuoka et al. | |
| 2019/0259876 A1 | 8/2019 | Masuoka et al. | |

FOREIGN PATENT DOCUMENTS

| | | |
|---|---|---|
| TW | 201306233 | 2/2013 |
| TW | 201941435 | 10/2019 |
| WO | WO 2014/184933 A | 11/2014 |
| WO | WO 2015/033382 A | 3/2015 |
| WO | WO 2015/059789 A | 4/2015 |
| WO | WO 2017/104066 A | 6/2017 |
| WO | WO 2019/087328 A | 5/2019 |

OTHER PUBLICATIONS

C.Y.Ting, V.J.Vivalda, and H.G.Schaefer: "Study of planarized sputter-deposited SiO2", J.Vac.Sci. Technol. 15(3), pp. 1105-1112, (May/Jun. 1978).

A.Raley, S.Thibaut, N. Mohanty, K. Subhadeep, S. Nakamura, etal. : "Self-aligned quadruple patterning integration using spacer on spacer pitch splitting at the resist level for sub-32nm pitch applications" Proc. Of SPIE vol. 9782, 2016

International Preliminary Report on Patentability in Application No. PCT/JP2020/009721, dated Sep. 15, 2022, 5 pages.

* cited by examiner

FIG. 1AA
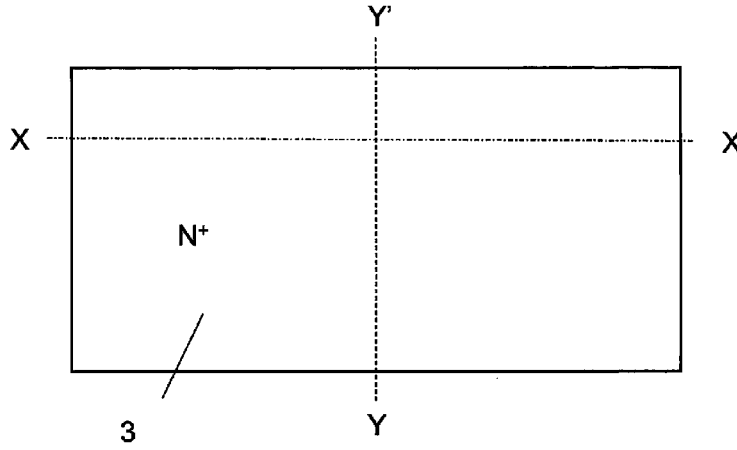
FIG. 1AB
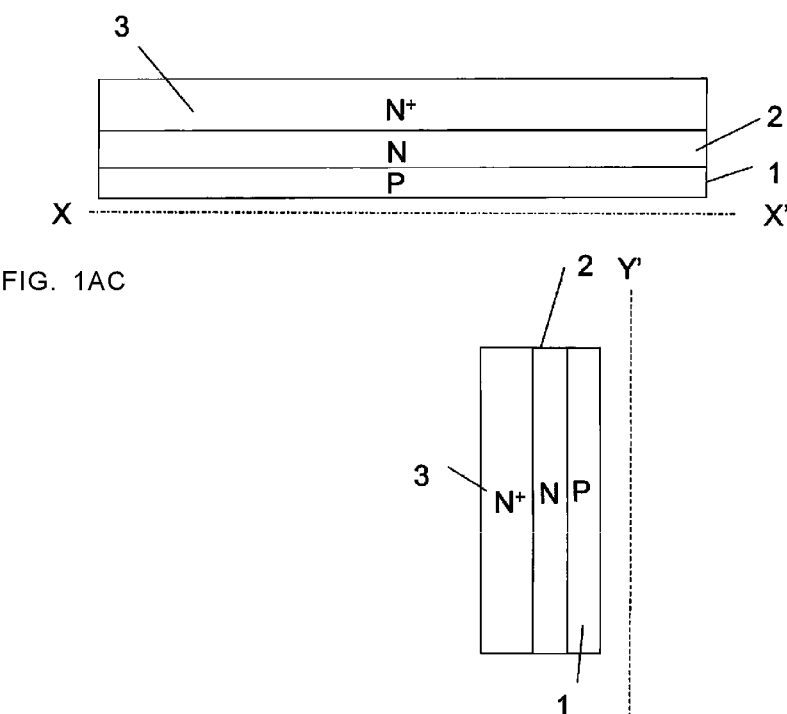
FIG. 1AC

FIG. 1BA
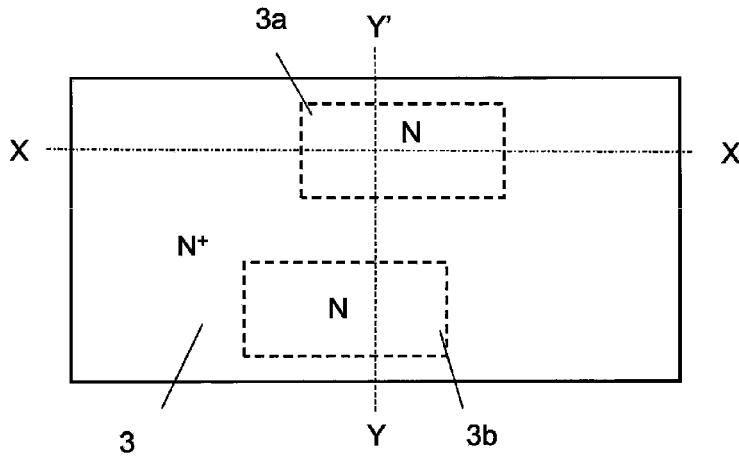
FIG. 1BB
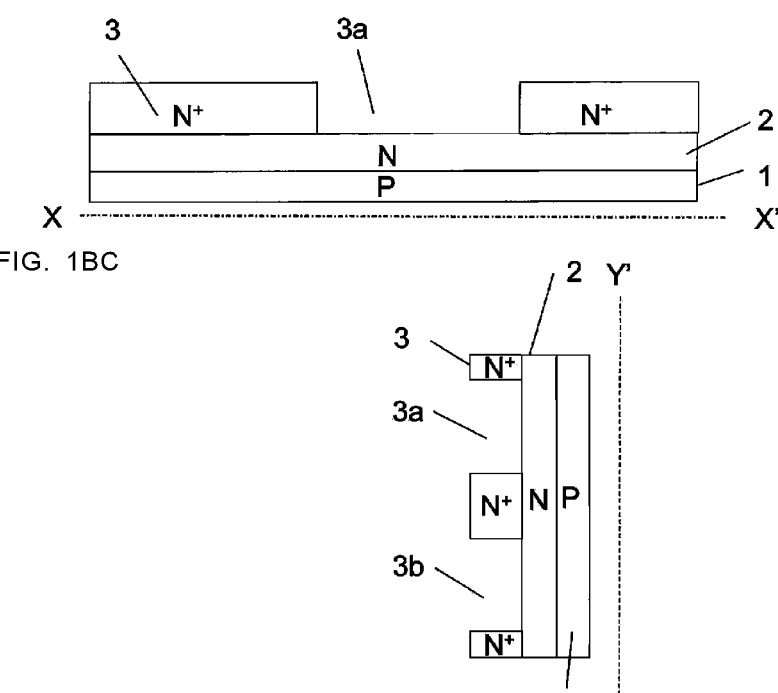
FIG. 1BC

FIG. 1CA
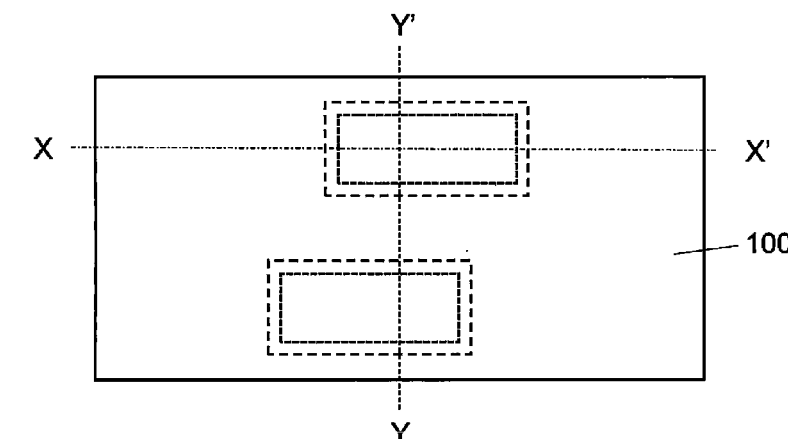
FIG. 1CB
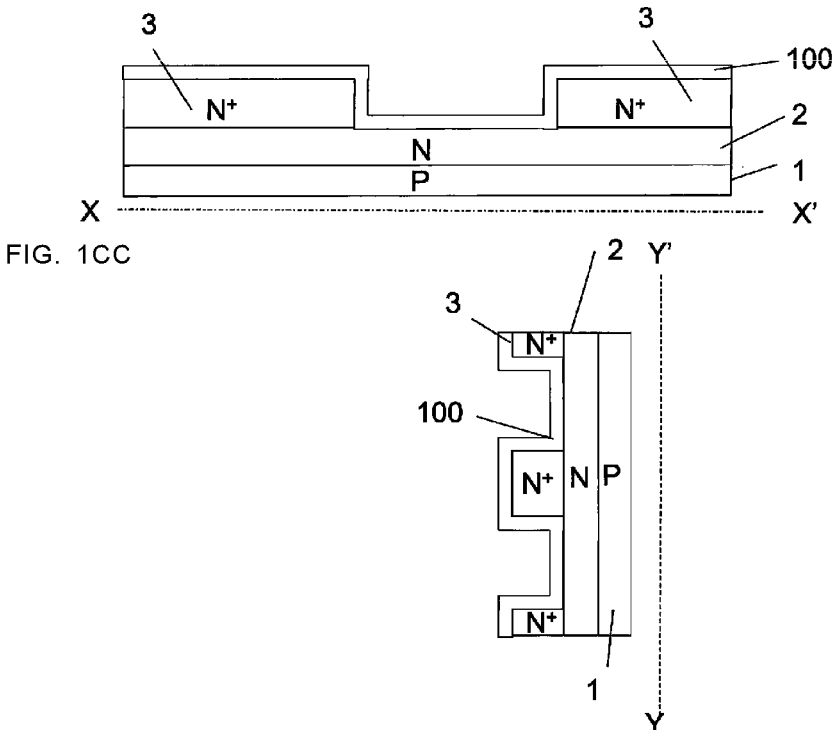
FIG. 1CC

FIG. 1DA
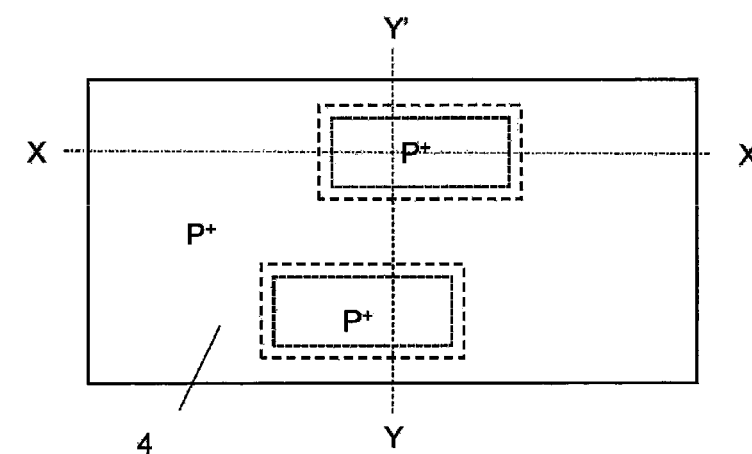
FIG. 1DB
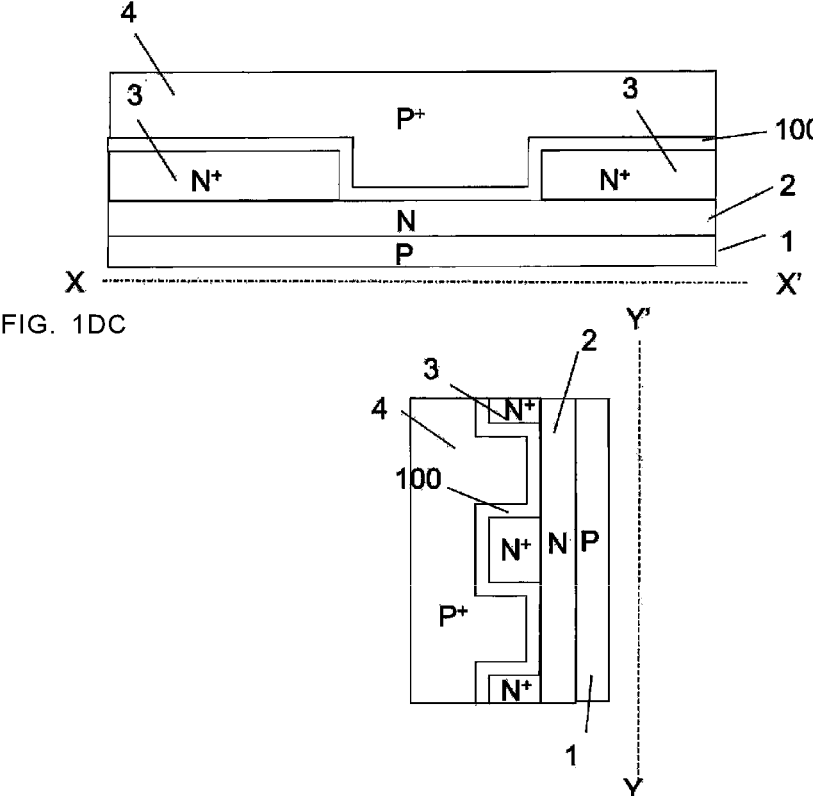
FIG. 1DC

FIG. 1EA
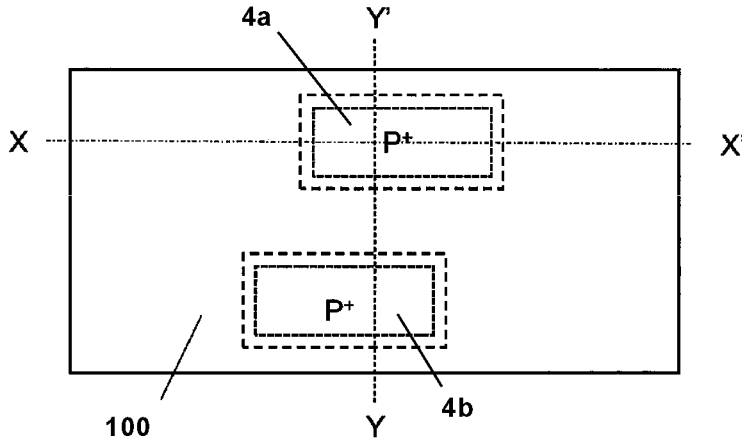
FIG. 1EB
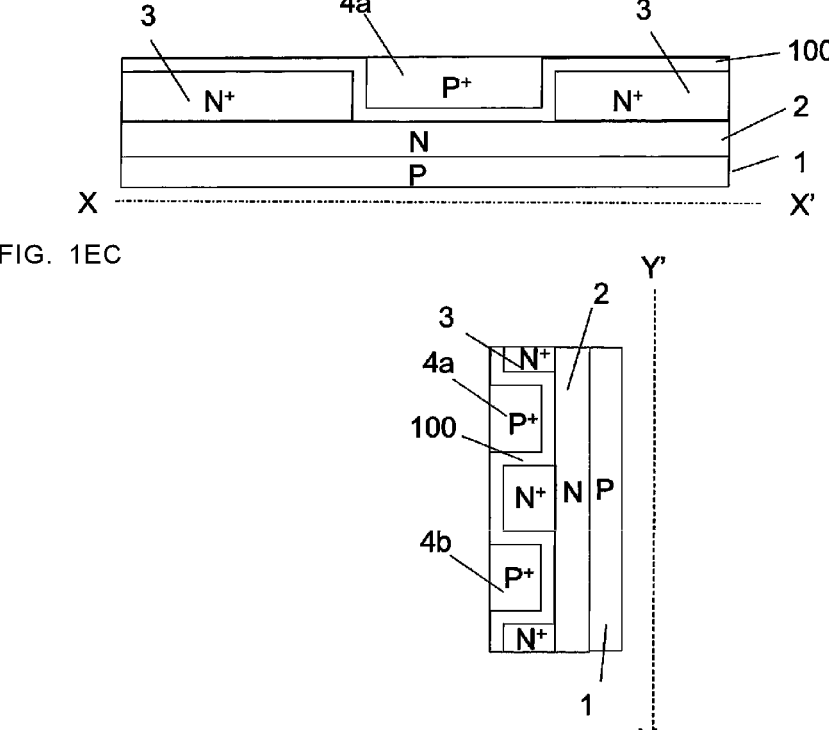
FIG. 1EC

FIG. 1NA
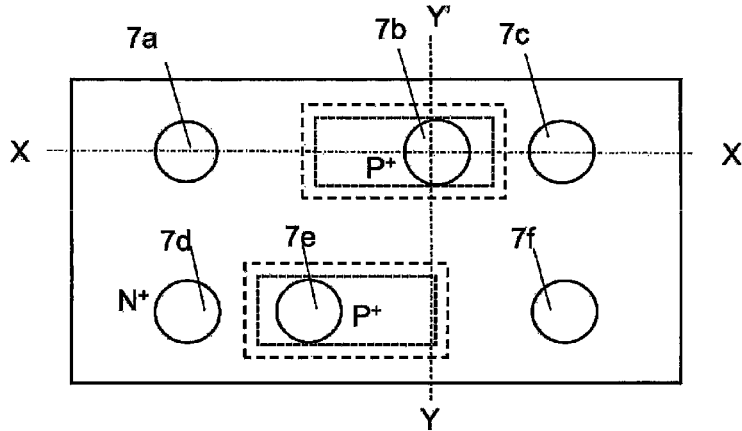
FIG. 1NB
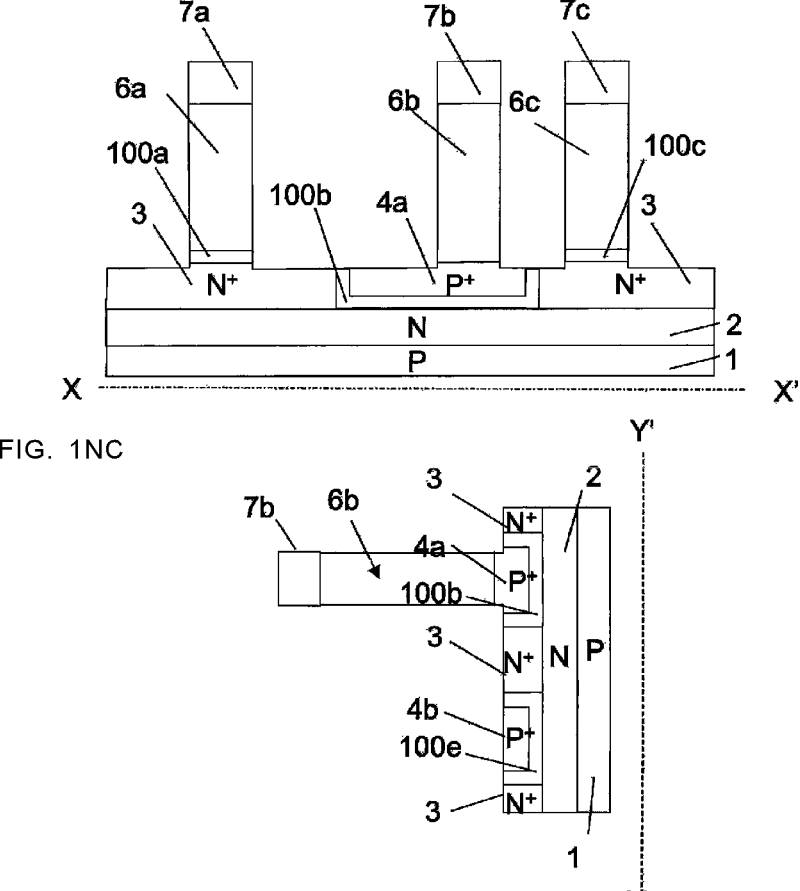
FIG. 1NC

FIG. 1OA
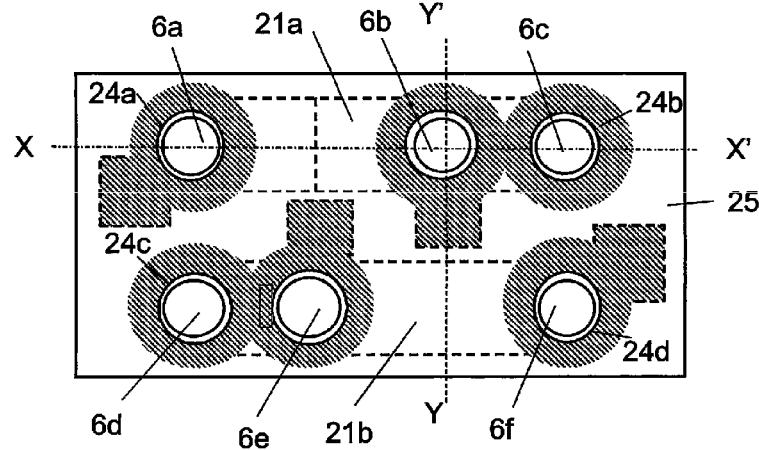
FIG. 1OB
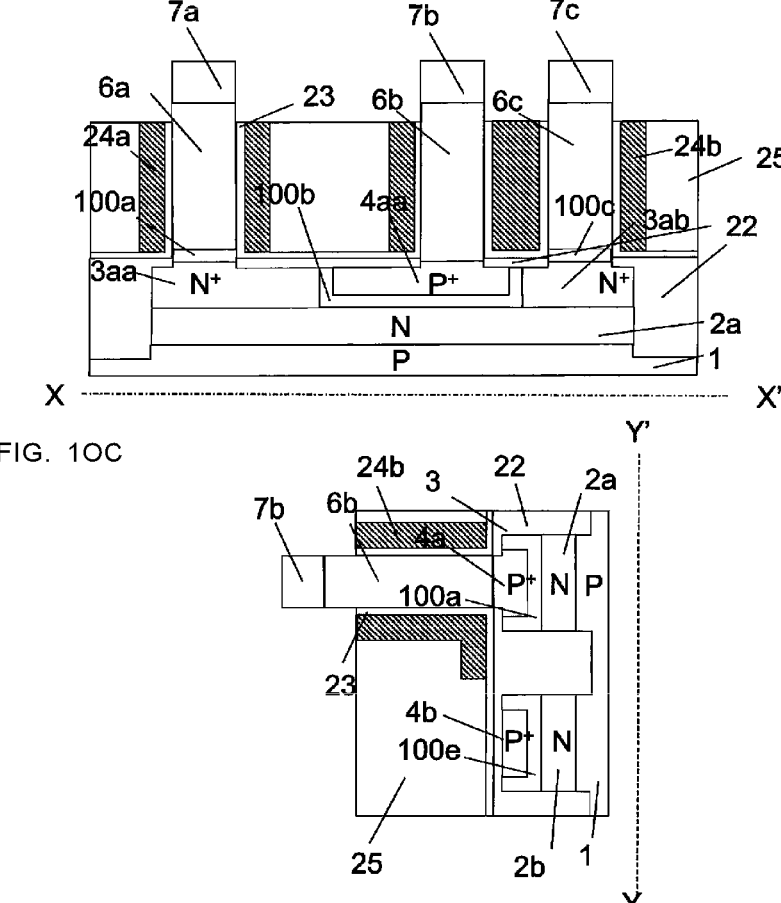
FIG. 1OC

FIG. 1PA
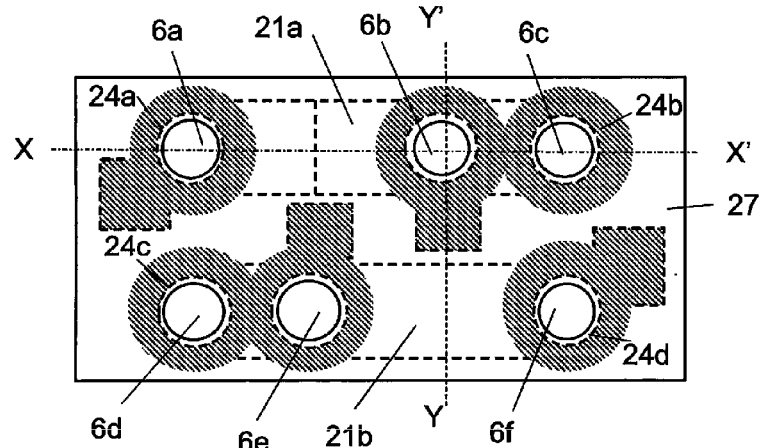
FIG. 1PB
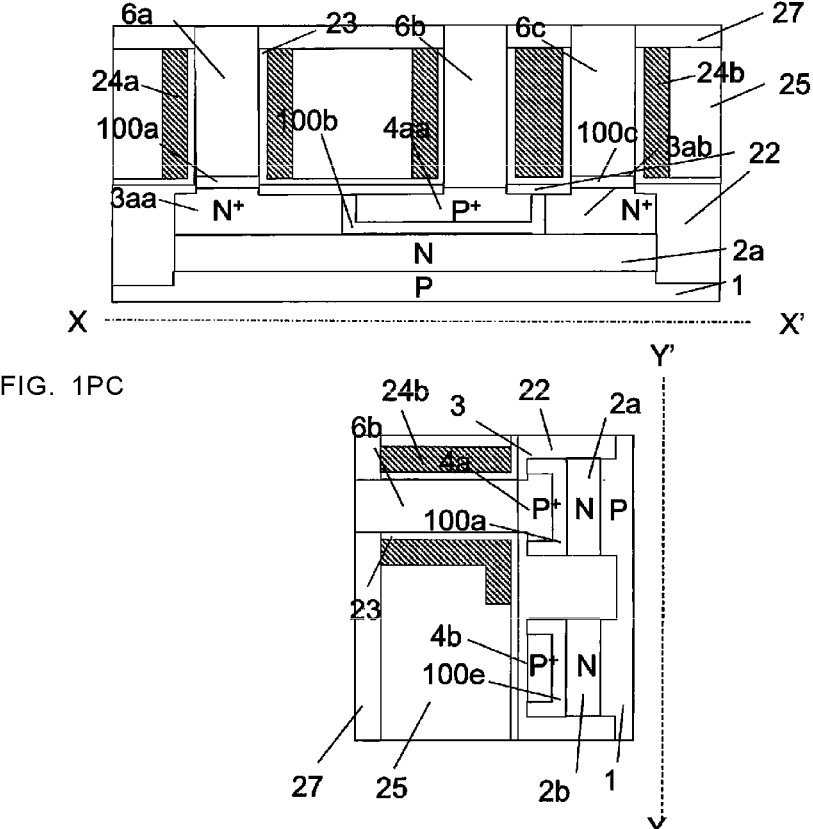
FIG. 1PC

FIG. 1QA
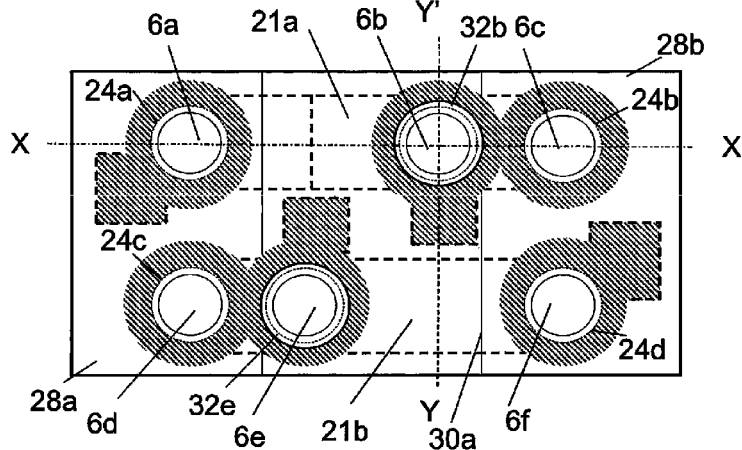
FIG. 1QB
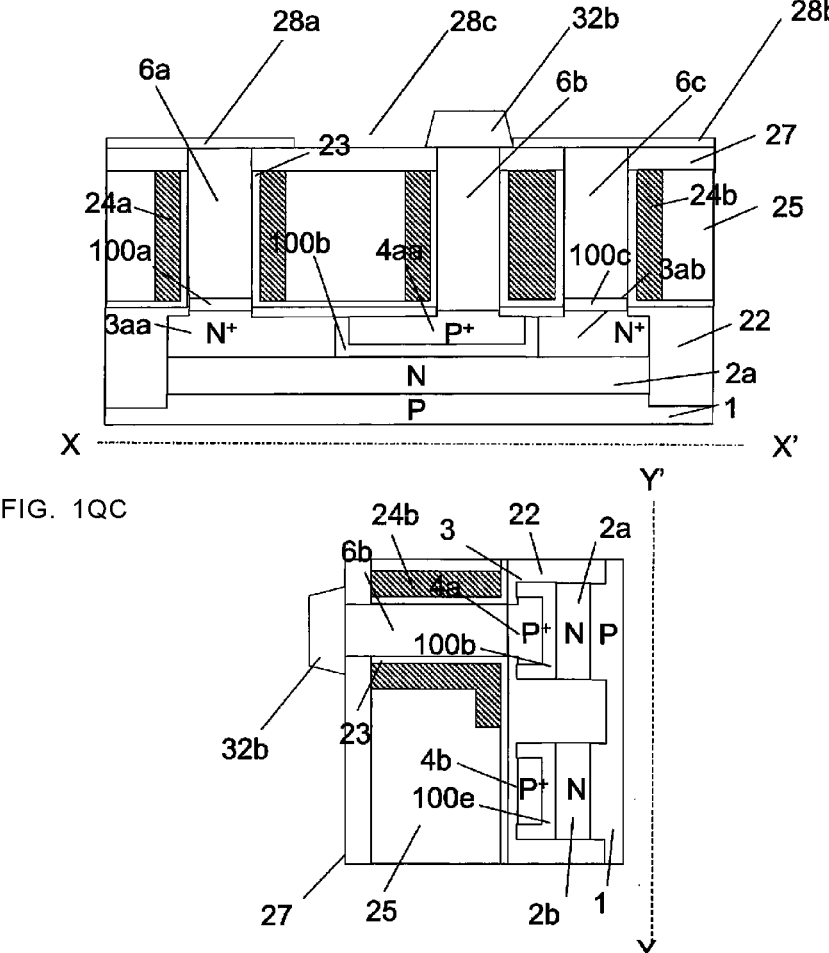
FIG. 1QC

FIG. 1SA
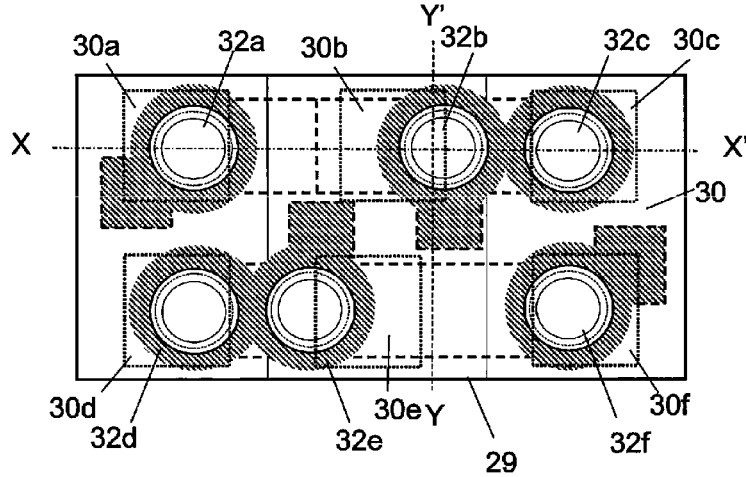
FIG. 1SB
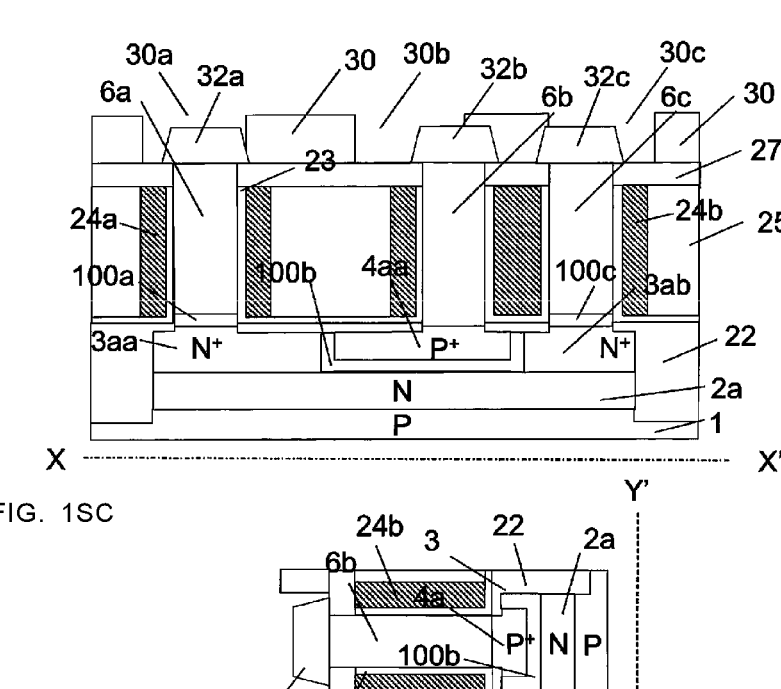
FIG. 1SC

FIG. 2AA
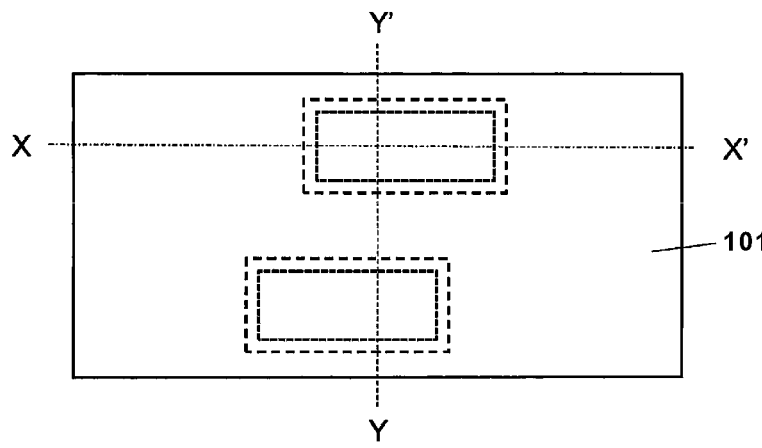
FIG. 2AB
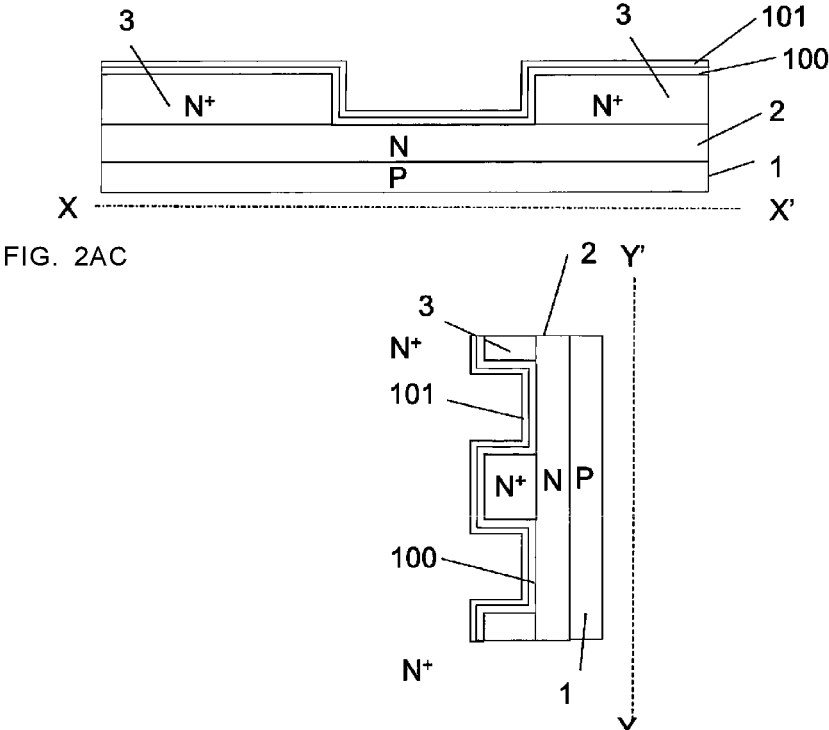
FIG. 2AC

FIG. 2BA
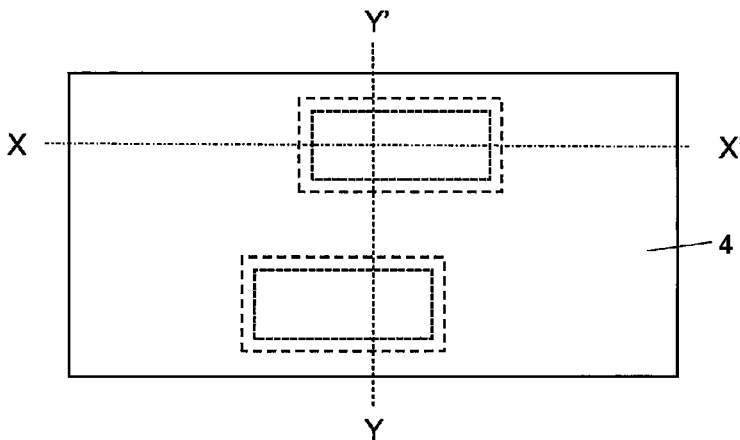
FIG. 2BB
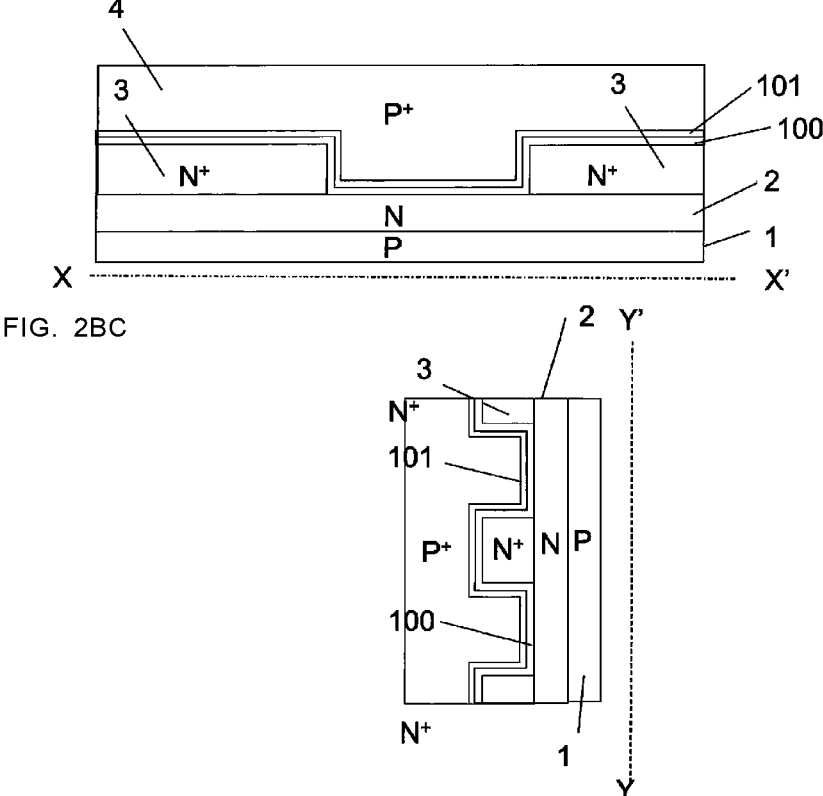
FIG. 2BC

FIG. 2CA
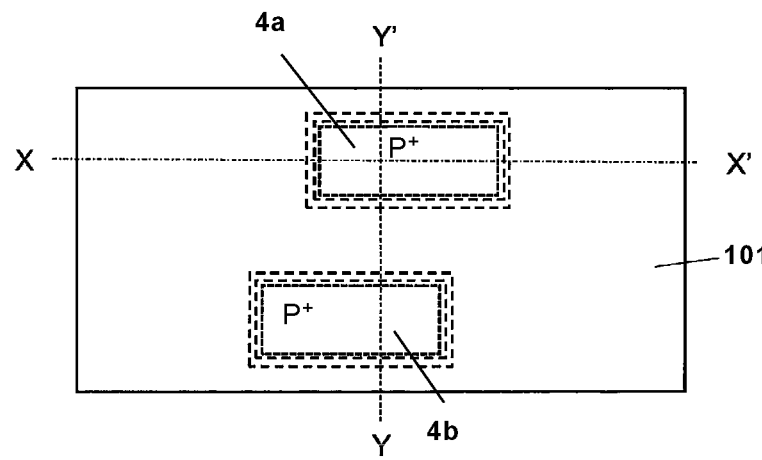
FIG. 2CB
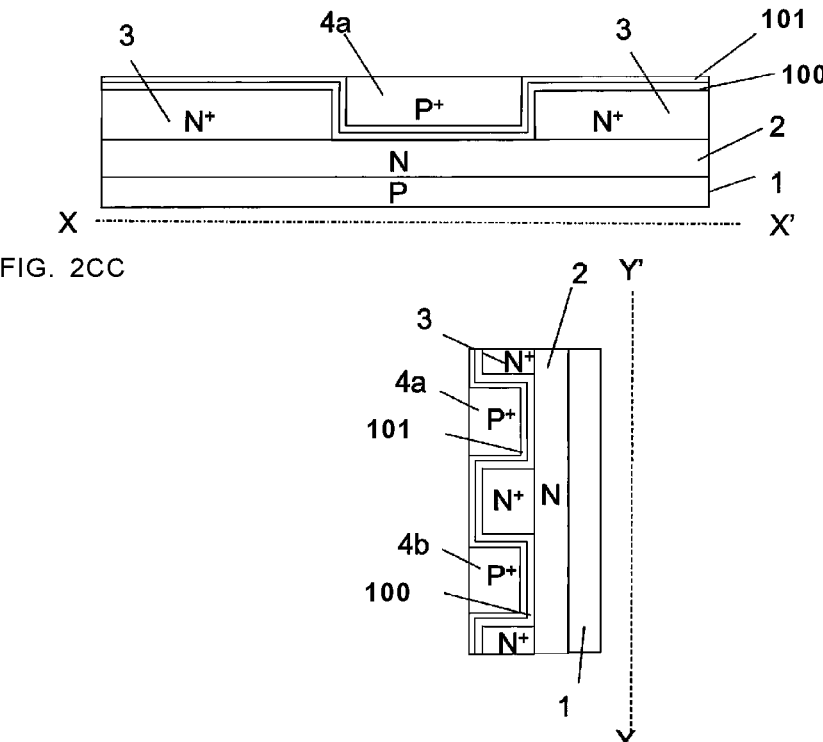
FIG. 2CC

FIG. 3AA
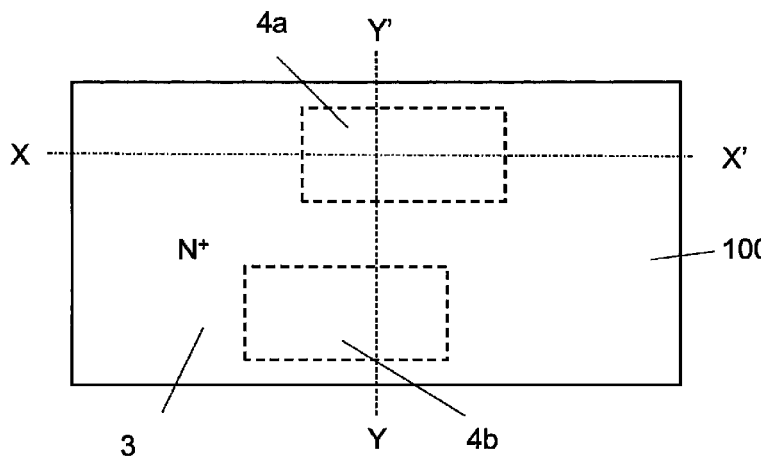
FIG. 3AB
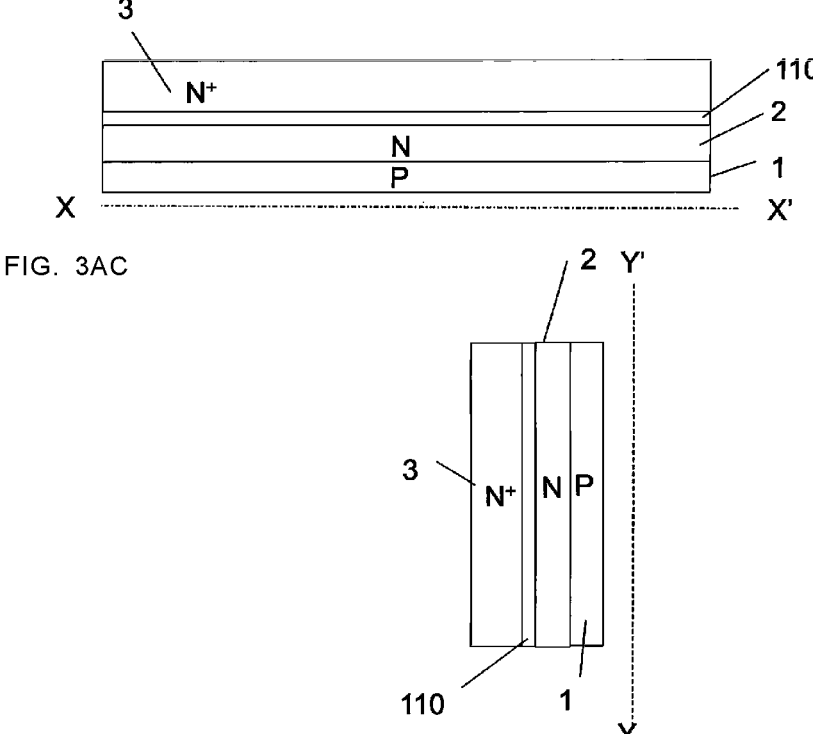
FIG. 3AC

FIG. 3BA
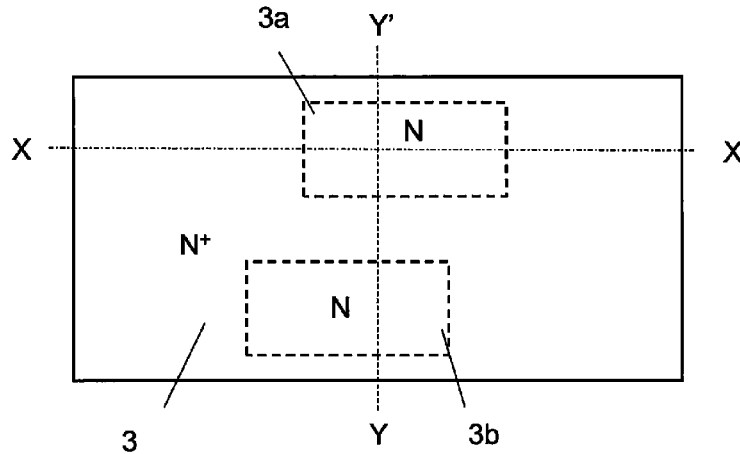
FIG. 3BB
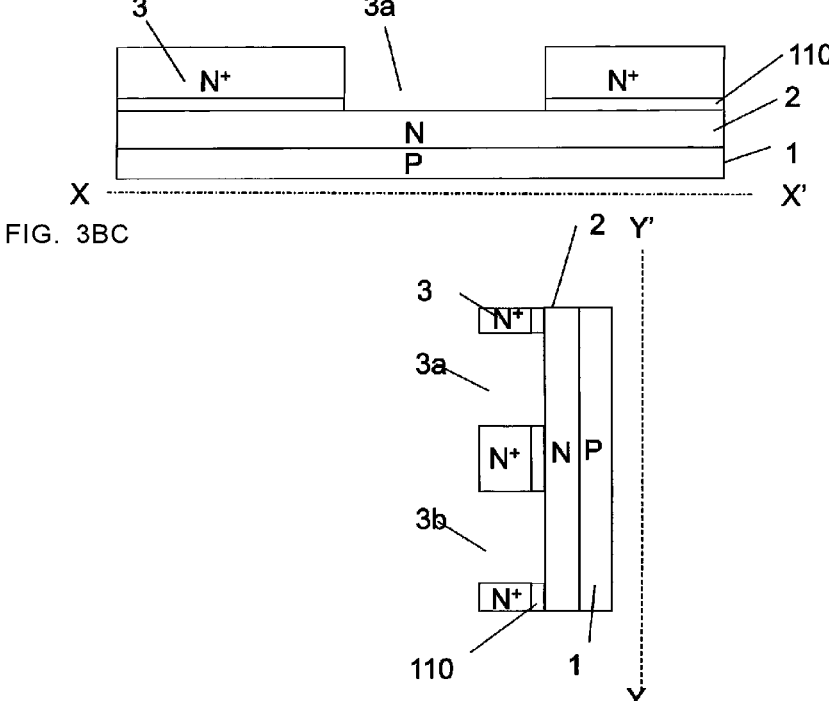
FIG. 3BC

FIG. 4AA
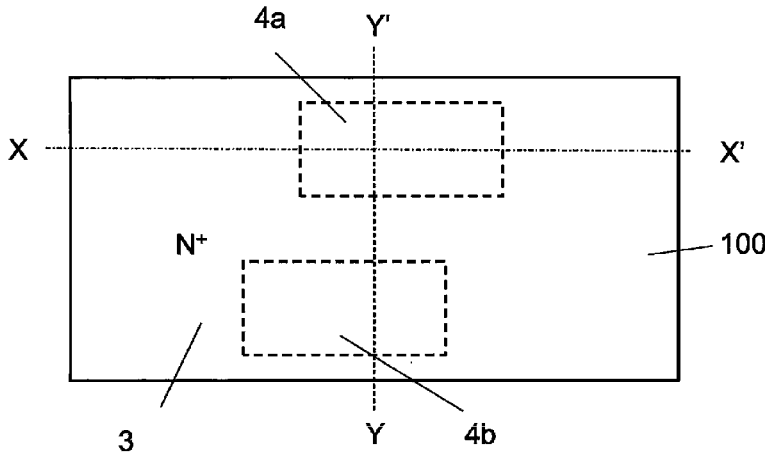
FIG. 4AB
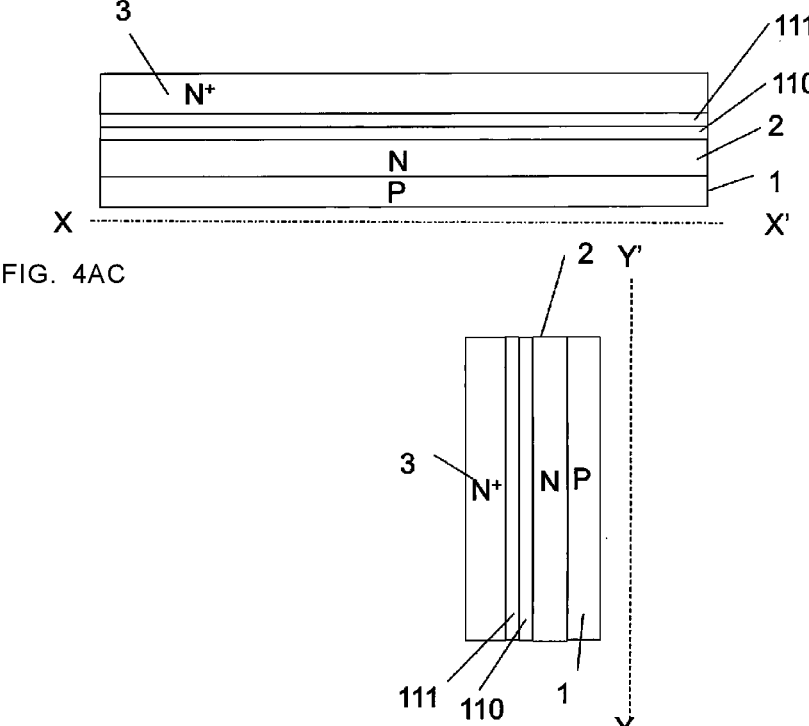
FIG. 4AC

FIG. 4BA
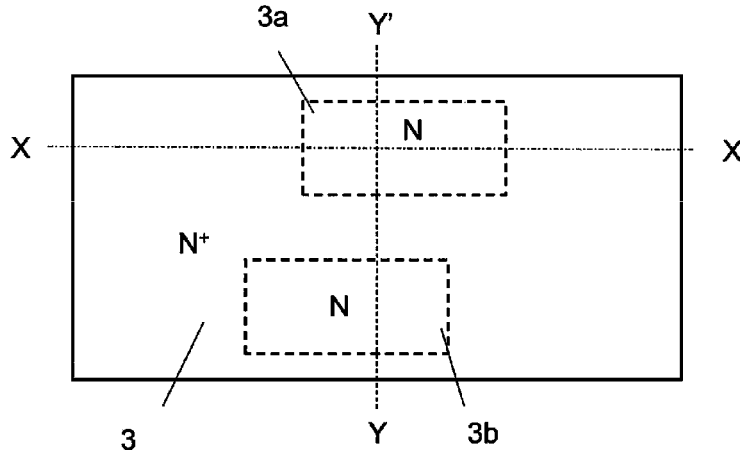
FIG. 4BB
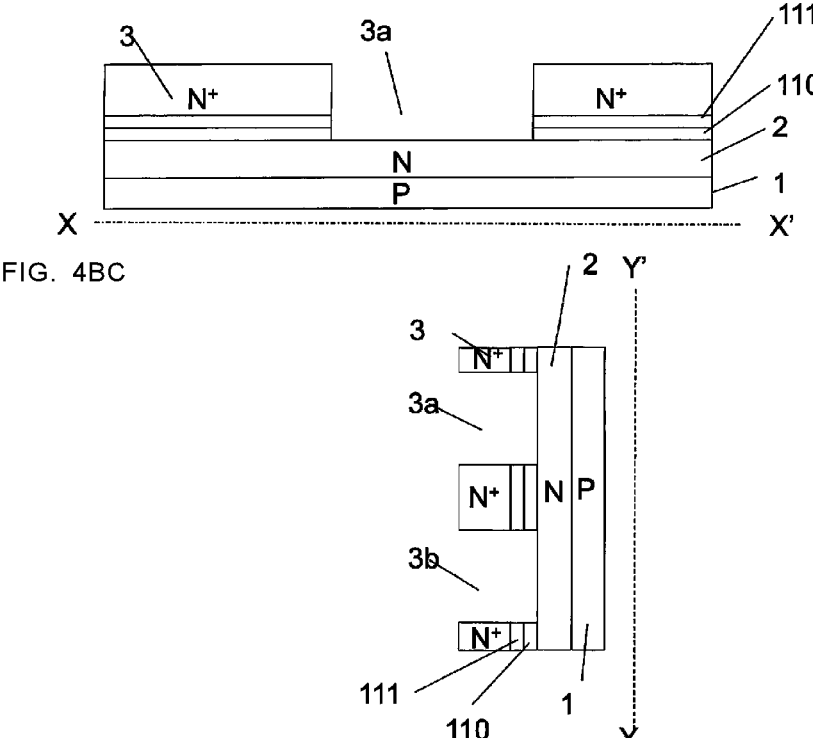
FIG. 4BC

FIG. 5AA
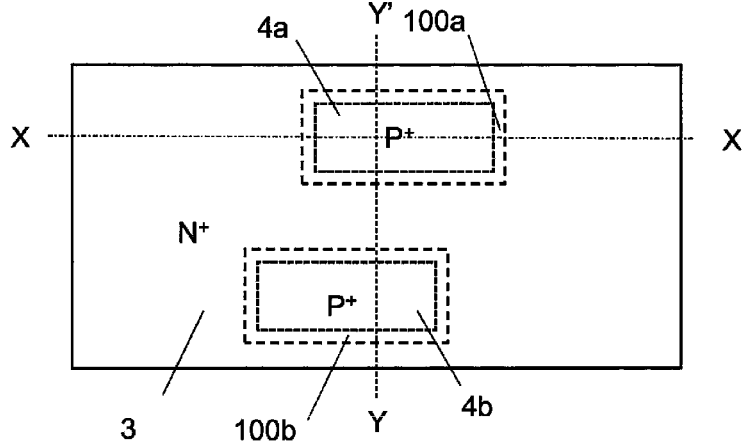
FIG. 5AB
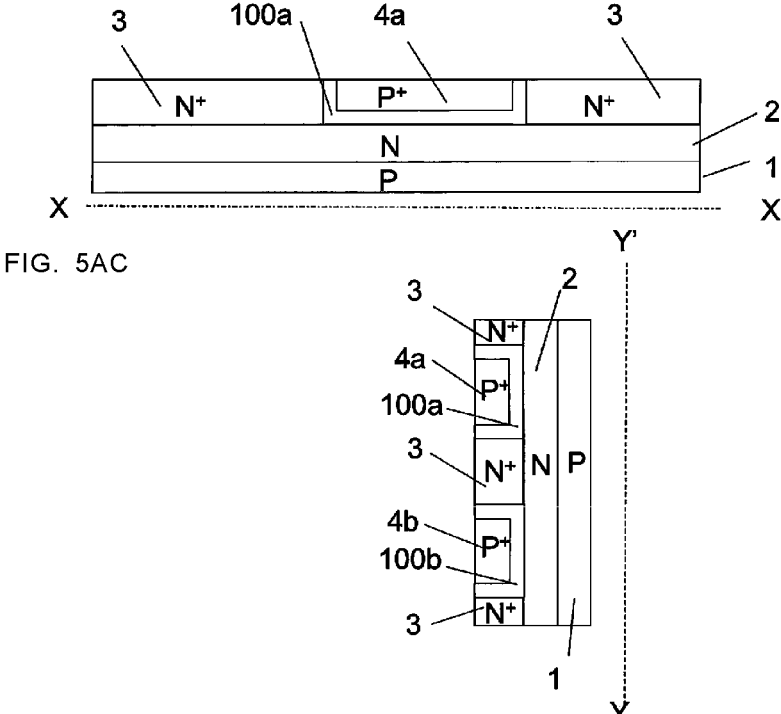
FIG. 5AC

FIG. 5BA
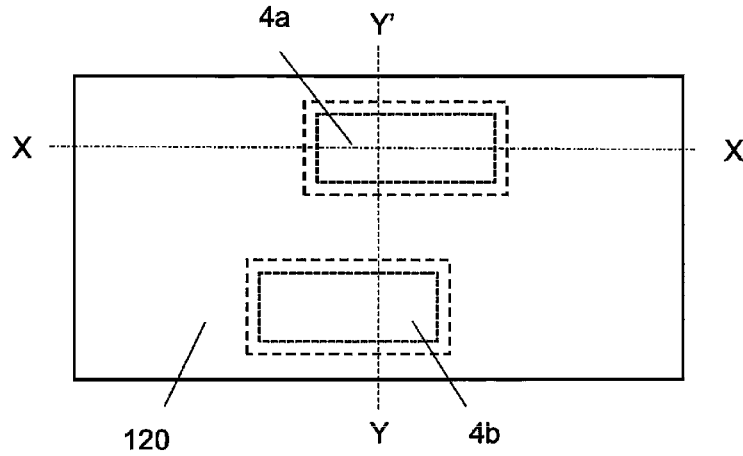
FIG. 5BB
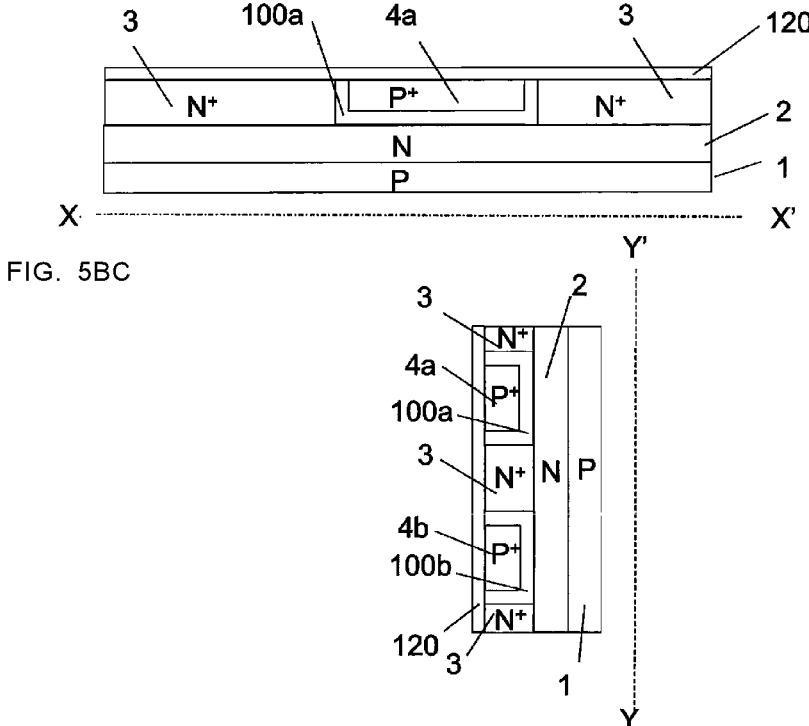
FIG. 5BC

FIG. 6AA
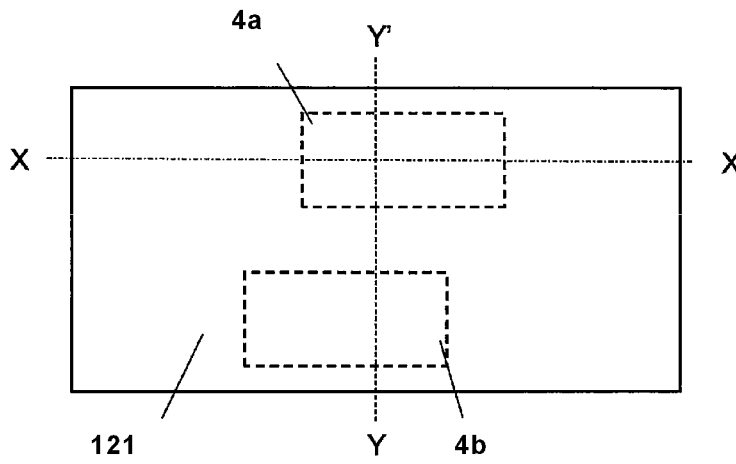
FIG. 6AB
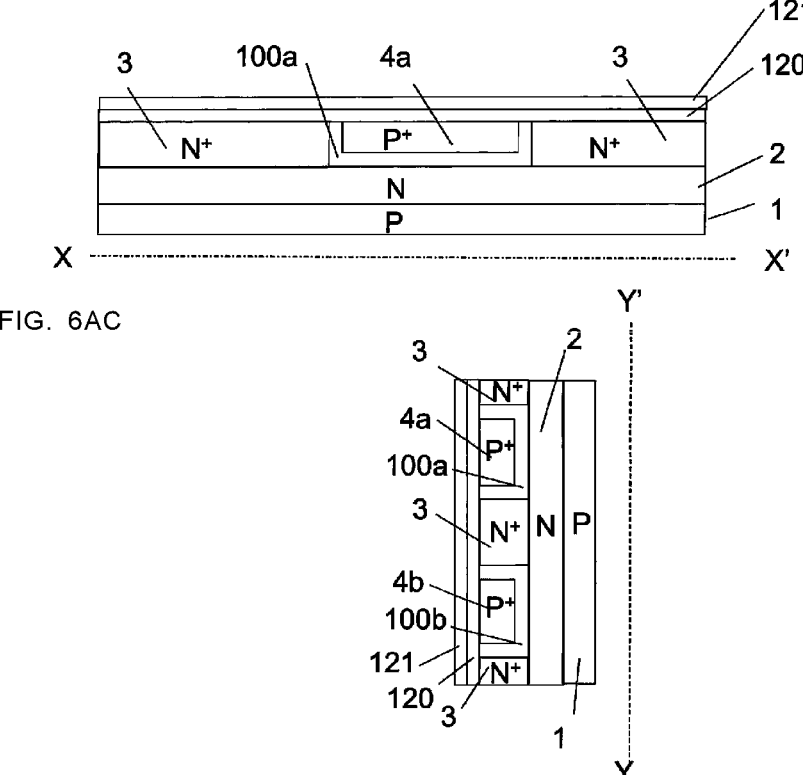
FIG. 6AC

FIG. 6DA
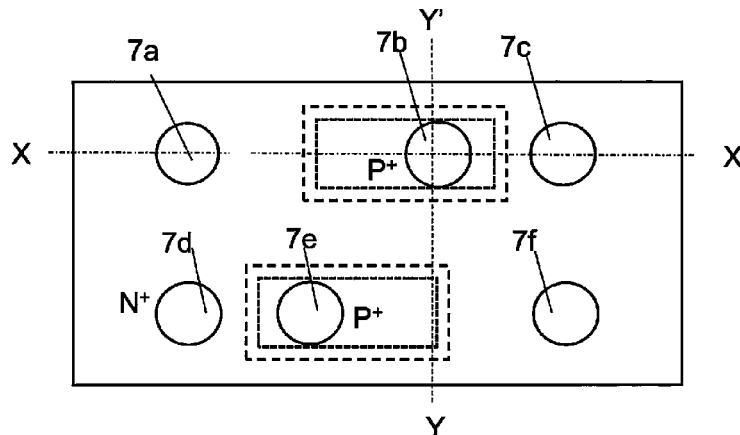
FIG. 6DB
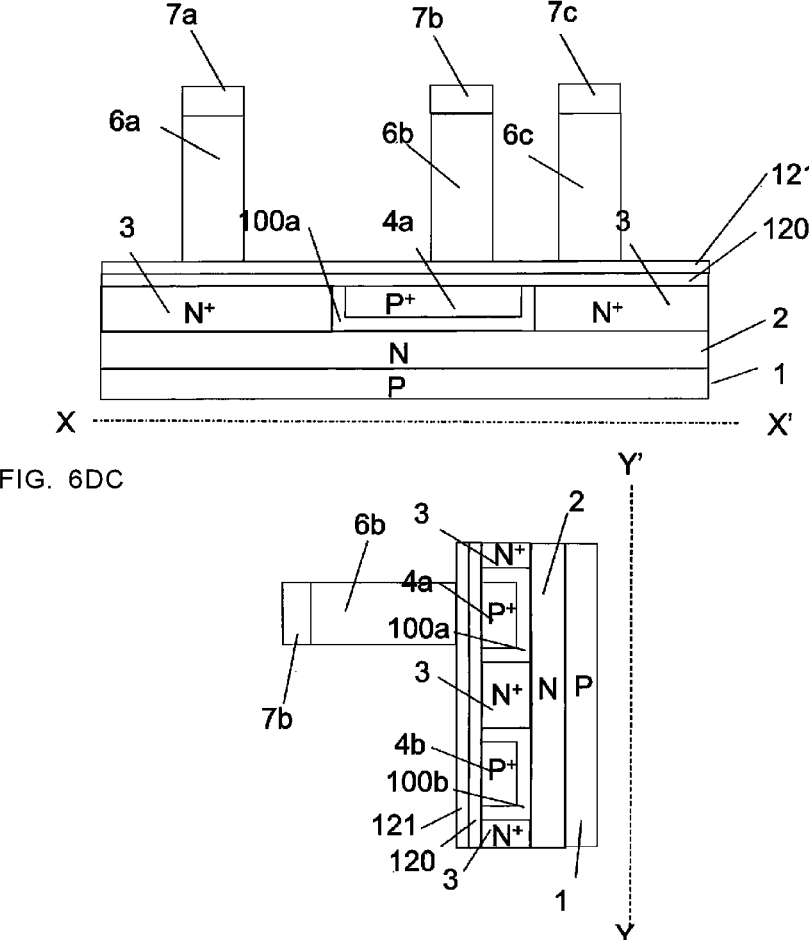
FIG. 6DC

FIG. 6EA
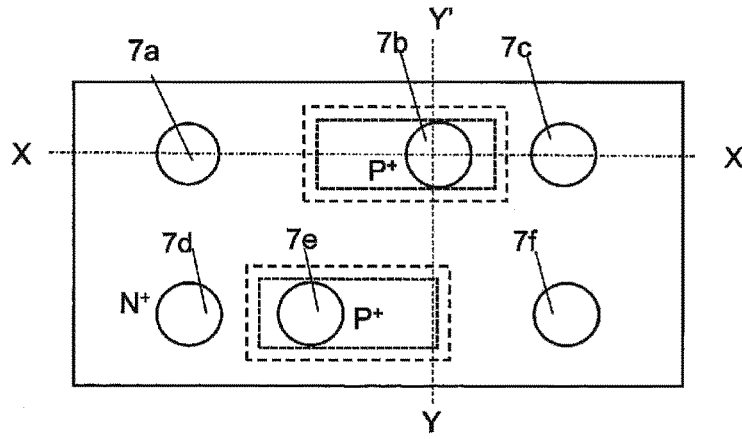
FIG. 6EB
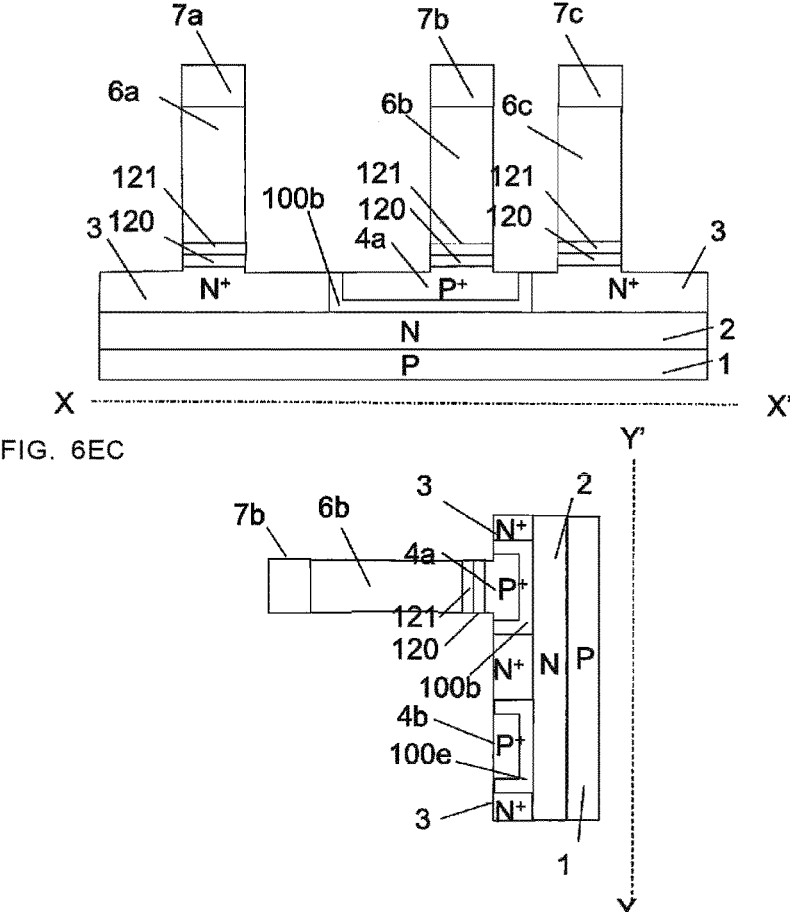
FIG. 6EC

FIG. 8A
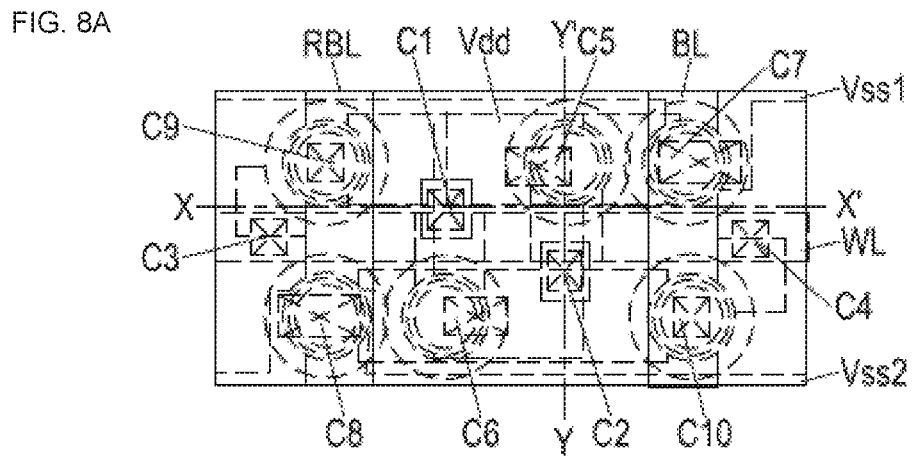
FIG. 8B
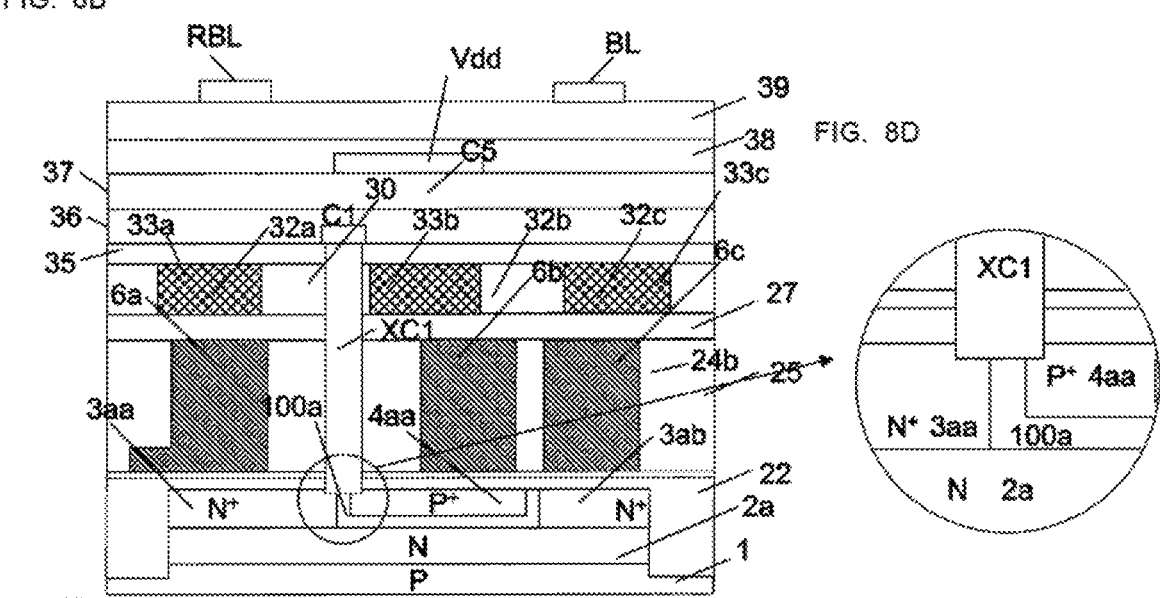
FIG. 8D
FIG. 8C
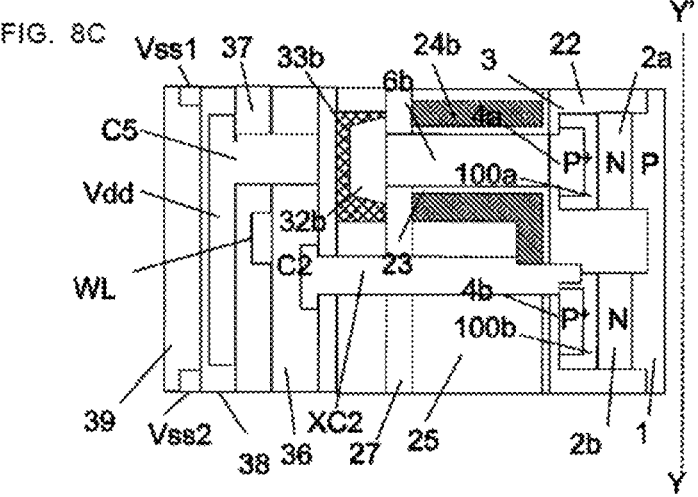

FIG. 9A
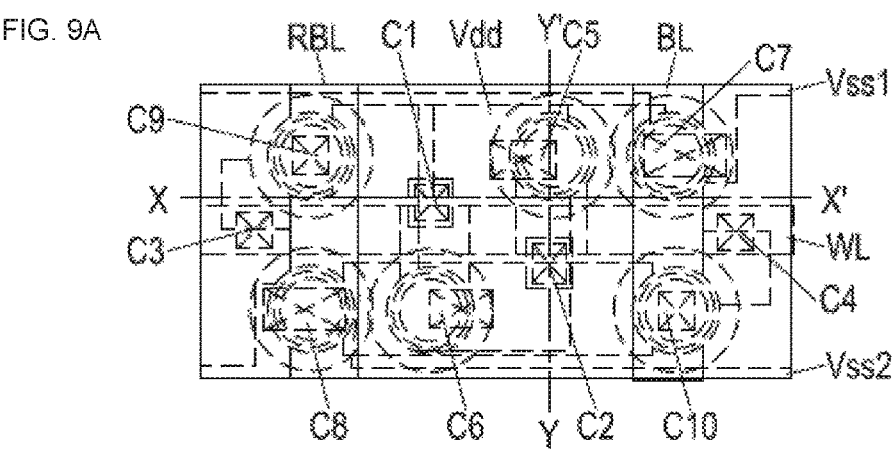
FIG. 9B
FIG. 9D
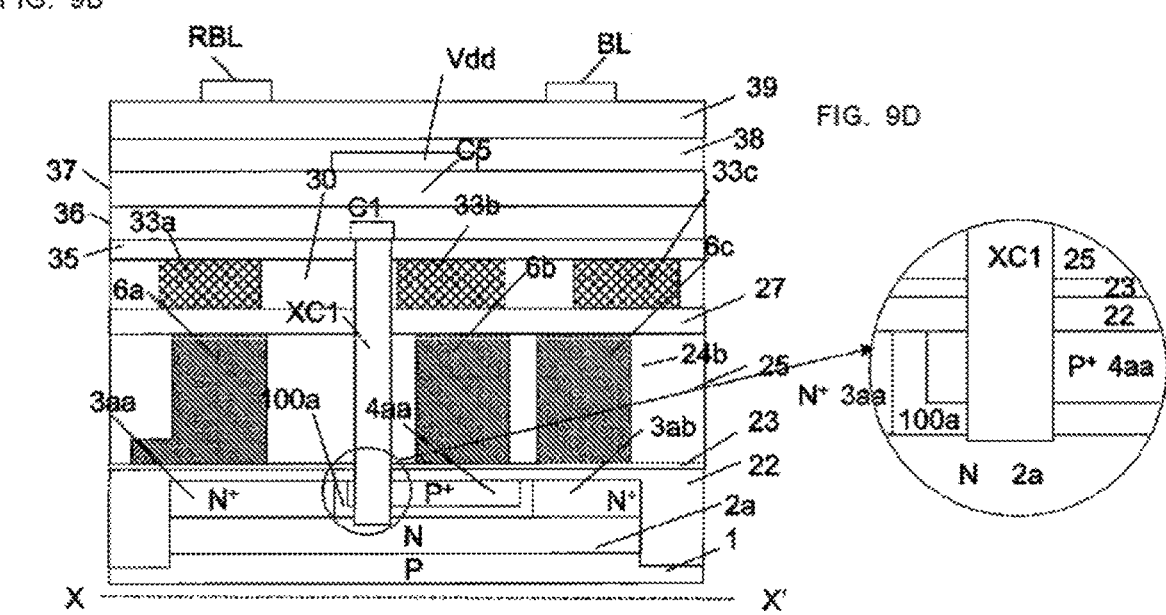
FIG. 9C
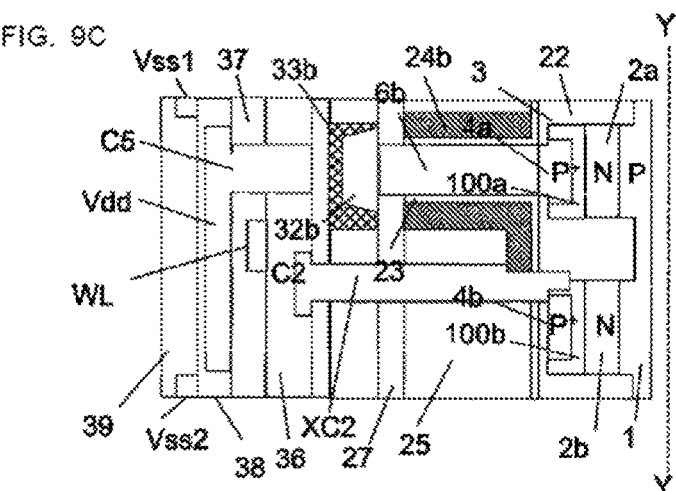

PILLAR-SHAPED SEMICONDUCTOR DEVICE AND METHOD FOR PRODUCING THE SAME

CROSS REFERENCES TO RELATED APPLICATIONS

The present application is a continuation application of PCT/JP2020/009721, filed Mar. 6, 2020, the entire contents of which are incorporated herein by reference.

BACKGROUND OF THE INVENTION

1. Field of the Invention

The present invention relates to a pillar-shaped semiconductor device and a method for producing the pillar-shaped semiconductor device.

2. Description of the Related Art

In recent years, three-dimensional transistors have been used in large scale integration (LSI). Among such transistors, surrounding gate transistors (SGTs), which are pillar-shaped semiconductor devices, have been attracting attention as semiconductor elements that provide highly integrated semiconductor devices. In addition, there has been a demand for a further increase in the degree of integration and a higher performance of SGT-including semiconductor devices.

Typical planar MOS transistors have a channel that extends in a horizontal direction along an upper surface of a semiconductor substrate. In contrast, SGTs have a channel that extends in a direction perpendicular to an upper surface of a semiconductor substrate (refer to, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, SGTs enable an increase in the density of semiconductor devices compared with planar MOS transistors.

FIG. 10 is a schematic structural view of an N-channel SGT. A Si pillar 220 of a P or i (intrinsic) conductivity type (hereinafter, a silicon semiconductor pillar is referred to as a "Si pillar") includes, in upper and lower portions thereof, N$^+$ layers 221a and 221b one of which functions as a source and the other one of which functions as a drain (hereinafter, a semiconductor region containing a donor impurity at a high concentration is referred to as an "N$^+$ layer"). A portion of the Si pillar 220 between the N$^+$ layers 221a and 221b, which function as a source and a drain, functions as a channel region 222. A gate insulating layer 223 is formed so as to surround the channel region 222. A gate conductor layer 224 is formed so as to surround the gate insulating layer 223. In the SGT, the N$^+$ layers 221a and 221b functioning as the source and the drain, the channel region 222, the gate insulating layer 223, and the gate conductor layer 224 are formed so as to have a pillar shape as a whole. Thus, in plan view, the area occupied by the SGT corresponds to the area occupied by a single source or drain N$^+$ layer of a planar MOS transistor. Therefore, a circuit chip including SGTs enables a further reduction in the chip size compared with a circuit chip including planar MOS transistors. In addition, if the driving capability of SGTs can be improved, the number of SGTs used in one chip can be reduced, which also contributes to a reduction in the chip size.

However, in achieving a further reduction in the chip size, there is a problem that has to be overcome. Since, as a matter of course, gaps between adjacent Si pillars become narrow, for example, an upper inverter of an SRAM cell illustrated in FIGS. 1UA to 1UC and constituted by six transistors is formed so that the gaps between Si pillars 6a and 6b and between Si pillars 6b and 6c are narrow. This reduces the areas where impurity layers 3aa, 4aa, and 3ab functioning as a source or a drain and connected to lower portions of the corresponding Si pillars are formed and makes each of the Si pillars physically close to a boundary with an adjacent impurity layer of the opposite conductivity type. Consequently, an impurity layer region having an effectively very low concentration or, in the worst case, an impurity layer of a conductivity type opposite to the desired conductivity type is formed in a lower portion of a Si pillar, resulting in problems such as a decrease in the driving capability due to formation of high-resistance source and drain and a malfunction due to formation of source and drain of the opposite conductivity type. Accordingly, to avoid these problems, it is necessary to form each impurity layer functioning as a source or a drain while suppressing an extension of the impurity layer as much as possible and maintaining a high-concentration state.

FIG. 11 shows a circuit diagram of a static random access memory (SRAM) cell. The SRAM cell circuit includes two inverter circuits. One inverter circuit is constituted by a P-channel SGT_Pc1 serving as a load transistor and an N-channel SGT_Nc1 serving as a drive transistor. Another inverter circuit is constituted by a P-channel SGT_Pc2 serving as a load transistor and an N-channel SGT_Nc2 serving as a drive transistor. The gate of the P-channel SGT_Pc1 and the gate of the N-channel SGT_Nc1 are connected together. The drain of the P-channel SGT_Pc2 and the drain of the N-channel SGT_Nc2 are connected together. The gate of the P-channel SGT_Pc2 and the gate of the N-channel SGT_Nc2 are connected together. The drain of the P-channel SGT_Pc1 and the drain of the N-channel SGT_Nc1 are connected together.

As illustrated in FIG. 11, the sources of the P-channel SGTs_Pc1 and Pc2 are connected to a power supply terminal Vdd. The sources of the N-channel SGTs_Nc1 and Nc2 are connected to a ground terminal Vss. Selection N-channel SGTs_SN1 and SN2 are disposed on both sides of the two inverter circuits. The gates of the selection N-channel SGTs_SN1 and SN2 are connected to a word line terminal WLt. The source and the drain of the selection N-channel SGT SN1 are connected to the drains of the N-channel SGT_Nc1 and the P-channel SGT_Pc1 and a bit line terminal BLt. The source and the drain of the selection N-channel SGT SN2 are connected to the drains of the N-channel SGT_Nc2 and the P-channel SGT_Pc2 an inverted bit line terminal BLRt. Thus, the circuit including an SRAM cell is constituted by a total of six SGTs, namely, two P-channel SGTs_Pc1 and Pc2 and four N-channel SGTs_Nc1, Nc2, SN1, and SN2 (refer to, for example, U.S. Patent Application Publication No. 2010/0219483). In addition, a plurality of drive transistors can be connected in parallel to increase the speed of the SRAM circuit. In general, SGTs that constitute memory cells of an SRAM are respectively formed in different semiconductor pillars. An increase in the degree of integration of an SRAM cell circuit depends on how a plurality of SGTs can be formed in one cell region at a high density. The same applies to an increase in the degree of integration in formation of other circuits using SGTs. (For other examples of the related art, refer to U.S. Pat. No. 8,530,960; C. Y. Ting, V. J. Vivalda, and H. G. Schaefer: "Study of planarized sputter-deposited $SiO_2$", J. Vac. Sci. Technol. 15(3), pp. 1105-1112, May/June (1978); and A. Raley, S. Thibaut, N. Mohanty, K. Subhadeep, S. Nakamura, et al.: "Self-aligned quadruple patterning integration using spacer on spacer pitch splitting at the resist level for sub-32 nm pitch applications" Proc. Of SPIE Vol. 9782, 2016)

SUMMARY OF THE INVENTION

In an increase in the degree of integration of a circuit using SGTs, a decrease in the driving capability and a malfunction are caused due to interdiffusion of donor and acceptor impurities caused when the separation distance between SGTs is decreased.

A method for producing a pillar-shaped semiconductor device according to an aspect of the present invention is a method for producing a pillar-shaped semiconductor device including, on a substrate, a first semiconductor pillar, a second semiconductor pillar adjacent to the first semiconductor pillar, a first gate insulating layer surrounding the first semiconductor pillar, a second gate insulating layer surrounding the second semiconductor pillar, a first gate conductor layer surrounding the first gate insulating layer, a second gate conductor layer surrounding the second gate insulating layer, a first impurity region connected to a lower portion of the first semiconductor pillar, a second impurity region connected to a lower portion of the second semiconductor pillar and having a polarity different from a polarity of the first impurity region, a third impurity region connected to a top portion of the first semiconductor pillar, a fourth impurity region connected to a top portion of the second semiconductor pillar and having a polarity different from a polarity of the third impurity region, a first SGT including, as a channel, a region between the first impurity region and the third impurity region in the first semiconductor pillar, and a second SGT including, as a channel, a region between the second impurity region and the fourth impurity region in the second semiconductor pillar, the method including:

a step of forming, on a surface of the substrate, a first impurity layer containing a donor or acceptor impurity;

a step of removing a partial region in the first impurity layer where the second impurity region is to be formed in plan view to form the first impurity region formed of the first impurity layer that remains as a result of the removal;

a step of, after the formation of the first impurity region, forming a first semiconductor layer having a smaller thickness than the first impurity layer so as to cover an entire surface;

a step of, after the formation of the first semiconductor layer, forming a second impurity layer containing a donor or acceptor impurity and having a larger thickness than the first impurity layer so as to cover an entire surface, so that the first impurity region and the second impurity region are not in contact with each other;

a step of polishing the second impurity layer to a level of an upper surface of the first impurity layer or a level of a surface on the first semiconductor layer on the first impurity layer to form the second impurity region formed of the second impurity layer that remains as a result of the polishing;

a step of forming the first semiconductor pillar on the first impurity region and forming the second semiconductor pillar on the second impurity region;

a step of forming the third impurity region on the first semiconductor pillar and forming the fourth impurity region on the second semiconductor pillar;

a step of forming the first gate insulating layer surrounding the first semiconductor pillar and forming the second gate insulating layer surrounding the second semiconductor pillar; and a step of forming the first gate conductor layer surrounding the first gate insulating layer and forming the second gate conductor layer surrounding the second gate insulating layer, in which the first semiconductor layer has an impurity concentration lower than an impurity concentration of each of the first impurity region and the second impurity region.

In the production method, the first semiconductor layer preferably has a donor or acceptor impurity diffusion coefficient smaller than an impurity diffusion coefficient of each of the first impurity layer and the second impurity layer.

In the production method, the first semiconductor layer is preferably constituted by a stack including two or more semiconductor layers that differ from each other in an etching selectivity ratio to the second impurity layer, an impurity diffusion coefficient, or a lattice constant.

The production method preferably includes forming, on the surface of the substrate, a second semiconductor layer having an impurity concentration lower than an impurity concentration of each of the first impurity layer and the second impurity layer.

In the production method, the second semiconductor layer preferably has a donor or acceptor impurity diffusion coefficient smaller than an impurity diffusion coefficient of each of the first impurity layer and the second impurity layer.

In the production method, the second semiconductor layer is preferably constituted by a stack including two or more semiconductor layers that differ from each other in an etching selectivity ratio to the first impurity layer, an impurity diffusion coefficient, or a lattice constant.

The production method preferably includes forming, on the first impurity layer and the second impurity layer, a third semiconductor layer having an impurity concentration lower than an impurity concentration of each of the first impurity layer and the second impurity layer.

In the production method, the third semiconductor layer preferably has a donor or acceptor impurity diffusion coefficient smaller than an impurity diffusion coefficient of each of the first impurity layer and the second impurity layer.

In the production method, the third semiconductor layer is preferably constituted by a stack including two or more semiconductor layers that differ from each other in an etching selectivity ratio to the second impurity layer and the second semiconductor layer, an impurity diffusion coefficient, or a lattice constant.

The production method preferably include, on the substrate, after the formation of the first semiconductor pillar and the second semiconductor pillar, sequentially forming the first gate insulating layer, the second gate insulating layer, the first gate conductor layer, and the second gate conductor layer; and subsequently forming a first contact hole so as to be in electrical contact with, in plan view, three layers of the first impurity region, the second impurity region, and the first semiconductor layer located at a boundary between the first impurity region and the second impurity region.

The production method preferably includes, on the substrate, after the formation of the first semiconductor pillar and the second semiconductor pillar, sequentially forming the first gate insulating layer, the second gate insulating layer, the first gate conductor layer, and the second gate conductor layer; and subsequently forming a first contact hole disposed so as to include at least the second impurity region in plan view, such that a side wall surface of the first contact hole is in electrical contact with the second impurity region and the first semiconductor layer and that a bottom surface of the first contact hole is in electrical contact with the substrate.

A pillar-shaped semiconductor device according to another aspect of the present invention includes, on a substrate, a first semiconductor pillar; a second semiconductor pillar adjacent to the first semiconductor pillar; a first gate insulating layer surrounding the first semiconductor pillar; a second gate insulating layer surrounding the second semiconductor pillar; a first gate conductor layer surrounding the first gate insulating layer; a second gate conductor layer surrounding the second gate insulating layer; a first impurity region connected to a lower portion of the first semiconductor pillar; a second impurity region connected to a lower portion of the second semiconductor pillar and having a polarity different from a polarity of the first impurity region; a third impurity region connected to a top portion of the first semiconductor pillar; a fourth impurity region connected to a top portion of the second semiconductor pillar and having a polarity different from a polarity of the third impurity region; a first SGT including, as a channel, a region between the first impurity region and the third impurity region in the first semiconductor pillar; a second SGT including, as a channel, a region between the second impurity region and the fourth impurity region in the second semiconductor pillar; and a first semiconductor layer having a small thickness and disposed in a boundary region between the first impurity region and the second impurity region such that the first impurity region and the second impurity region are not in contact with each other. The first semiconductor layer has an impurity concentration lower than an impurity concentration of each of the first impurity region and the second impurity region.

The pillar-shaped semiconductor device preferably includes a second semiconductor layer having a small thickness and covering a boundary region between the substrate and each of the first impurity region and the second impurity region, in which the second semiconductor layer has an impurity concentration lower than the impurity concentration of each of the first impurity region and the second impurity region.

The pillar-shaped semiconductor device preferably includes a third semiconductor layer having a small thickness and covering a boundary region between the first impurity region and the first semiconductor pillar and a boundary region between the second impurity region and the second semiconductor pillar, in which the third semiconductor layer has an impurity concentration lower than the impurity concentration of each of the first impurity region and the second impurity region.

In the production method, a thickness of the first semiconductor layer is preferably set such that an impurity boundary between a donor and an acceptor determined by an impurity diffusion length of the donor or the acceptor in the first semiconductor layer at a time of completion of a production process is formed within a film of the first semiconductor layer.

In the production method, the first semiconductor layer is preferably a compound semiconductor layer formed of two or more types of elements, and a compound ratio of the compound semiconductor layer is preferably set such that an impurity diffusion length of a donor or an acceptor determined by the compound ratio and an impurity boundary of the donor and the acceptor are formed within a film of the first semiconductor layer.

In the production method, a thickness of the second semiconductor layer is preferably set such that an impurity diffusion region of a donor or an acceptor in the second semiconductor layer at a time of completion of a production process is located at a boundary between the second semiconductor layer and the substrate.

In the production method, the second semiconductor layer is preferably a compound semiconductor layer formed of two or more types of elements, and a compound ratio of the compound semiconductor layer is preferably set such that an impurity diffusion region of a donor or an acceptor determined by the compound ratio is located at a boundary between the second semiconductor layer and the substrate.

In the production method, a thickness of the third semiconductor layer is preferably set such that an impurity diffusion region of a donor or an acceptor in the third semiconductor layer at a time of completion of a production process is located at a boundary between the third semiconductor layer and each of the first semiconductor pillar and the second semiconductor pillar.

In the production method, the third semiconductor layer is preferably a compound semiconductor layer formed of two or more types of elements, and a compound ratio of the compound semiconductor layer is preferably set such that an impurity diffusion region of a donor or an acceptor determined by the compound ratio is located at a boundary between the third semiconductor layer and each of the first semiconductor pillar and the second semiconductor pillar.

BRIEF DESCRIPTION OF THE DRAWINGS

FIG. 1AA and FIGS. 1AB and 1AC are respectively a plan view and sectional structural views that illustrate a method for producing an SGT-including pillar-shaped semiconductor device according to a first embodiment of the present invention.

FIG. 1BA and FIGS. 1BB and 1BC are respectively a plan view and sectional structural views that illustrate a method for producing an SGT-including pillar-shaped semiconductor device according to a first embodiment of the present invention.

FIG. 1CA and FIGS. 1CB and 1CC are respectively a plan view and sectional structural views that illustrate a method for producing an SGT-including pillar-shaped semiconductor device according to a first embodiment and a second embodiment of the present invention.

FIG. 1DA and FIGS. 1DB and 1DC are respectively a plan view and sectional structural views that illustrate a method for producing an SGT-including pillar-shaped semiconductor device according to a first embodiment of the present invention.

FIG. 1EA and FIGS. 1EB and 1EC are respectively a plan view and sectional structural views that illustrate a method for producing an SGT-including pillar-shaped semiconductor device according to a first embodiment of the present invention.

FIG. 1NA and FIGS. 1NB and 1NC are respectively a plan view and sectional structural views that illustrate a method for producing an SGT-including pillar-shaped semiconductor device according to a first embodiment of the present invention.

FIG. 10A and FIGS. 10B and 10C are respectively a plan view and sectional structural views that illustrate a method for producing an SGT-including pillar-shaped semiconductor device according to a first embodiment of the present invention.

FIG. 1PA and FIGS. 1PB and 1PC are respectively a plan view and sectional structural views that illustrate a method for producing an SGT-including pillar-shaped semiconductor device according to a first embodiment of the present invention.

FIG. 1QA and FIGS. 1QB and 1QC are respectively a plan view and sectional structural views that illustrate a method for producing an SGT-including pillar-shaped semiconductor device according to a first embodiment of the present invention.

FIG. 1SA and FIGS. 1SB and 1SC are respectively a plan view and sectional structural views that illustrate a method for producing an SGT-including pillar-shaped semiconductor device according to a first embodiment of the present invention.

FIG. 2AA and FIGS. 2AB and 2AC are respectively a plan view and sectional structural views that illustrate a method for producing an SGT-including pillar-shaped semiconductor device according to a second embodiment of the present invention.

FIG. 2BA and FIGS. 2BB and 2BC are respectively a plan view and sectional structural views that illustrate a method for producing an SGT-including pillar-shaped semiconductor device according to a second embodiment of the present invention.

FIG. 2CA and FIGS. 2CB and 2CC are respectively a plan view and sectional structural views that illustrate a method for producing an SGT-including pillar-shaped semiconductor device according to a second embodiment of the present invention.

FIG. 3AA and FIGS. 3AB and 3AC are respectively a plan view and sectional structural views that illustrate a method for producing an SGT-including pillar-shaped semiconductor device according to a third embodiment of the present invention.

FIG. 3BA and FIGS. 3BB and 3BC are respectively a plan view and sectional structural views that illustrate a method for producing an SGT-including pillar-shaped semiconductor device according to a third embodiment of the present invention.

FIG. 4AA and FIGS. 4AB and 4AC are respectively a plan view and sectional structural views that illustrate a method for producing an SGT-including pillar-shaped semiconductor device according to a fourth embodiment of the present invention.

FIG. 4BA and FIGS. 4BB and 4BC are respectively a plan view and sectional structural views that illustrate a method for producing an SGT-including pillar-shaped semiconductor device according to a fourth embodiment of the present invention.

FIG. 5AA and FIGS. 5AB and 5AC are respectively a plan view and sectional structural views that illustrate a method for producing an SGT-including pillar-shaped semiconductor device according to a fifth embodiment of the present invention.

FIG. 5BA and FIGS. 5BB and 5BC are respectively a plan view and sectional structural views that illustrate a method for producing an SGT-including pillar-shaped semiconductor device according to a fifth embodiment of the present invention.

FIG. 6AA and FIGS. 6AB and 6AC are respectively a plan view and sectional structural views that illustrate a method for producing an SGT-including pillar-shaped semiconductor device according to a sixth embodiment of the present invention.

FIG. 6DA and FIGS. 6DB and 6DC are respectively a plan view and sectional structural views that illustrate a method for producing an SGT-including pillar-shaped semiconductor device according to a sixth embodiment of the present invention.

FIG. 6EA and FIGS. 6EB and 6EC are respectively a plan view and sectional structural views that illustrate a method for producing an SGT-including pillar-shaped semiconductor device according to a sixth embodiment of the present invention.

FIG. 8A and FIGS. 8B to 8D are respectively a plan view and sectional structural views that illustrate a method for producing an SGT-including pillar-shaped semiconductor device according to a seventh embodiment of the present invention.

FIG. 9A and FIGS. 9B and 9D are respectively a plan view and sectional structural views that illustrate a method for producing an SGT-including pillar-shaped semiconductor device according to an eighth embodiment of the present invention.

DESCRIPTION OF THE PREFERRED EMBODIMENTS

Figure 1F:
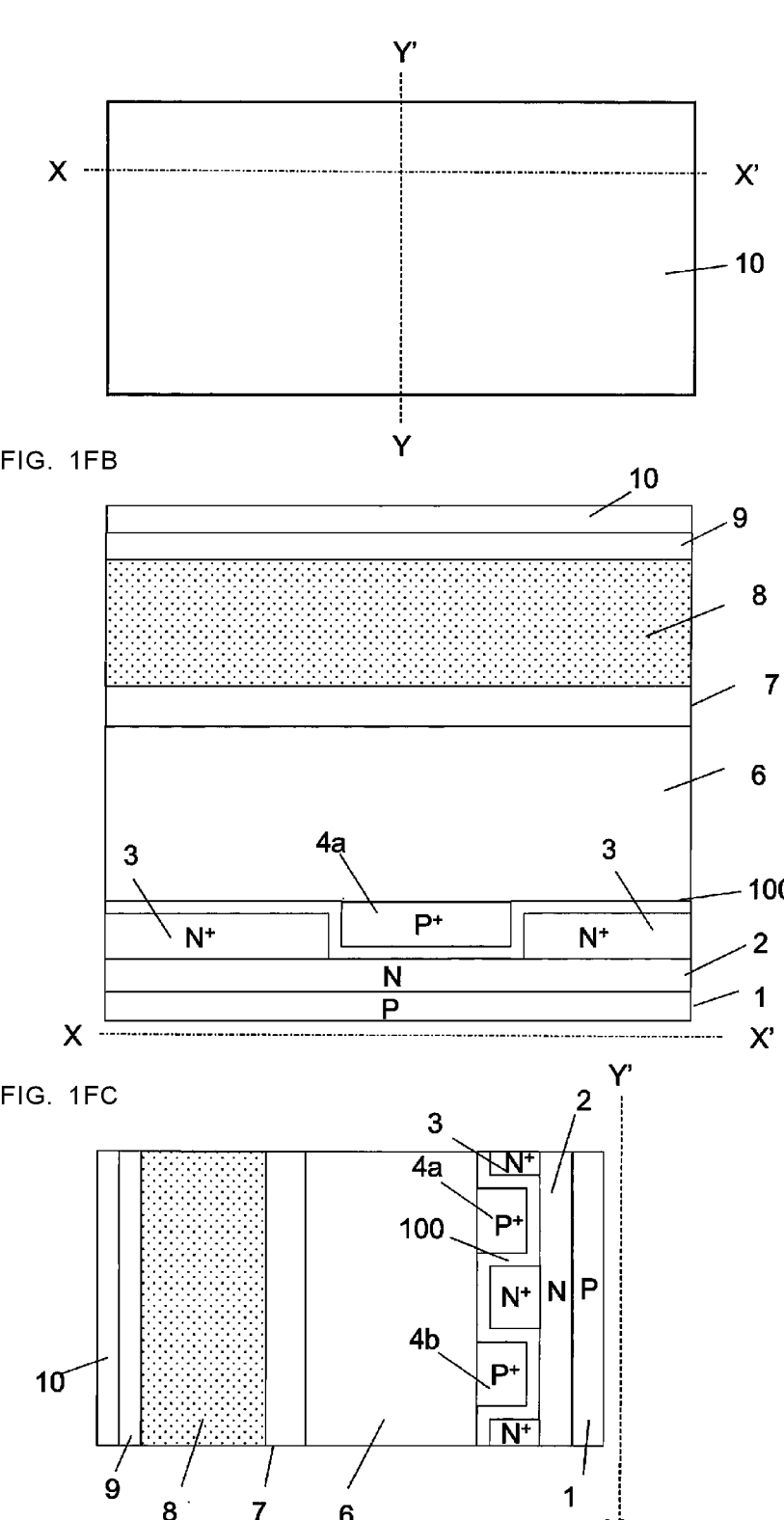
FIG. 1FA and FIGS. 1FB and 1FC are respectively a plan view and sectional structural views that illustrate a method for producing an SGT-including pillar-shaped semiconductor device according to a first embodiment of the present invention.

Hereafter, methods for producing a pillar-shaped semiconductor device according to embodiments of the present invention will be described with reference to the drawings.

First Embodiment

A method for producing an SRAM circuit according to a first embodiment of the present invention will now be described, as an example of an SGT-including pillar-shaped semiconductor device, with reference to FIGS. 1AA to 1UC. In the figures, figures suffixed with A are plan views, figures suffixed with B are sectional structural views taken along lines X-X' in the corresponding figures suffixed with A, and figures suffixed with C are sectional structural views taken along lines Y-Y' in the corresponding figures suffixed with A.

As illustrated in FIGS. 1AA to 1AC, an N layer 2 is formed on a P layer 1 by an epitaxial crystal growth method to form a substrate. Subsequently, for example, a silicon $N^+$ layer 3 doped with an $N^+$ impurity is formed on a surface layer of the N layer 2, that is, on a surface of the substrate by an epitaxial crystal growth method. The $N^+$ layer 3 may be formed by an ion implantation method. The $N^+$ layer 3 may be formed as a $P^+$ layer 3 of the opposite conductivity type. Hereinafter, in this and subsequent embodiments, a description will be made of a case where, in this step, the impurity layer formed on the surface of the substrate is a layer doped with an $N^+$ impurity.

Next, as illustrated in FIGS. 1BA to 1BC, for the purpose of forming a $P^+$ layer at desired positions, a resist mask is formed by photolithography (not illustrated), and the $N^+$ layer 3 in target regions is then etched using the resist mask as a mask. Instead of the resist mask, another mask material that can function as an etching mask may be used.

Next, as illustrated in FIGS. 1CA to 1CC, a semiconductor layer 100 is formed over the entire structure by an atomic layered deposition (ALD) method at an impurity concentration lower than an impurity concentration of the $N^+$ layer 3 and a $P^+$ layer 4 so as to have a smaller thickness than the $N^+$ layer 3. The semiconductor layer 100 is preferably formed of an intrinsic semiconductor containing no impurities. The semiconductor layer 100 preferably has a donor or acceptor impurity diffusion coefficient smaller than a donor or acceptor impurity diffusion coefficient of each of the $N^+$ layer 3 and the $P^+$ layer 4.

Furthermore, the thickness of the semiconductor layer 100 is preferably set such that an impurity boundary between a donor and an acceptor determined by an impurity diffusion length of the donor or the acceptor in the semiconductor layer 100 at the time of completion of the production process is formed within the film of the semiconductor layer 100.

The semiconductor layer 100 is preferably a compound semiconductor layer formed of two or more types of elements, for example, silicon germanium or silicon carbide. In addition, a compound ratio of the compound semiconductor layer is preferably set such that an impurity diffusion length of a donor or an acceptor determined by the compound ratio and an impurity boundary of the donor and the acceptor are formed within the film of the semiconductor layer 100.

Next, as illustrated in FIGS. 1DA to 1DC, a $P^+$ layer 4 of a conductivity type opposite to the $N^+$ layer 3 is formed over the entire structure by an epitaxial crystal growth method so as to have a thickness sufficient enough to fill step portions that have been formed.

Next, as illustrated in FIGS. 1EA to 1EC, the $P^+$ layer 4 is polished by a chemical mechanical polishing (CMP) method to a surface on the semiconductor layer 100 on the $N^+$ layer 3. Although not illustrated in the figure, the $P^+$ layer 4 may be polished to the upper surface of the $N^+$ layer 3.

Next, an i-layer 6 is formed, and a mask semiconductor layer 7 formed of, for example, a $SiO_2$ layer, an aluminum oxide ($Al_2O_3$, hereinafter referred to as AlO) layer, and a $SiO_2$ layer is formed. Subsequently, for example, a silicon germanium (SiGe) layer 8 is deposited. Subsequently, a mask semiconductor layer 9 formed of a $SiO_2$ layer is deposited. Subsequently, as illustrated in FIGS. 1FA to 1FC, a mask semiconductor layer 10 formed of a SiN layer is deposited. The i-layer 6 may be formed of N-type or P-type Si containing donor or acceptor impurity atoms in a small amount.

Figure 1G:
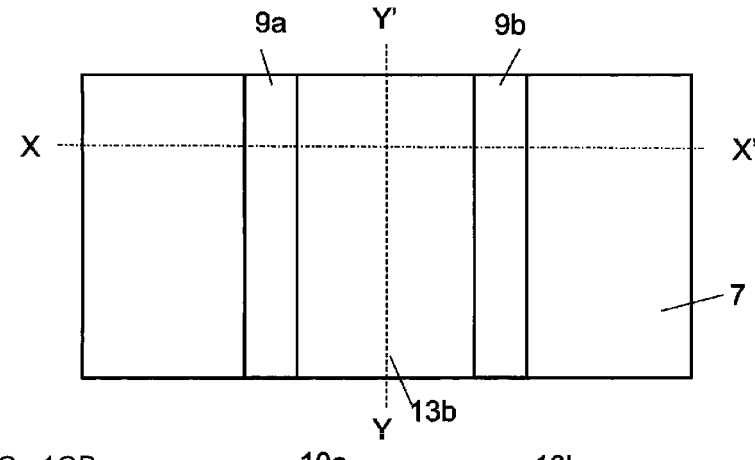
FIG. 1GA and FIGS. 1GB and 1GC are respectively a plan view and sectional structural views that illustrate a method for producing an SGT-including pillar-shaped semiconductor device according to a first embodiment of the present invention.
Figure 1G:
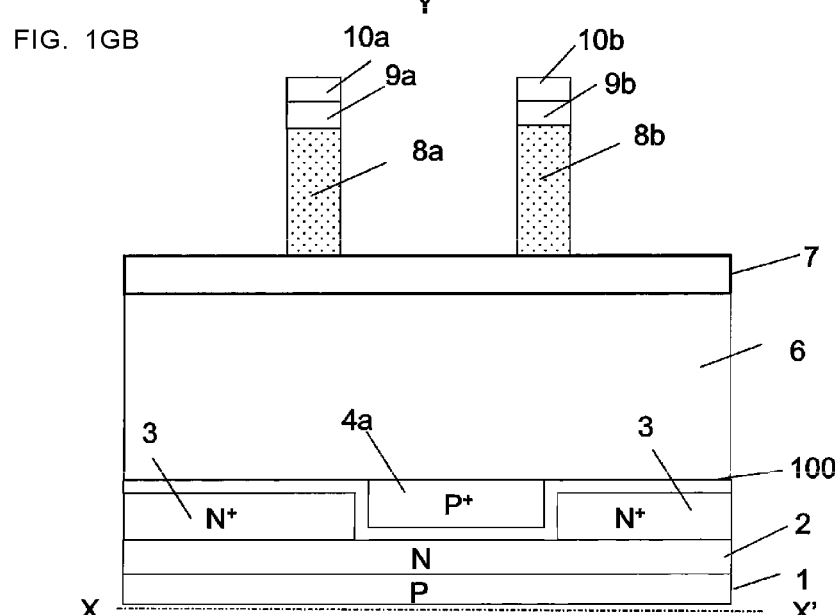
Figure 1G:
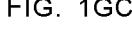
Figure 1G:
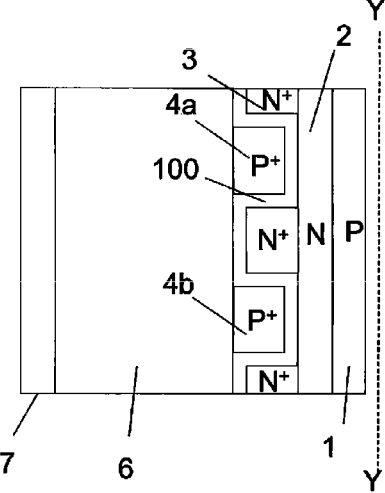

Next, the mask semiconductor layer 10 is etched using, as a mask, band-shaped resist layers (not illustrated) formed by a lithography method and extending in a Y direction in plan view. Thus, band-shaped mask semiconductor layers (not illustrated) extending in the Y direction in plan view are formed. The band-shaped mask semiconductor layers are isotropically etched using the resist layers as a mask such that the width of each of the band-shaped mask semiconductor layers is smaller than the width of the corresponding resist layer. Thus, band-shaped mask semiconductor layers 10a and 10b having a width smaller than a width of the smallest resist layer that can be formed by a lithography method are formed. Subsequently, the mask semiconductor layer 9 is etched by, for example, reactive ion etching (RIE) using the band-shaped mask semiconductor layers 10a and 10b as a mask to form band-shaped mask semiconductor layers 9a and 9b. Next, the SiGe layer 8 is etched by, for example, an RIE method using the band-shaped mask semiconductor layers 9a and 9b as a mask to form band-shaped SiGe layers 8a and 8b, as illustrated in FIGS. 1GA to 1GC. The band-shaped mask semiconductor layers 10a and 10b on the band-shaped mask semiconductor layers 9a and 9b may be removed before etching of the SiGe layer 8 or may be left.

Figure 1H:
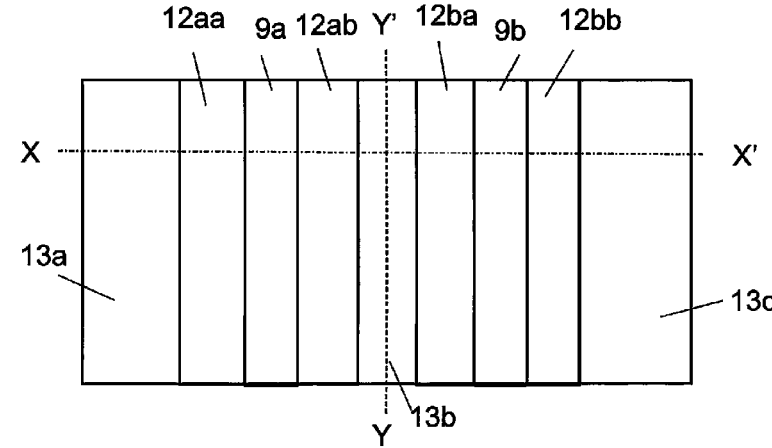
FIG. 1HA and FIGS. 1HB and 1HC are respectively a plan view and sectional structural views that illustrate a method for producing an SGT-including pillar-shaped semiconductor device according to a first embodiment of the present invention.
Figure 1H:
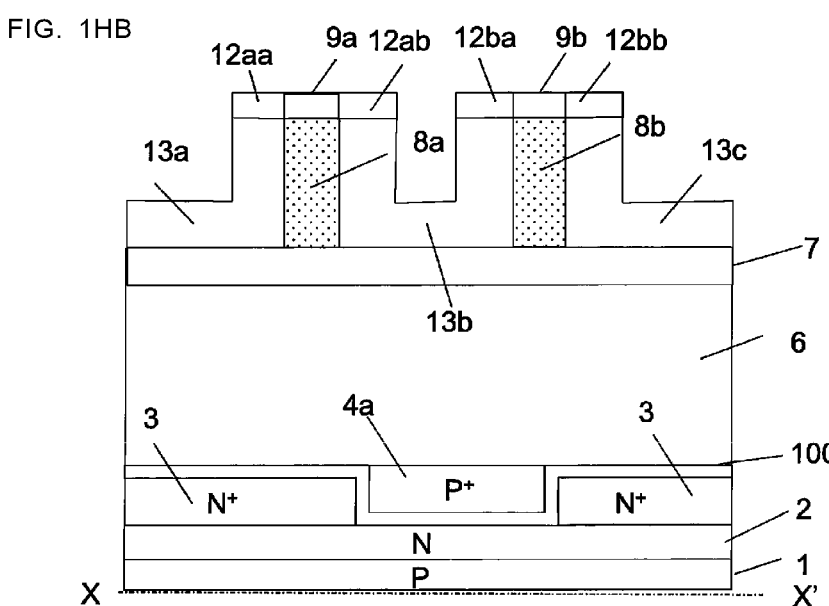
Figure 1H:
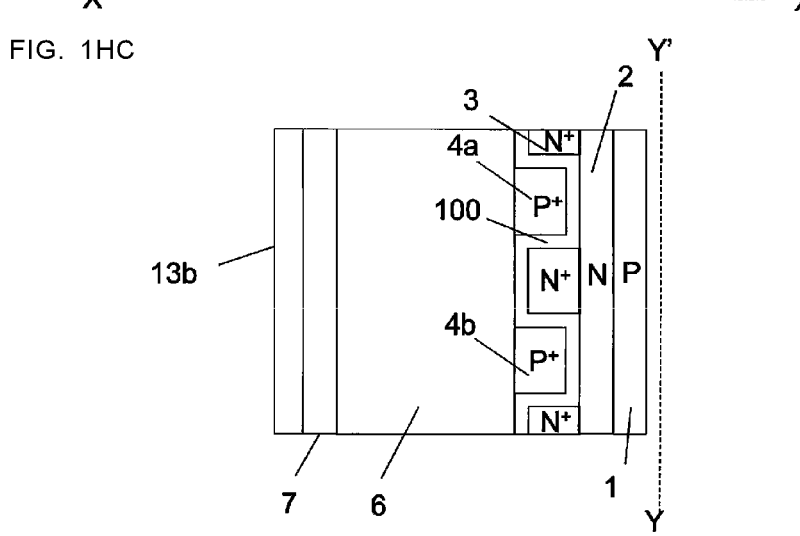

Next, a SiN layer (not illustrated) is formed by an atomic layered deposition (ALD) method over the entire structure so as to cover the mask semiconductor layer 7, the band-shaped SiGe layers 8a and 8b, and the band-shaped mask semiconductor layers 9a and 9b. Subsequently, the entire structure is covered with a $SiO_2$ layer (not illustrated) formed by, for example, a flow chemical vapor deposition (flow CVD) method. Subsequently, the $SiO_2$ layer and the SiN layer are polished by chemical mechanical polishing (CMP) such that the level of the upper surface is at the level of the upper surface of the band-shaped mask semiconductor layers 9a and 9b to form SiN layers 13a, 13b, and 13c. Subsequently, top portions of the SiN layers 13a, 13b, and 13c are etched to form recessed portions. The recessed portions are formed such that the level of bottom portions of the recessed portions are lowered to the level of the band-shaped mask semiconductor layers 9a and 9b. Subsequently, the entire structure is covered with a SiN layer (not illustrated), and the whole of the SiN layer is polished by a CMP method such that the level of the upper surface is at the level of the upper surface of the band-shaped mask semiconductor layers 9a and 9b. Subsequently, the $SiO_2$ layer formed by the flow CVD method is removed. As a result, as illustrated in FIGS. 1HA to 1HC, band-shaped mask semiconductor layers 12aa, 12ab, 12ba, and 12bb having the same shapes as the shapes of the top portions of the SiN layers 13a, 13b, and 13c in plan view are formed on both sides of the band-shaped mask semiconductor layers 9a and 9b.

Figure 1I:
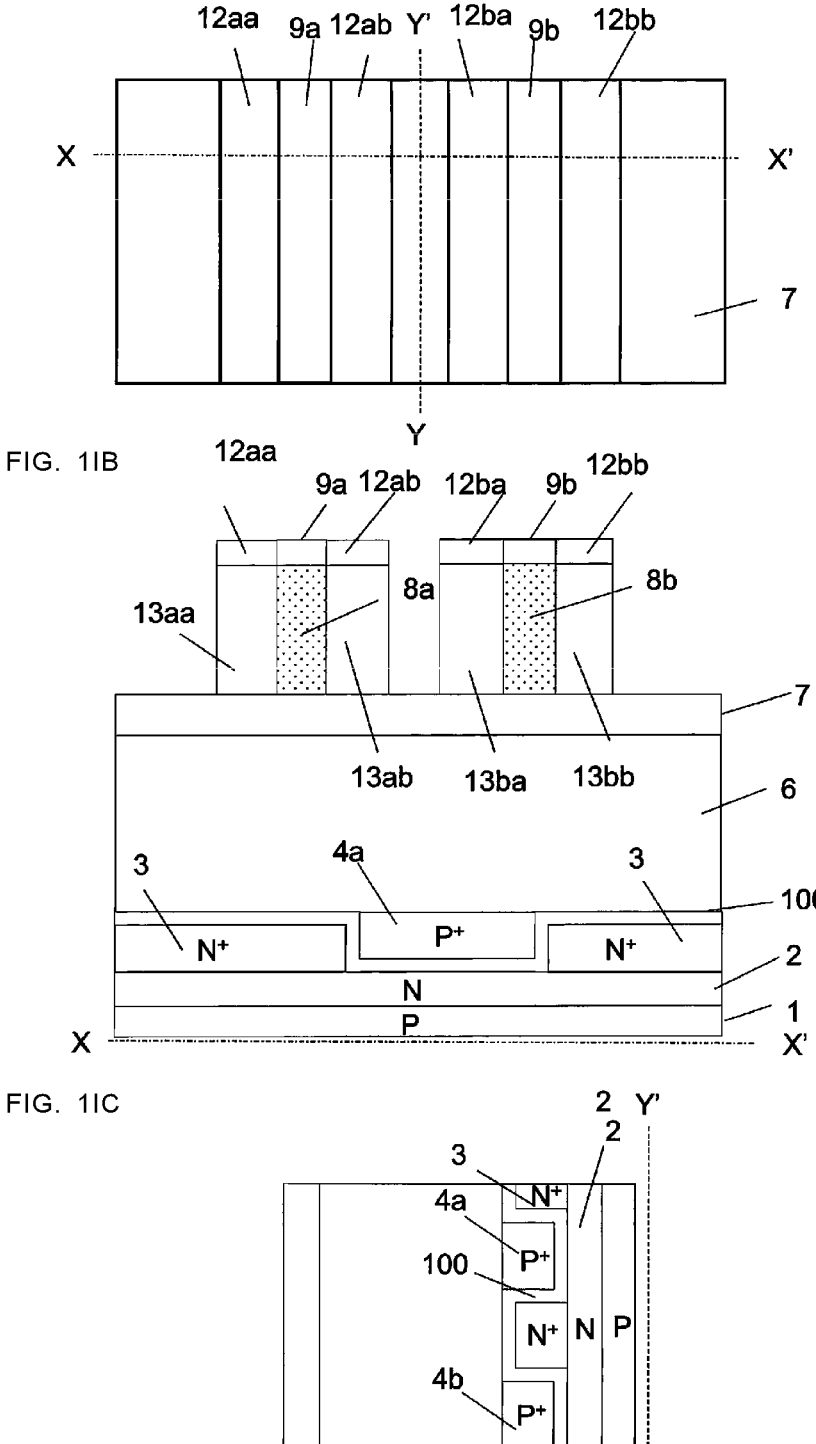
FIG. 1IA and FIGS. 1IB and 1IC are respectively a plan view and sectional structural views that illustrate a method for producing an SGT-including pillar-shaped semiconductor device according to a first embodiment of the present invention.

Next, as illustrated in FIGS. 1IA to 1IC, the SiN layers 13a, 13b, and 13c are etched using the band-shaped mask semiconductor layers 9a, 9b, 12aa, 12ab, 12ba, and 12bb as a mask to form band-shaped SiN layers 13aa, 13ab, 13ba, and 13bb. In this case, the band-shaped SiN layers 13aa, 13ab, 13ba, 13bb have the same width in plan view.

Figure 1J:
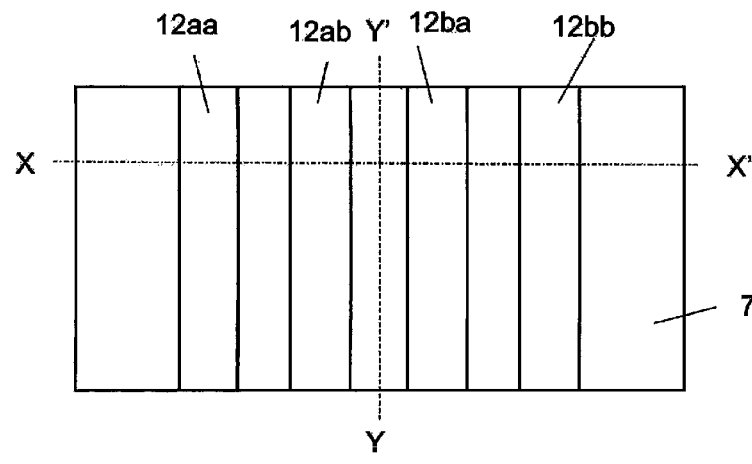
FIG. 1JA and FIGS. 1JB and 1JC are respectively a plan view and sectional structural views that illustrate a method for producing an SGT-including pillar-shaped semiconductor device according to a first embodiment of the present invention.
Figure 1J:
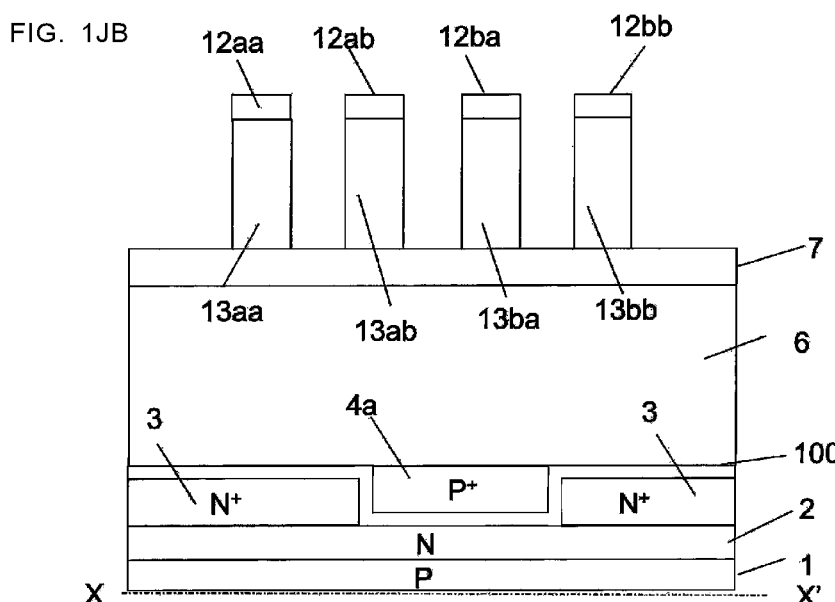
Figure 1J:
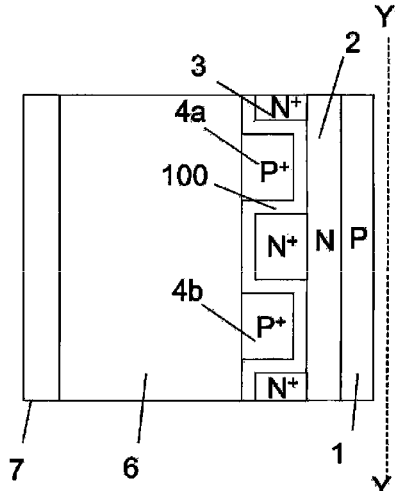

Next, the band-shaped mask semiconductor layers 9a and 9b and the band-shaped SiGe layers 8a and 8b are removed. As a result, as illustrated in FIGS. 1JA to 1JC, the band-shaped SiN layers 13aa, 13ab, 13ba, and 13bb having, on top portions thereof, the band-shaped mask semiconductor layers 12aa, 12ab, 12ba, and 12bb, respectively, extending in the Y direction in plan view and arranged in parallel to each other are formed on the mask semiconductor layer 7.

Figure 1K:
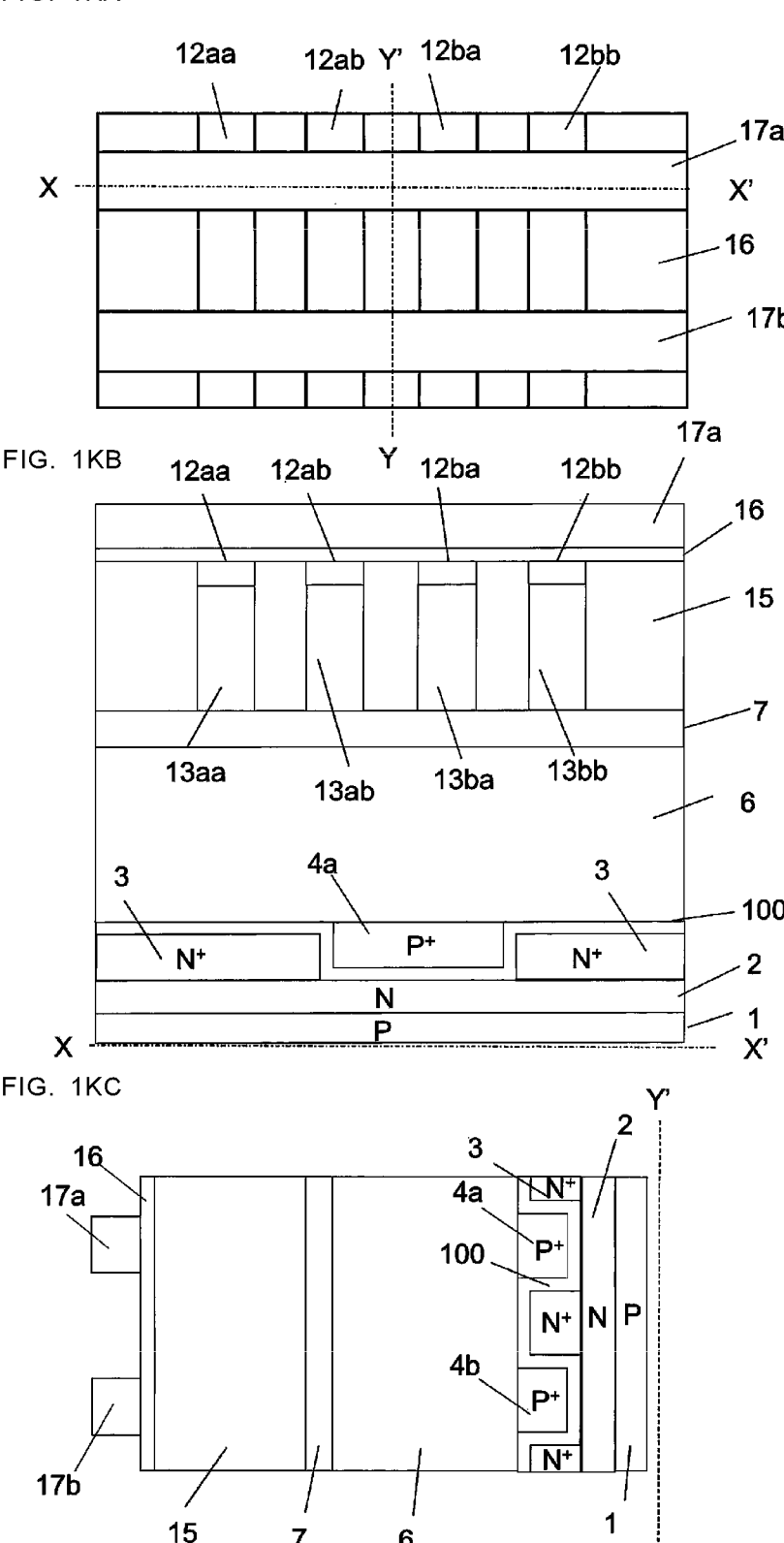
FIG. 1KA and FIGS. 1KB and 1KC are respectively a plan view and sectional structural views that illustrate a method for producing an SGT-including pillar-shaped semiconductor device according to a first embodiment of the present invention.

Next, a $SiO_2$ layer (not illustrated) is formed by an FCVD method to cover the entire structure. Subsequently, the $SiO_2$ layer is polished by a CMP method such that the level of the upper surface thereof is located at the same level as that of the upper surface of the band-shaped mask semiconductor layers 12aa, 12ab, 12ba, and 12bb to form a $SiO_2$ layer 15, as illustrated in FIGS. 1KA to 1KC. Subsequently, a SiN layer 16 is formed on the $SiO_2$ layer 15 and the band-shaped mask semiconductor layers 12aa, 12ab, 12ba, and 12bb. Subsequently, band-shaped mask semiconductor layers 17a and 17b extending in an X direction and arranged in parallel to each other are formed on the SiN layer 16 by a basic method that is the same as the method for forming the band-shaped SiN layers 13aa, 13ab, 13ba, and 13bb.

Figure 1L:
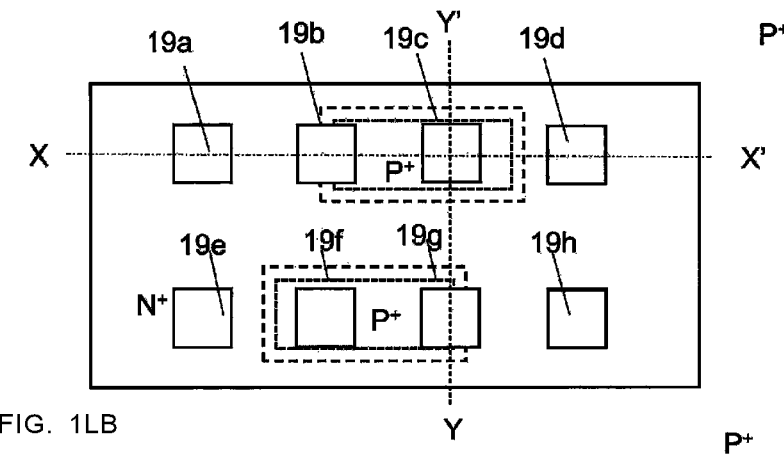
FIG. 1LA and FIGS. 1IB and 1IC are respectively a plan view and sectional structural views that illustrate a method for producing an SGT-including pillar-shaped semiconductor device according to a first embodiment of the present invention.
Figure 1L:
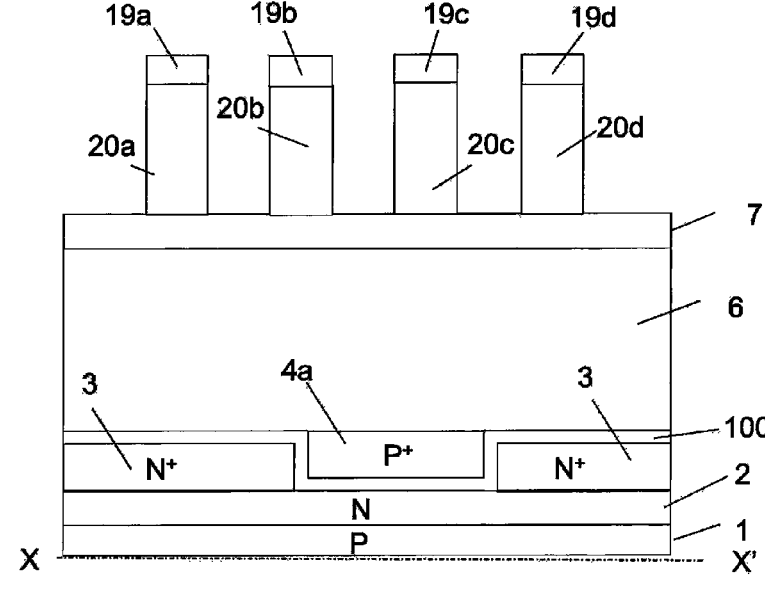
Figure 1L:
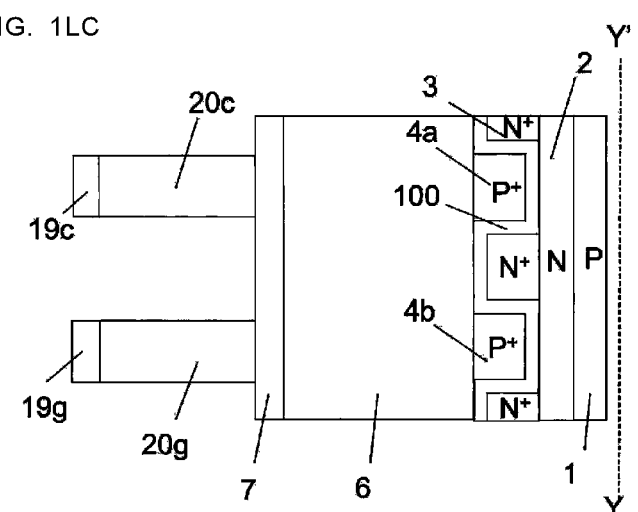

Next, as illustrated in FIGS. 1LA to 1LC, the SiN layer 16, the band-shaped mask semiconductor layers 12aa, 12ab, 12ba, and 12bb, the band-shaped SiN layers 13aa, 13ab, 13ba, and 13bb, and the mask semiconductor layer 7 are etched by RIE using the band-shaped mask semiconductor layers 17a and 17b as a mask. Subsequently, the remaining SiN layer 16 and the $SiO_2$ layer 15 are removed. As a result, SiN pillars 20a, 20b, 20c, 20d, 20e, 20f, 20g, and 20h having, in plan view, rectangular mask semiconductor layers 19a, 19b, 19c, 19d, 19e, 19f, 19g, and 19h, respectively, on top portions thereof are formed.

Figure 1M:
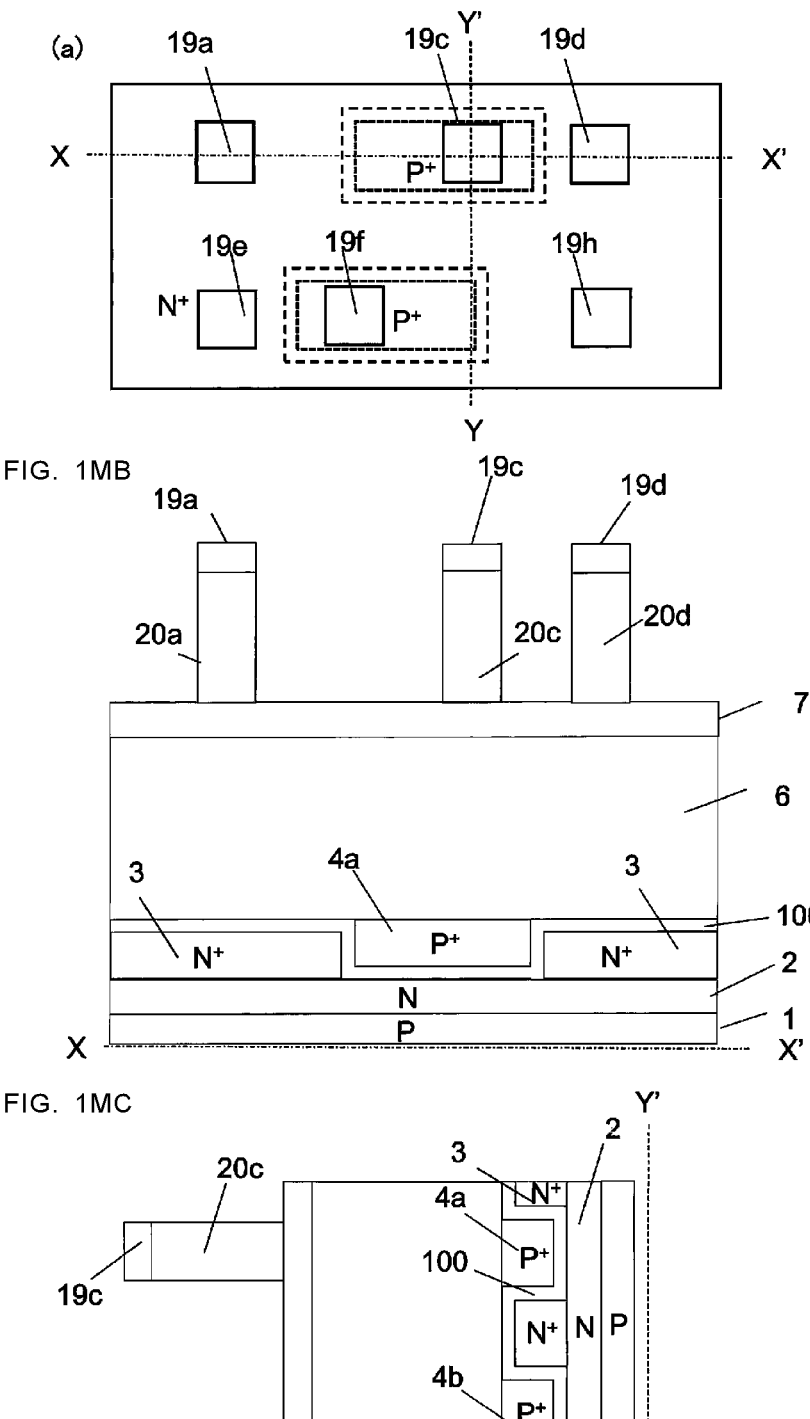
FIG. 1MA and FIGS. 1MB and 1MC are respectively a plan view and sectional structural views that illustrate a method for producing an SGT-including pillar-shaped semiconductor device according to a first embodiment of the present invention.

Next, as illustrated in FIGS. 1MA to 1MC, the rectangular mask semiconductor layers 19b and 19g and the SiN pillars 20b and 20g are removed.

Next, the mask semiconductor layer 7 is etched using, as a mask, the mask semiconductor layers 19a, 19c, 19d, 19e, 19f, and 19h and the SiN pillars 20a, 20c, 20d, 20e, 20f, and 20h to form mask semiconductor layers 7a, 7b, 7c, 7d, 7e, and 7f. Subsequently, the mask semiconductor layers 19a, 19c, 19d, 19e, 19f, and 19h and the SiN pillars 20a, 20c, 20d, 20e, 20f, 20h are removed. Subsequently, the i-layer 6 is etched using, as a mask, the mask semiconductor layers 7a, 7b, 7c, 7d, 7e, and 7f to form Si pillars 6a, 6b, 6c, 6d, 6e, and 6f, (and the etched semiconductor layer 100a, 100b, 100c and 100e) on the N+ layer 3 and the P+ layers 4a and 4b, as illustrated in FIGS. 1NA to 1NC. Note that the mask semiconductor layers 7a, 7b, 7c, 7d, 7e, and 7f may be layers formed by removing upper layer portions of the mask semiconductor layer 7 in the vertical direction. The material configuration of the mask semiconductor layer 7 is selected in order to obtain accurate mask semiconductor layers 7a, 7b, 7c, 7d, 7e, and 7f.

Figure 10:
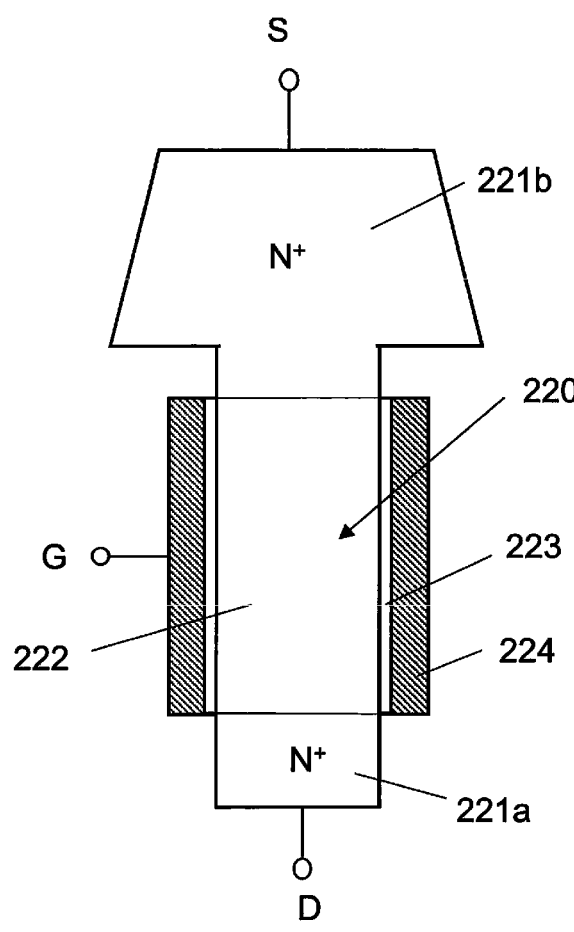
FIG. 10 is a schematic structural view of an existing SGT.
Figure 11:
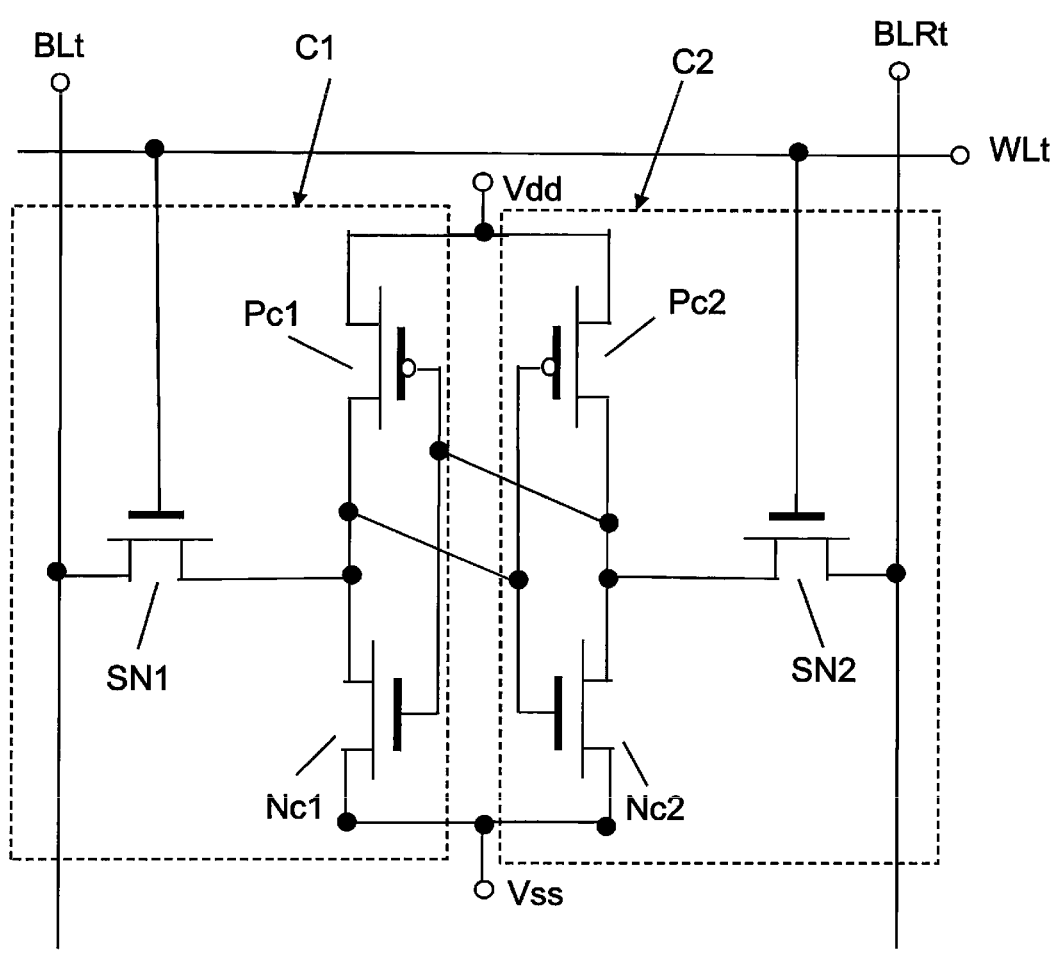
FIG. 11 is a circuit diagram of an SRAM cell using existing SGTs.

Next, as illustrated in FIGS. 10A to 10C, the N$^+$ layer 3, the P$^+$ layer 4a, the N layer 2, and the P layer substrate 1 that are connected to bottom portions of the Si pillars 6a, 6b, and 6c are etched to form a Si pillar base 21a constituted by an upper portion of the P layer substrate 1, the N layer 2a, the N$^+$ layers 3aa and 3ab (one of first impurity layer and second impurity layer), a P$^+$ layer 4aa (which is the second impurity layer when the N$^+$ layer 3ab is the first impurity layer, and which is the first impurity layer when the N$^+$ layer 3ab is the second impurity layer). At the same time, the N$^+$ layer 3, the P$^+$ layer 4b, the N layer 2, and the P layer substrate 1 that are connected to bottom portions of the Si pillars 6d, 6e, and 6f are etched to form a Si pillar base 21b constituted by an upper portion of the P layer substrate 1, the N layer 2b, the N$^+$ layer 3ba (not illustrated, one of first impurity layer and second impurity layer), the N$^+$ layer 3bb (not illustrated), a P$^+$ layer 4bb (which is the second impurity layer when the N$^+$ layer 3ba is the first impurity layer, and which is the first impurity layer when the N$^+$ layer 3ba is the second impurity layer). Subsequently, a $SiO_2$ layer 22 is formed on an outer peripheral portion of the N$^+$ layers 3aa, 3ab, 3ba, and 3bb, the P$^+$ layers 4aa and 4bb, and the N layer 2a and 2b and on the P layer substrate 1. Subsequently, a HfO$_2$ layer 23 and a TiN layer (not illustrated) are formed by an ALD method so as to cover the entire structure. In this case, side surfaces of the TiN layers are in contact with each other between the Si pillars 6b and 6c and between the Si pillars 6d and 6e. Subsequently, a TiN layer 24a surrounding the $HfO_2$ layer 23 formed on the outer periphery of the Si pillar 6a, a TiN layer 24b surrounding the $HfO_2$ layer 23 formed on the outer periphery of the Si pillars 6b and 6c, a TiN layer 24c surrounding the $HfO_2$ layer 23 formed on the outer periphery of the Si pillars 6d and 6e, and a TiN layer 24d surrounding the $HfO_2$ layer 23 formed on the outer periphery of the Si pillar 6f are formed. Subsequently, the entire structure is covered with a $SiO_2$ layer (not illustrated) and then polished by a CMP method such that the level of the upper surface thereof is at the level of the upper surfaces of the mask semiconductor layers 7a, 7b, 7c, 7d, 7e, and 7f. Subsequently, the planarized $SiO_2$ layer (not illustrated) is etched back by an RIE method to form a $SiO_2$ layer 25. Next, top portions of the $HfO_2$ layer 23 and the TiN layers 24a, 24b, 24c, and 24d are removed using the mask semiconductor layers 7a, 7b, 7c, 7d, 7e, and 7f and the $SiO_2$ layer 25 as a mask. The TiN layers 24a and 24b (first gate conductor layer and second gate conductor layer) and 24c and 24d (first gate conductor layer and second gate conductor layer) function as gate conductor layers of SGTs.

Next, as illustrated in FIGS. 1PA to 1PC, the mask semiconductor layers 7a to 7f are removed, a SiN layer 27 (first insulating layer) is formed over the $SiO_2$ layer 25 located on outer peripheral portions of the Si pillars 6a to 6f, and the entire structure is polished by a CMP method so as to expose the top of the Si pillars 6a to 6f.

Next, as illustrated in FIGS. 1QA to 1QC, a $SiO_2$ layer 28 is formed on the SiN layer 27 by an FCVD method to cover the entire structure. Subsequently, the $SiO_2$ layer 28 is etched by, for example, reactive ion etching (RIE) so as to expose the Si pillars 6b and 6e and the SiN layer 27 to form a band-shaped groove portion 28c and band-shaped covering portions 28a and 28b in plan view. A $P^+$ layer 32b (one of third impurity layer and fourth impurity layer) and a $P^+$ layer 32e (one of third impurity layer and the fourth impurity layer) that contain an acceptor impurity are formed on exposed top portions of the Si pillars 6b and 6e, respectively, by a selective epitaxial crystal growth method.

Figure 1R:
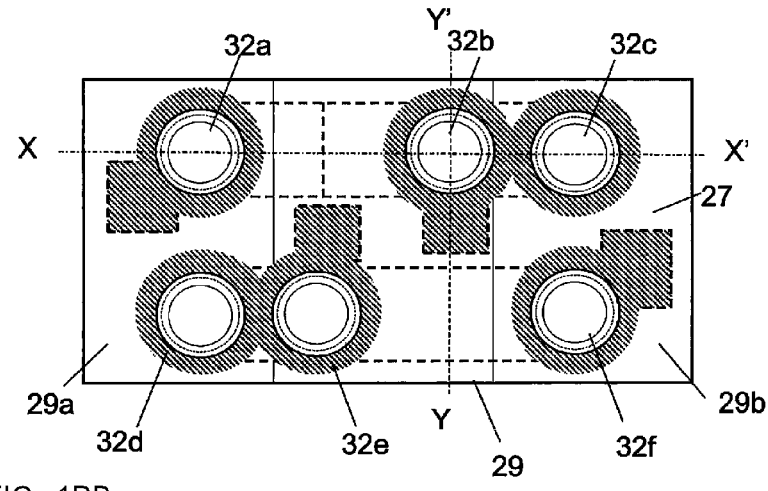
FIG. 1RA and FIGS. 1RB and 1RC are respectively a plan view and sectional structural views that illustrate a method for producing an SGT-including pillar-shaped semiconductor device according to a first embodiment of the present invention.
Figure 1R:
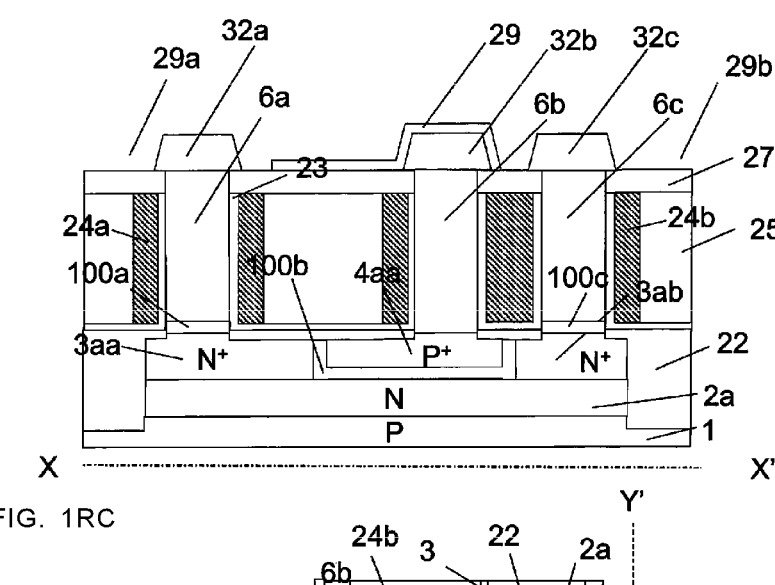
Figure 1R:
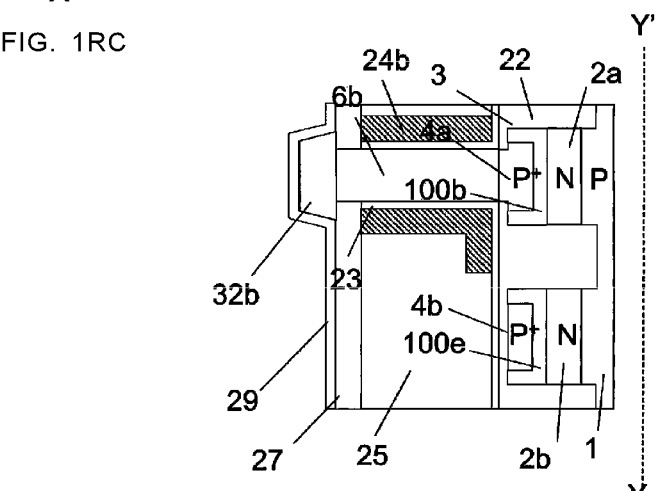

Next, a $SiO_2$ layer 29 is formed by an FCVD method to cover the entire structure. Subsequently, band-shaped groove portions 29a and 29b having a pattern reverse to that of the band-shaped groove portion 28c in plan view are formed by, for example, reactive ion etching (RIE) so as to expose the Si pillars 6a, 6c, 6d, and 6f and the SiN layer 27. Next, as illustrated in FIGS. 1RA to 1RC, an $N^+$ layer 32a (one of third impurity layer and fourth impurity layer), an $N^+$ layer 32c (one of third impurity layer and fourth impurity layer), an $N^+$ layer 32d (one of third impurity layer and fourth impurity layer), and an $N^+$ layer 32f (one of third impurity layer and fourth impurity layer) that contain a donor impurity are formed on exposed top portions of the Si pillars 6a, 6c, 6d, and 6f, respectively, by a selective epitaxial crystal growth method.

Next, the $SiO_2$ layer 29 is removed by, for example, isotropic etching, and a $SiO_2$ layer 30 is formed over the entire structure by a CVD method. As illustrated in FIGS. 1SA to 1SC, etching is performed by a lithography method and reactive ion etching (RIE) such that at least a portion of each of the layers 32a to 32f is exposed to form recessed portions 30a, 30b, 30c, 30d, 30e, and 30f.

Figure 1T:
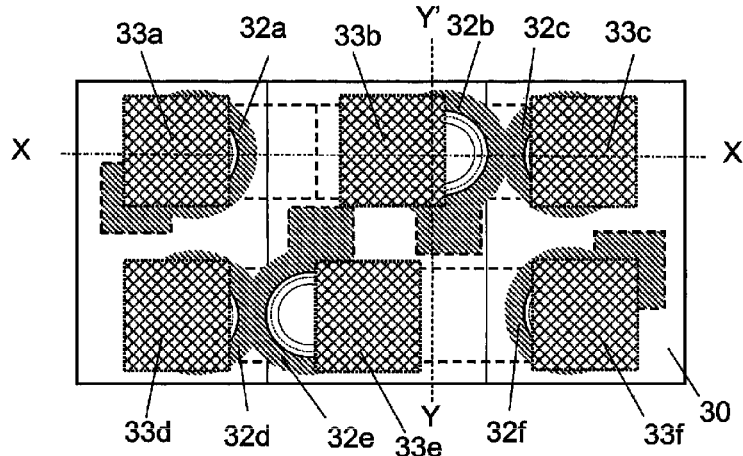
FIG. 1TA and FIGS. 1TB and 1TC are respectively a plan view and sectional structural views that illustrate a method for producing an SGT-including pillar-shaped semiconductor device according to a first embodiment of the present invention.
Figure 1T:
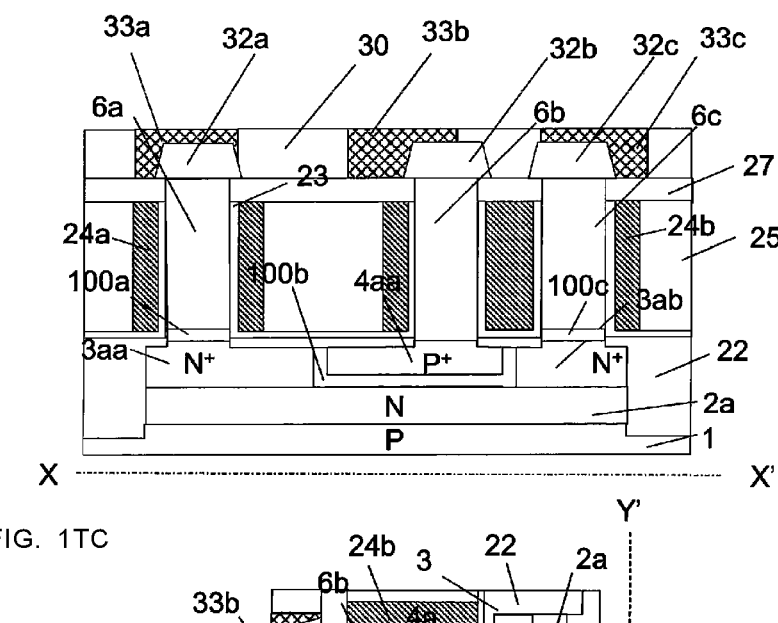
Figure 1T:
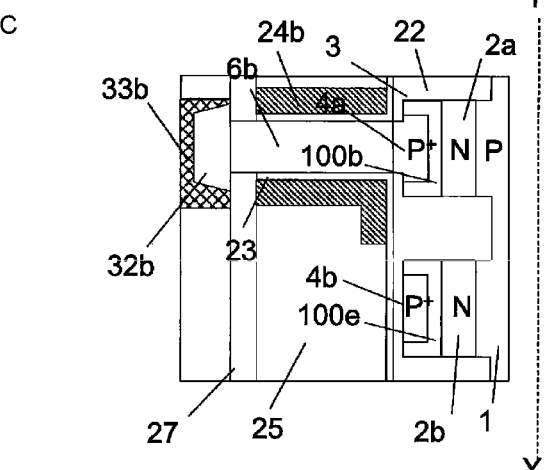

Next, the resulting structure is covered with a thin TiN layer (not illustrated) and a W layer (not illustrated), and, as illustrated in FIGS. 1TA to 1TC, the entire structure is polished by a CMP method such that the surface of the $SiO_2$ layer 30 is sufficiently exposed. Thus, W layers 33a, 33b, 33c, 33d, 33e, and 33f are formed. In this step, the resulting structure may be covered with a thin TiN layer and a W layer prior to formation of the $SiO_2$ layer 30, etching may be performed by a lithography method and reactive ion etching (RIE) such that the TiN layer and the W layer are left on at least a portion of each of the layers 32a to 32f to form the W layers 33a, 33b, 33c, 33d, 33e, and 33f, the $SiO_2$ layer 30 may then be formed by a CVD method to cover the entire structure, and the entire structure may be polished by a CMP method. Regarding the amount of polishing in this case, the polishing may be performed until the surface of the W layer is exposed, or the $SiO_2$ layer 30 may still remain on the W layer.

Figure 1U:
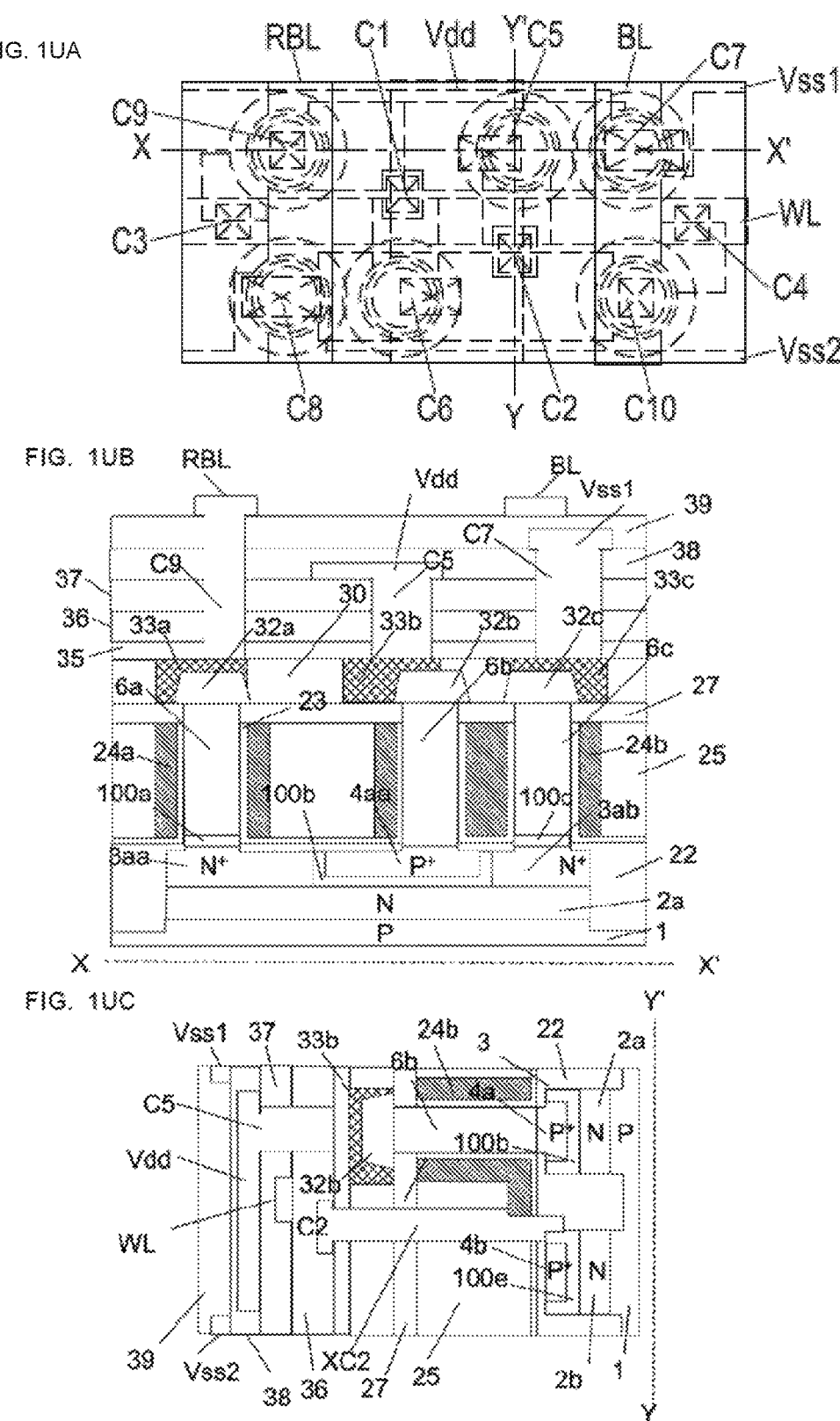
FIG. 1UA and FIGS. 1UB and 1UC are respectively a plan view and sectional structural views that illustrate a method for producing an SGT-including pillar-shaped semiconductor device according to a first embodiment of the present invention.

Next, as illustrated in FIGS. 1UA to 1UC, a $SiO_2$ layer 35 having a flat upper surface is formed to cover the entire structure. Subsequently, a connection wiring metal layer XC1 (not illustrated) is formed through a contact hole C1 formed on the boundary between the $N^+$ layer 3aa and the $P^+$ layer 4aa in plan view and on the TiN layer 24c. At the same time, a connection wiring metal layer XC2 is formed through a contact hole C2 formed on the boundary between the $N^+$ layer 3bb and the $P^+$ layer 4bb in plan view and on the TiN layer 24b. A $SiO_2$ layer 36 having a flat upper surface is formed to cover the entire structure. Subsequently, a word wiring metal layer WL is formed through contact holes C3 and C4 formed on the TiN layers 24a and 24d. A $SiO_2$ layer 37 having a flat upper surface is formed to cover the entire structure. Subsequently, a power supply wiring metal layer Vdd is formed through contact holes C5 and C6 formed on the W layers 33b and 33e on the $P^+$ layers 32b and 32e, respectively. Subsequently, a ground wiring metal layer Vss1 is formed through a contact hole C7 formed on the W layer 33c on the $N^+$ layer 32c. At the same time, a ground wiring metal layer Vss2 is formed through a contact hole C8 formed on the W layer 33d on the $N^+$ layer 32d. Subsequently, a $SiO_2$ layer 39 having a flat upper surface is formed to cover the entire structure. Subsequently, a bit output wiring metal layer BL and an inverted bit output wiring metal layer RBL are formed through contact holes C9 and C10 formed on the W layers 33a and 33f on the $N^+$ layers 32a and 32f. Thus, an SRAM cell circuit is formed on the P layer substrate 1. In this SRAM circuit, load SGTs are formed in the Si pillars 6b and 6e, drive SGTs are formed in the Si pillars 6c and 6d, and selection SGTs are formed in the Si pillars 6a and 6f.

Through a thermal process after formation of the $N^+$ layers 32a, 32c, 32d, and 32f and the $P^+$ layers 32b and 32e illustrated in FIGS. 1QA to 1QC and in FIGS. 1RA to 1RC, a donor or acceptor impurity is diffused from the $N^+$ layers 32a, 32c, 32d, and 32f and the $P^+$ layers 32b and 32e into top portions of the Si pillars 6a to 6f to form $N^+$ layers 40a, 40c, 40d, and 40f (not illustrated) and $P^+$ layers 40b and 40e (not illustrated). The distribution shape of the $N^+$ layers 40a, 40c, 40d, and 40f and the $P^+$ layers 40b and 40e is a surface layer of the Si pillars 6a to 6f or the entirety of the inside of the top portions, depending on the history of the thermal process and the diameter of the Si pillars 6a to 6f. The $N^+$ layers 32a, 32c, 32d, 32f, 40a, 40c, 40d, and 40f and the $P^+$ layers 32b, 32e, 40b, and 40e (when the $P^+$ layers 32b, 32e, 40b, and 40e are the third impurity layer, the $N^+$ layers 32c, 32d, 40c, and 40d are the fourth impurity layer, and when the $P^+$ layers 32b, 32e, 40b, and 40e are the fourth impurity layer, the $N^+$ layers 32c, 32d, 40c, and 40d are the third impurity layer) are formed to be connected to the top portions of the Si pillars 6a to 6f.

As illustrated in FIGS. 1QA to 1QC, the N$^+$ layers 3aa, 3ab, 3ba, and 3bb and the P$^+$ layers 4aa and 4bb functioning as a source or a drain of SGTs are formed below the Si pillars 6a to 6f so as to be connected together on the N layer 2a or 2c. In contrast, the N$^+$ layers 3aa, 3ab, 3ba, and 3bb and the P$^+$ layers 4aa and 4bb may be formed in bottom portions of the Si pillars 6a to 6f, and the N$^+$ layers 3aa, 3ab, 3ba, and 3bb and the P$^+$ layers 4aa and 4bb may be connected together with a metal layer or an alloy layer therebetween. Alternatively, the N$^+$ layers 3aa, 3ab, 3ba, and 3bb and the P$^+$ layers 4aa and 4bb may be formed so as to be connected to the side surfaces of bottom portions of the Si pillars 6a to 6f. As described above, the N$^+$ layers 3aa, 3ab, 3ba, and 3bb and the P$^+$ layers 4aa and 4bb functioning as a source or a drain of SGTs may be formed inside bottom portions of the Si pillars 6a to 6f or may be formed on the outer peripheries of the Si pillars 6a to 6f in contact with the outer side surfaces thereof, and each of the layers may be electrically connected together with another conductor material. The same applies to other embodiments according to the present invention.

When an increase in the degree of integration is attempted in a circuit using SGTs, as a matter of course, the separation distance between semiconductor pillars is decreased. For example, in this embodiment, the distances between the Si pillars 6a, 6b, and 6c are decreased. As a result, the following problems occur.

Problem 1

In a boundary region in contact with the high-concentration P$^+$ layer 4aa adjacent to the high-concentration N$^+$ layers 3aa and 3ab, a donor impurity and an acceptor impurity are cancelled out each other by interdiffusion of the impurities due to heat in a processing step, the impurity concentrations significantly decrease, resulting in high resistance. As a result, the driving capability decreases.

Problem 2

When the above-described interdiffusion is significant, the N$^+$ layers 3aa and 3ab become P$^+$ layers of the opposite conductivity type, or the P$^+$ layer 4aa becomes an N$^+$ layer of the opposite conductivity type. As a result, a malfunction is caused.

Feature 1

The production method according to the first embodiment has the following feature for the above problems. The semiconductor layer 100 having an impurity concentration lower than the impurity concentration of each of the N$^+$ layer 3aa, the N$^+$ layer 3ab, and the P$^+$ layer 4aa is formed in a boundary region in contact with the P$^+$ layer 4aa adjacent to the N$^+$ layers 3aa and 3ab. As a result, the high-concentration impurity layers are not in contact with each other to prevent the occurrence of the phenomenon that a donor impurity and an acceptor impurity are cancelled out each other. Therefore, the decrease in the driving capability of problem 1 and the malfunction of problem 2 can be avoided. Note that an enhanced effect is obtained by forming the semiconductor layer 100 using an intrinsic semiconductor containing neither a donor impurity nor an acceptor impurity or by forming the semiconductor layer 100 using a material having an impurity diffusion coefficient smaller than the impurity diffusion coefficient of each of the N$^+$ layer 3aa, the N$^+$ layer 3ab, and the P$^+$ layer 4aa.

Feature 2

In this embodiment, an SRAM cell composed of six SGTs has been described. On the other hand, the present invention is also applicable to an SRAM cell composed of eight SGTs. In such an SRAM cell composed of eight SGTs, two rows arranged in the Y direction are each constituted by four SGTs. Among the four SGTs, two SGTs for load or for drive are arranged to be adjacent to each other. In this case, gate electrodes of three SGTs for load and for drive arranged side by side are connected together, and impurity layers of upper portions of the adjacent SGTs for load and for drive must be separately formed. The relationship between the adjacent SGTs for load and for drive is the same as that of the SRAM cell composed of six SGTs. Thus, the application of the method of this embodiment enables the formation of a high-density SRAM cell composed of eight SGTs. The present invention is also applicable to formation of other SRAM cells composed of a plurality of SGTs.

Feature 3

In this embodiment, an example in which the present invention is applied to an SRAM cell has been described. An inverter circuit that is most commonly used in a logic circuit formed on the same chip is composed of at least two N-channel SGTs and a P-channel SGT, and gate electrodes of an N-channel SGT and a P-channel SGT are connected to each other. In addition, impurity regions of upper portions of two N-channel SGTs and a P-channel SGT must be separated from each other. Thus, the relationship between a load SGT and a drive SGT of an SRAM cell is the same as the relationship of an N-channel SGT and a P-channel SGT of an inverter circuit. This indicates that a high-density microprocessor circuit can be realized by applying the present invention to a microprocessor circuit including an SRAM cell region and a logic circuit region.

Feature 4

In this embodiment, Si pillars 6a to 6f each having a circular shape in plan view are formed. For the shapes of some or all of the Si pillars 6a to 6f in plan view, a shape such as a circular shape, an elliptical shape, or a shape elongated in one direction can be easily formed. Furthermore, in a logic circuit region formed apart from the SRAM region, Si pillars having different shapes in plan view can be formed to coexist in the logic circuit region in accordance with the logic circuit design. As a result, a high-density and high-performance microprocessor circuit can be realized.

Second Embodiment

A method for producing an SGT-including SRAM circuit according to a second embodiment of the present invention will be described below with reference to FIGS. 2AA to 2CC. In the figures, figures suffixed with A are plan views, figures suffixed with B are sectional structural views taken along lines X-X' in the corresponding figures suffixed with A, and figures suffixed with C are sectional structural views taken along lines Y-Y' in the corresponding figures suffixed with A.

The steps as in FIGS. 1AA to 1AC and FIGS. 1BA to 1BC are performed. Next, as illustrated in FIGS. 2AA to 2AC, after covering with a semiconductor layer 100, the entire structure is covered, by an atomic layered deposition (ALD) method, with a semiconductor layer 101 having an impurity concentration lower than an impurity concentration of an N$^+$ layer 3 and a P$^+$ layer 4 and having a lattice constant, an etching selectivity ratio, or an impurity diffusion coefficient different from that of the semiconductor layer 100. The semiconductor layer 101 is preferably formed of an intrinsic semiconductor containing no impurities. In this embodiment, two types of semiconductor layers are stacked, but the number of layers stacked may be two or more.

Next, as illustrated in FIGS. 2BA to 2BC, a P$^+$ layer 4 of a conductivity type opposite to the N$^+$ layer 3 is formed over the entire structure by an epitaxial crystal growth method so as to have a thickness sufficient enough to fill step portions that have been formed.

Next, as illustrated in FIGS. 2CA to 2CC, the P$^+$ layer 4 is polished by a chemical mechanical polishing (CMP) method to a surface on the semiconductor layer 101 above the N$^+$ layer 3. Although not illustrated in the figure, the P$^+$ layer 4 may be polished to a surface on the semiconductor layer 100 on the N$^+$ layer 3 or to an upper surface of the N$^+$ layer 3.

The subsequent steps are the same as the step illustrated in FIGS. 1FA to 1FC and subsequent steps of the first embodiment.

This embodiment has the following features.

Feature 1

As illustrated in FIGS. 2BA to 2BC, when the impurity P$^+$ layer 4 is formed directly on the semiconductor layer 101 as an epitaxial layer, a good-quality epitaxial layer having less defects can be formed by using, for example, intrinsic amorphous silicon as the semiconductor layer 101 compared with the case where an epitaxial layer is formed directly on the semiconductor layer 100.

Feature 2

As illustrated in FIGS. 2CA to 2CC, when the impurity P$^+$ layer 4 is polished by a CMP method, by using, as the semiconductor layer 101, a material having a low polishing rate, the semiconductor layer 101 can serve as an etching stopper, and thus polishing is stopped on the surface of the semiconductor layer 101, and the lower layer is not removed by polishing.

Third Embodiment

A method for producing an SGT-including SRAM circuit according to a third embodiment of the present invention will be described below with reference to FIGS. 3AA to 3AC and FIGS. 3BA to 3BC. In the figures, figures suffixed with A are plan views, figures suffixed with B are sectional structural views taken along lines X-X' in the corresponding figures suffixed with A, and figures suffixed with C are sectional structural views taken along lines Y-Y' in the corresponding figures suffixed with A.

On a substrate composed of a P layer 1 and an N layer 2 disposed to cover the entire upper surface of the P layer 1, as illustrated in FIGS. 3AA to 3AC, a semiconductor layer 110 is formed at an impurity concentration lower than an impurity concentration of an N$^+$ layer 3 and a P$^+$ layer 4 to cover the entire structure. Next, the entire structure is covered with the N$^+$ layer 3. The semiconductor layer 110 is preferably formed of an intrinsic semiconductor containing no impurities. The semiconductor layer 110 preferably has a donor or acceptor impurity diffusion coefficient smaller than a donor or acceptor impurity diffusion coefficient of each of the N$^+$ layer 3 and the P$^+$ layer 4.

Furthermore, the thickness of the semiconductor layer 110 is preferably set such that an impurity diffusion region of a donor or an acceptor in the semiconductor layer 110 at the time of completion of the production process is located at a boundary between the semiconductor layer 110 and the substrate.

The semiconductor layer 110 is preferably a compound semiconductor layer formed of two or more types of elements, for example, silicon germanium or silicon carbide. In addition, a compound ratio of the compound semiconductor layer is preferably set such that an impurity diffusion region of a donor or an acceptor determined by the compound ratio is located at a boundary between the semiconductor layer 110 and the substrate.

Next, as illustrated in 3BA to 3BC, in order to form P$^+$ layers at desired positions, a resist mask is formed by photolithography (not illustrated), and the N$^+$ layer 3 and the semiconductor layer 110 at the target positions are etched using the resist mask as a mask. In this embodiment, only the N$^+$ layer 3 may be etched, and the semiconductor layer 110 may be left.

The subsequent steps of this embodiment are the same as the step illustrated in FIGS. 1CA to 1CC and subsequent steps of the first embodiment.

This embodiment has the following features. By forming the semiconductor layer 110 having an impurity concentration lower than an impurity concentration of the N$^+$ layer 3 and the P$^+$ layer 4 at the boundary between the substrate and the impurity N$^+$ layer 3, impurity diffusion from the impurity N$^+$ layer 3 toward the substrate is suppressed. Therefore, the decrease in the driving capability of problem 1 and the malfunction of problem 2 can be avoided.

Figure 3C:
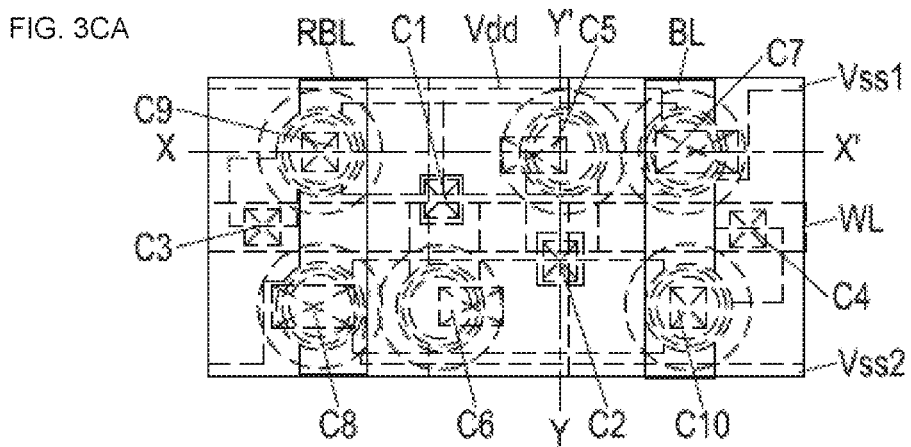
FIG. 3CA and FIGS. 3CB and 3CC are respectively a plan view and sectional structural views that illustrate a method for producing an SGT-including pillar-shaped semiconductor device according to first and third embodiments of the present invention.
Figure 3C:
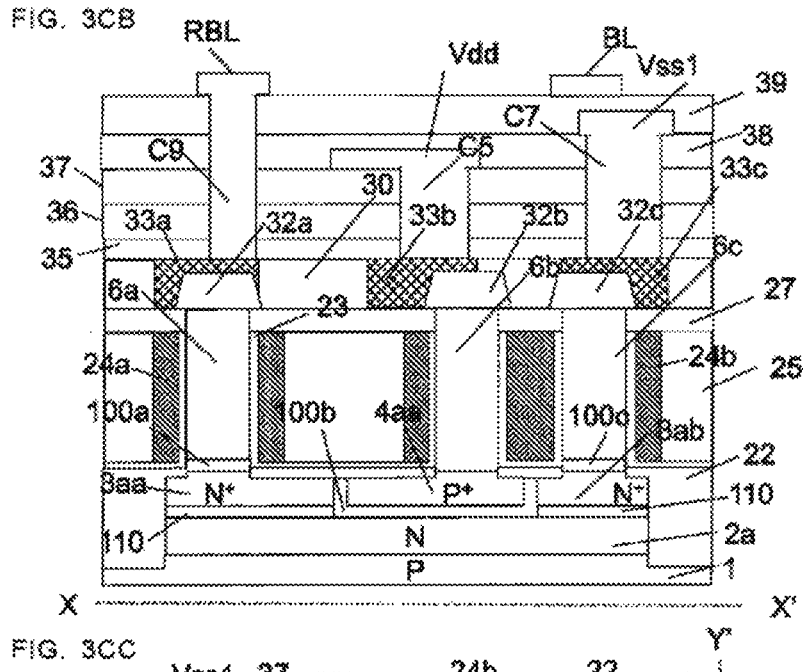
Figure 3C:
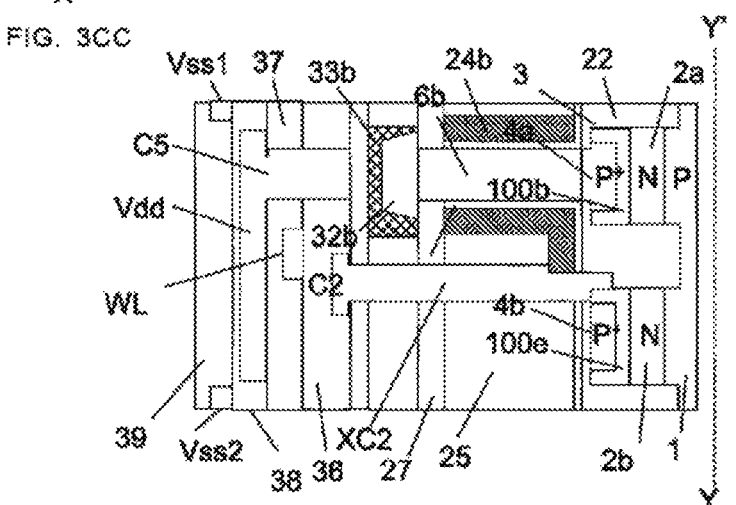

FIGS. 3CA to 3CC are views of the final structure obtained when the first embodiment and this third embodiment are implemented. First, the third embodiment is implemented as illustrated in FIGS. 3AA to 3AC and FIGS. 3BA to 3BC, and subsequently, the steps illustrated in FIGS. 1CA to 1UC are performed to implement the first embodiment. As a result, the structure illustrated in FIGS. 3CA to 3CC is obtained. This structure has the features of both the first embodiment and the third embodiment and has higher effects for the problems to be solved by the present invention.

Fourth Embodiment

A method for producing an SGT-including SRAM circuit according to a fourth embodiment of the present invention will be described below with reference to FIGS. 4AA to 4AC and FIGS. 4BA to 4BC. In the figures, figures suffixed with A are plan views, figures suffixed with B are sectional structural views taken along lines X-X' in the corresponding figures suffixed with A, and figures suffixed with C are sectional structural views taken along lines Y-Y' in the corresponding figures suffixed with A.

On a substrate composed of a P layer 1 and an N layer 2 disposed to cover the entire upper surface of the P layer 1, a semiconductor layer 110 is formed to cover the substrate. Subsequently, as illustrated in FIGS. 4AA to 4AC, the entire structure is covered with a semiconductor layer 111 having an impurity concentration lower than an impurity concentration of an N$^+$ layer 3 and a P$^+$ layer 4 and having a lattice constant, an etching selectivity ratio, or an impurity diffusion coefficient different from that of the semiconductor layer 110. The semiconductor layer 111 is preferably formed of an intrinsic semiconductor containing no impurities. In this embodiment, two types of semiconductor layers are stacked, but the number of layers stacked may be two or more.

Next, as illustrated in 4BA to 4BC, in order to form P$^+$ layers at desired positions, a resist mask is formed by photolithography (not illustrated), and the N$^+$ layer 3 and the semiconductor layers 110 and 111 at the target positions are etched using the resist mask as a mask. In this embodiment, only the N$^+$ layer 3 may be etched, and the semiconductor layers 110 and 111 may be left. Alternatively, the N$^+$ layer 3 and the semiconductor layer 111 may be etched, and the semiconductor layer 110 may be left.

The subsequent steps of this embodiment are the same as the step illustrated in FIGS. 1CA to 1CC and subsequent steps of the first embodiment.

This embodiment has the following features.

Feature 1

As illustrated in FIGS. 4AA to 4AC, when the impurity N$^+$ layer 3 is formed directly on the semiconductor layer 111 as an epitaxial layer, a good-quality epitaxial layer having less defects can be formed by using, for example, intrinsic amorphous silicon as the semiconductor layer 111 compared with the case where an epitaxial layer is formed directly on the semiconductor layer 110.

Feature 2

As illustrated in FIGS. 4BA to 4BC, when the impurity N$^+$ layer 3 is etched, by using, as the semiconductor layer 111, a material having a low etching rate, the semiconductor layer 111 serves as an etching stopper, and thus etching is stopped on the surface of the semiconductor layer 111 or in the film of the semiconductor layer 111, and the lower layer is not removed by etching.

Fifth Embodiment

A method for producing an SGT-including SRAM circuit according to a fifth embodiment of the present invention will be described below with reference to FIGS. 5AA to 5AC and FIGS. 5BA to 5BC. In the figures, figures suffixed with A are plan views, figures suffixed with B are sectional structural views taken along lines X-X' in the corresponding figures suffixed with A, and figures suffixed with C are sectional structural views taken along lines Y-Y' in the corresponding figures suffixed with A.

After the same steps as in FIGS. 1AA to 1DC of the first embodiment are performed, as illustrated in FIGS. 5AA to 5AC, the P$^+$ layer 4 is polished by a chemical mechanical polishing (CMP) method to the upper surface of the N$^+$ layer 3.

Next, as illustrated in FIGS. 5BA to 5BC, the entire structure is covered with a semiconductor layer 120 having an impurity concentration lower than an impurity concentration of the N$^+$ layer 3 and the P$^+$ layer 4. The semiconductor layer 120 is preferably formed of an intrinsic semiconductor containing no impurities. The semiconductor layer 120 preferably has a donor or acceptor impurity diffusion coefficient smaller than a donor or acceptor impurity diffusion coefficient of each of the N$^+$ layer 3 and the P$^+$ layer 4.

Furthermore, the thickness of the semiconductor layer 120 is preferably set such that an impurity diffusion region of a donor or an acceptor in the semiconductor layer 120 at the time of completion of the production process is located at a boundary between the semiconductor layer 120 and the i-layer 6.

The semiconductor layer 120 is preferably a compound semiconductor layer formed of two or more types of elements, for example, silicon germanium or silicon carbide. In addition, a compound ratio of the compound semiconductor layer is preferably set such that an impurity diffusion region of a donor or an acceptor determined by the compound ratio is located at a boundary between the semiconductor layer 120 and the i-layer 6.

The subsequent steps of this embodiment are the same as the step illustrated in FIGS. 1FA to 1FC and subsequent steps of the first embodiment.

This embodiment has the following features.

Feature 1

By forming the semiconductor layer 120 having an impurity concentration lower than an impurity concentration of the N$^+$ layer 3 and the P$^+$ layer 4 at the boundary between the impurity N$^+$ layer 3 and the i-layer 6 and between the impurity P$^+$ layer 4 and the i-layer 6, impurity diffusion from the impurity N$^+$ layer 3 and P$^+$ layer 4 toward the semiconductor pillars is suppressed. Therefore, the decrease in the driving capability of problem 1 and the malfunction of problem 2 can be avoided. When the semiconductor layer 120 is formed of an intrinsic semiconductor and has a donor or acceptor impurity diffusion coefficient smaller than a donor or acceptor impurity diffusion coefficient of each of the N$^+$ layer 3 and the P$^+$ layer 4, higher effects are obtained.

Feature 2

Due to the effect of suppressing impurity diffusion toward the semiconductor pillars described in feature 1 above, it is not necessary to increase the height of the semiconductor pillars by a length corresponding to impurity diffusion. Thus, the height of the semiconductor pillars can be suppressed to be low, and the semiconductor pillars can be made less likely to collapse.

Figure 5C:
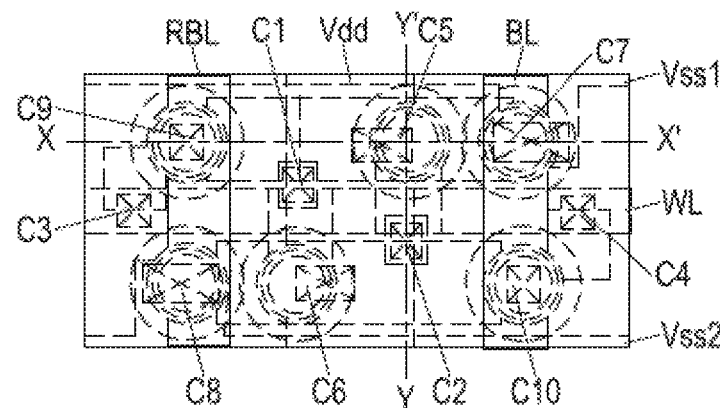
FIG. 5CA and FIGS. 5CB and 5CC are respectively a plan view and sectional structural views that illustrate a method for producing an SGT-including pillar-shaped semiconductor device according to first and fifth embodiments of the present invention.
Figure 5C:
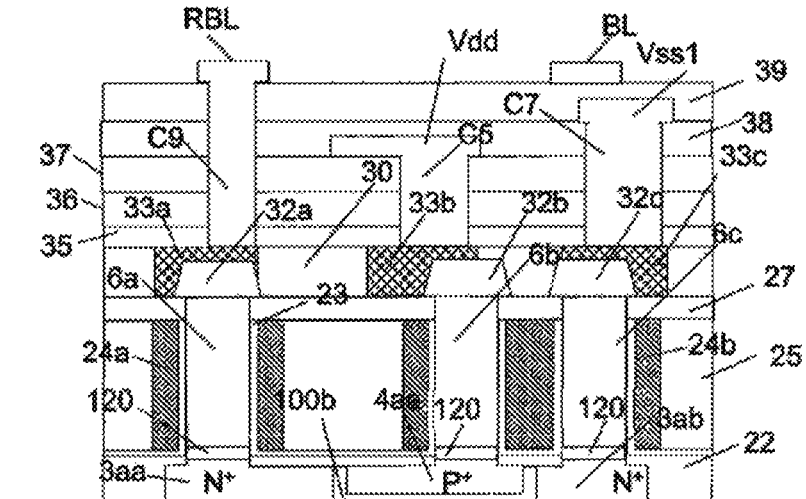
Figure 5C:
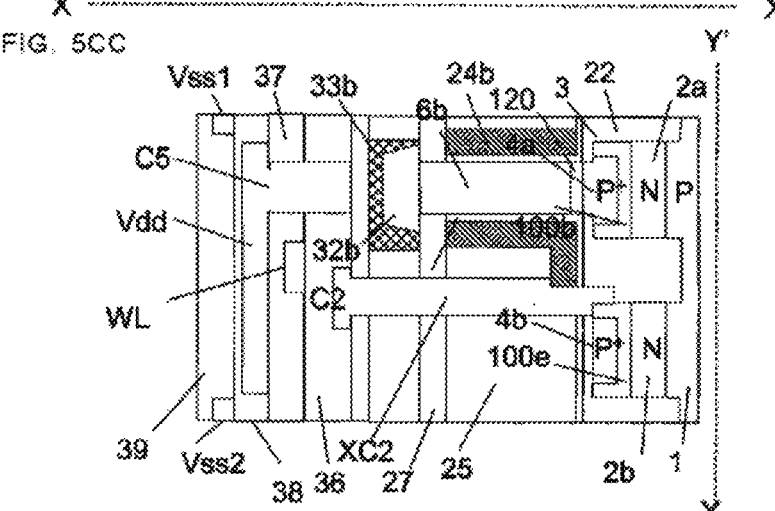

FIGS. 5CA to 5CC are views of the final structure obtained when the first embodiment and this fifth embodiment are implemented. First, the first embodiment is implemented as illustrated in FIGS. 1AA to 1DC, the fifth embodiment is then implemented as illustrated in FIGS. 5AA to 5AC and FIGS. 5BA to 5BC, and the steps illustrated in FIGS. 1FA to 1UC are then performed. As a result, the structure illustrated in FIGS. 5CA to 5CC is obtained. This structure has the features of both the first embodiment and the fifth embodiment and has higher effects for the problems to be solved by the present invention.

Sixth Embodiment

A method for producing an SGT-including SRAM circuit according to a sixth embodiment of the present invention will be described below with reference to FIGS. 6AA to 6DC. In the figures, figures suffixed with A are plan views, figures suffixed with B are sectional structural views taken along lines X-X' in the corresponding figures suffixed with A, and figures suffixed with C are sectional structural views taken along lines Y-Y' in the corresponding figures suffixed with A.

After the steps up to the step illustrated in FIGS. 5BA to 5BC of the fifth embodiment are performed, as illustrated in FIGS. 6AA to 6AC, a semiconductor layer 121 having an impurity concentration lower than an impurity concentration of the N$^+$ layer 3 and the P$^+$ layer 4 and having a lattice constant, an etching selectivity ratio, or an impurity diffusion coefficient different from that of the semiconductor layer 120 is formed on the surface of the semiconductor layer 120 to cover the entire structure.

Figure 6B:
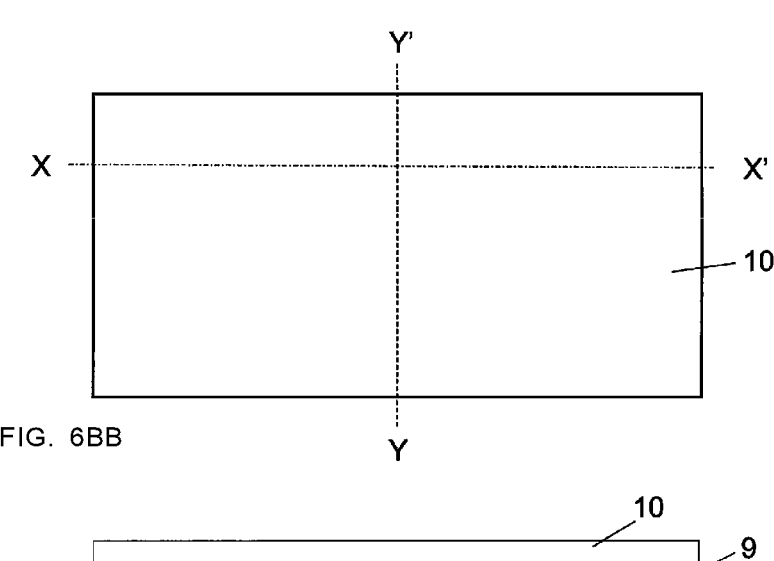
FIG. 6BA and FIGS. 6BB and 6BC are respectively a plan view and sectional structural views that illustrate a method for producing an SGT-including pillar-shaped semiconductor device according to a sixth embodiment of the present invention.
Figure 6B:
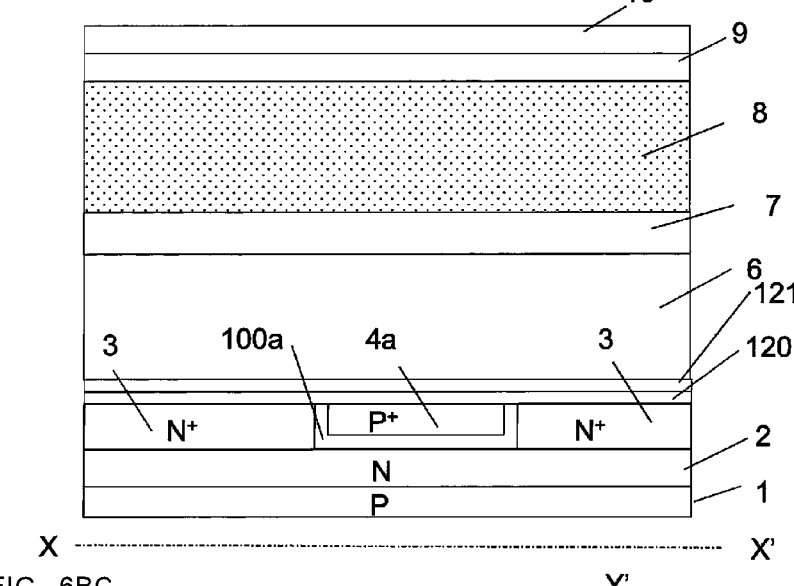
Figure 6B:
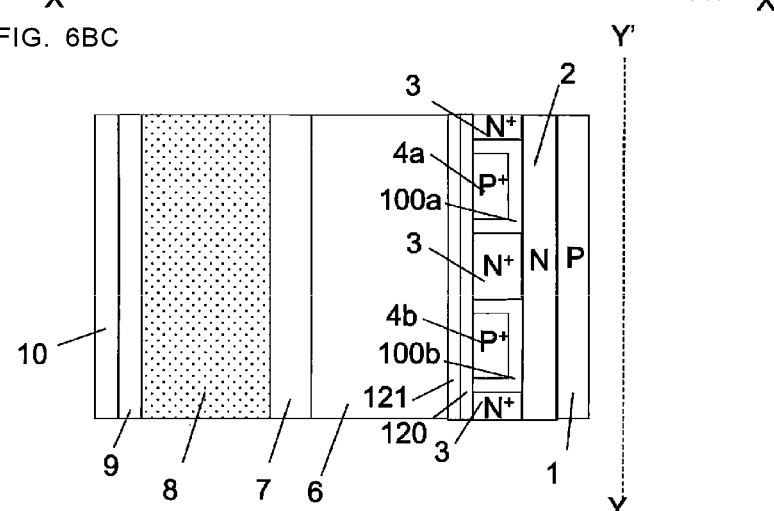

Next, an i-layer 6 is formed, and a mask semiconductor layer 7 formed of, for example, a SiO$_2$ layer, an aluminum oxide (Al$_2$O$_3$, hereinafter referred to as AlO) layer, and a SiO$_2$ layer is formed. Subsequently, for example, a silicon germanium (SiGe) layer 8 is deposited. Subsequently, a mask semiconductor layer 9 formed of a SiO$_2$ layer is deposited. Subsequently, as illustrated in FIGS. 6BA to 6BC, a mask semiconductor layer 10 formed of a SiN layer is deposited. The i-layer 6 may be formed of N-type or P-type Si containing donor or acceptor impurity atoms in a small amount.

Figure 6C:
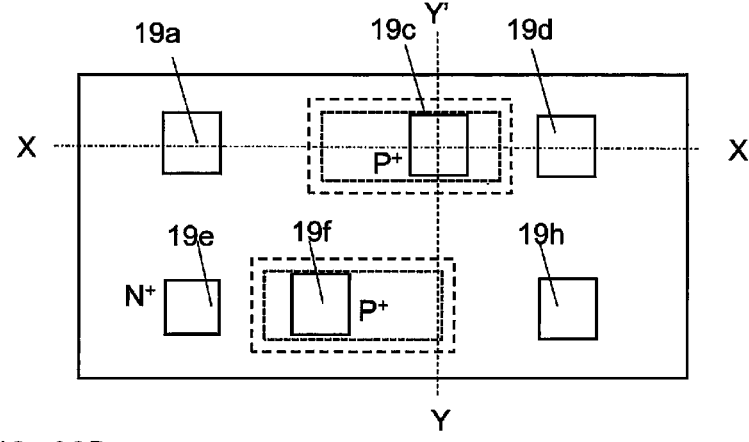
FIG. 6CA and FIGS. 6CB and 6CC are respectively a plan view and sectional structural views that illustrate a method for producing an SGT-including pillar-shaped semiconductor device according to a sixth embodiment of the present invention.
Figure 6C:
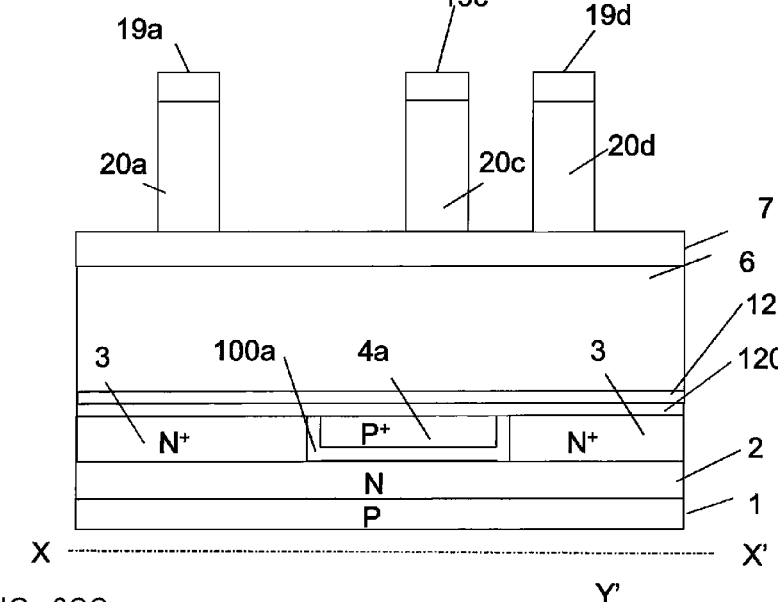
Figure 6C:
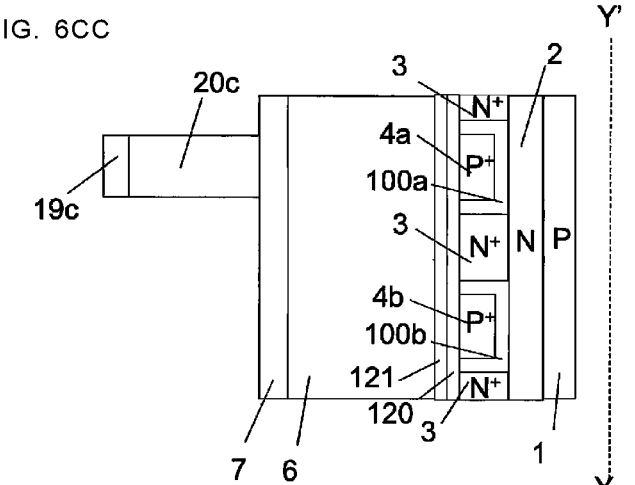

Next, the structure illustrated in FIGS. 6CA to 6CC is obtained through the same steps as those illustrated in FIGS. 1GA to 1LC of the first embodiment.

Next, the mask semiconductor layer 7 is etched using, as a mask, the mask semiconductor layers 19a, 19c, 19d, 19e, 19f, and 19h and the SiN pillars 20a, 20c, 20d, 20e, 20f, and 20h to form mask semiconductor layers 7a, 7b, 7c, 7d, 7e, and 7f. Subsequently, the mask semiconductor layers 19a, 19c, 19d, 19e, 19f, and 19h and the SiN pillars 20a, 20c, 20d, 20e, 20f, and 20h are removed. Subsequently, as illustrated in FIGS. 6DA to 6DC, the i-layer 6 is etched to the level of the top of the semiconductor layer 121 using, as a mask, the mask semiconductor layers 7a, 7b, 7c, 7d, 7e, and 7f.

Next, the semiconductor layers 121 and 120 are sequentially etched using, as a mask, the mask semiconductor layers 7a, 7b, 7c, 7d, 7e, and 7f. As illustrated in FIGS. 6EA to 6EC, Si pillars 6a, 6b, 6c, 6d, 6e, and 6f are formed on the N$^+$ layer 3 and the P$^+$ layers 4a and 4b. Note that the mask semiconductor layers 7a, 7b, 7c, 7d, 7e, and 7f may be layers formed by removing upper layer portions of the mask semiconductor layer 7 in the vertical direction. The material configuration of the mask semiconductor layer 7 is selected in order to obtain accurate mask semiconductor layers 7a, 7b, 7c, 7d, 7e, and 7f.

This embodiment has the following features.

Feature 1

As illustrated in FIGS. 6BA to 6BC, when the i-layer 6 is formed directly on the semiconductor layer 121 as an epitaxial layer, a good-quality epitaxial layer having less defects can be formed by using, for example, intrinsic amorphous silicon as the semiconductor layer 121 compared with the case where an epitaxial layer is formed directly on the semiconductor layer 120.

Feature 2

As illustrated in FIGS. 6DA to 6DC, when the i-layer 6 is etched, by using, as the semiconductor layer 121, a material having a low etching rate, etching can be temporarily stopped on the semiconductor layer 121, and variation in the amount of etching in this step can be reduced. Next, as illustrated in FIGS. 6EA to 6EC, the semiconductor layers 121 and 120 are sequentially etched. Thus, Si pillars 6a, 6b, 6c, 6d, 6e, and 6f having little variation in the pillar height can be formed on the N$^+$ layer 3 and the P$^+$ layers 4a and 4b.

Figure 7A:
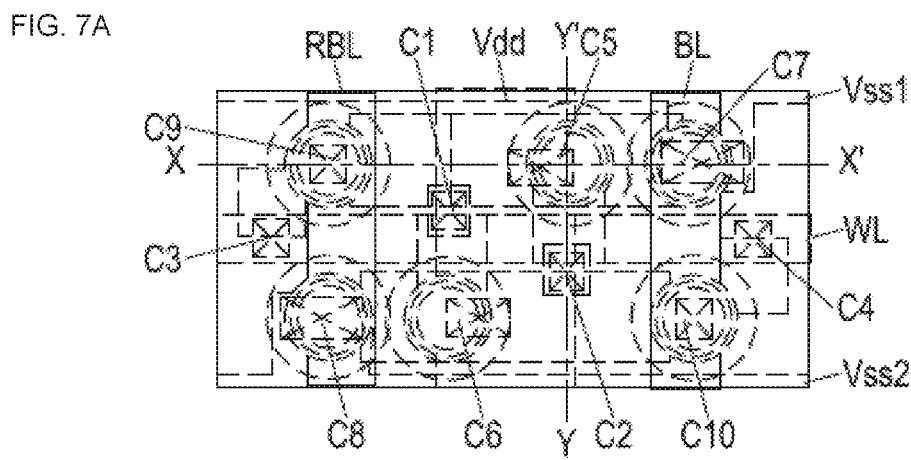
FIG. 7A and FIGS. 7B and 7C are respectively a plan view and sectional structural views that illustrate a method for producing an SGT-including pillar-shaped semiconductor device according to a first embodiment, a third embodiment, and a fifth embodiment of the present invention.
Figure 7B:
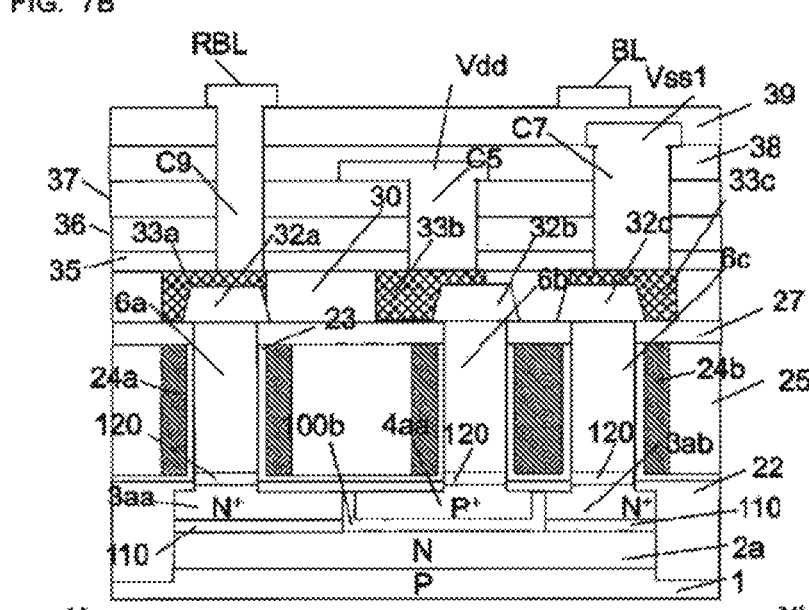
Figure 7C:
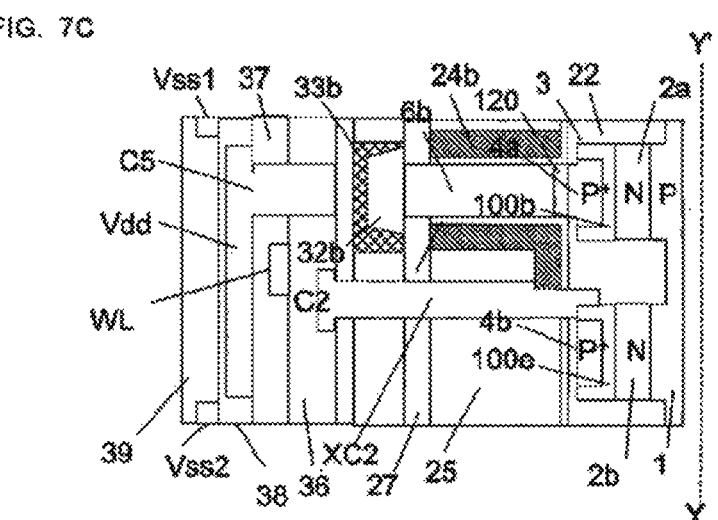

FIGS. 7A to 7C are views of the final structure obtained when the first embodiment, the third embodiment, and the fifth embodiment are implemented. First, the third embodiment is implemented as illustrated in FIGS. 3AA to 3AC and FIGS. 3BA to 3BC, and subsequently, the step illustrated in FIGS. 1CA to 1CC is performed to implement the first embodiment. Next, the fifth embodiment is implemented as illustrated in FIGS. 5AA to 5AC and FIGS. 5BA to 5BC, and the steps illustrated in FIGS. 1FA to 1UC are then performed. As a result, the structure illustrated in FIGS. 7A to 7C is obtained. This structure combines the features of the first, third, and fifth embodiments and has higher effects for the problems to be solved by the present invention.

Seventh Embodiment

A method for producing an SGT-including SRAM circuit according to a seventh embodiment of the present invention will be described below with reference to FIGS. 8A to 8D. FIG. 8A is a plan view, FIG. 8B is a sectional structural view taken along line X-X' in FIG. 8A, FIG. 8C is a sectional structural view taken along line Y-Y' in FIG. 8A, and FIG. 8D is an enlarged sectional structural view of a main portion in FIG. 8B.

FIGS. 8A to 8D illustrate the same step as the step illustrated in FIGS. 1UA to 1UC of the first embodiment. FIG. 8B is a structural view of a section that passes through a contact hole top portion C1 in FIG. 8A in plan view and illustrates a section of a connection wiring metal layer XC1 that connects the contact hole top portion C1 and lower impurity diffusion layers.

As illustrated in FIGS. 8B and 8D, this structure has a feature that the connection wiring metal layer XC1 is formed so as to be electrically connected to three layers of an N$^+$ layer 3aa, a P$^+$ layer 4aa, and a semiconductor layer 100a located at the boundary between the two layers in an XC1 bottom portion.

This embodiment has the following feature. Donor impurity diffusion from the N$^+$ layer 3aa and acceptor impurity diffusion from the P$^+$ layer 4aa form a steep PN junction in the film of the semiconductor layer 100a, and the connection wiring metal layer XC1 is formed so as to at least include the semiconductor layer 100a and to be electrically connected to the N$^+$ layer 3aa and the P$^+$ layer 4aa. Thus, a sufficiently low contact resistance can be obtained.

Eighth Embodiment

A method for producing an SGT-including SRAM circuit according to an eighth embodiment of the present invention will be described below with reference to FIGS. 9A to 9D. FIG. 9A is a plan view, FIG. 9B is a sectional structural view taken along line X-X' in FIG. 9A, FIG. 9C is a sectional structural view taken along line Y-Y' in FIG. 9A, and FIG. 9D is an enlarged sectional structural view of a main portion in FIG. 9B.

FIGS. 9A to 9D illustrate the same step as the step illustrated in FIGS. 1UA to 1UC of the first embodiment. FIG. 9B is a structural view of a section that passes through a contact hole top portion C1 in FIG. 9A in plan view and illustrates a section of a connection wiring metal layer XC1 that connects the contact hole top portion C1 and lower impurity diffusion layers.

As illustrated in FIGS. 9B and 9D, this structure has a feature that the connection wiring metal layer XC1 is formed C1 such that an XC1 bottom portion is electrically connected to an N layer 2, and an XC1 side-wall portion is electrically connected to a P$^+$ layer 4aa and a semiconductor layer 100a.

This embodiment has the following feature. A donor impurity from an N$^+$ layer 3aa is diffused into the upper surface of the N layer 2 including a lower portion of the semiconductor layer 100a to form a region of the N layer 2 having a high donor impurity concentration. The XC1 bottom portion is electrically connected to this region of the N layer 2. In addition, the XC1 side-wall portion is electrically connected to the semiconductor layer 100a and the P$^+$ layer 4aa. In this embodiment, a sufficiently low contact resistance can be obtained as in the seventh embodiment.

In embodiments according to the present invention, a single SGT is formed in a single semiconductor pillar; however, the present invention is also applicable to formation of circuits in which two or more SGTs are formed in a single semiconductor pillar. In such formation of circuits in which two or more SGTs are formed in a single semiconductor pillar, the SGT described in the present invention is an SGT located in the lowermost portion of the semiconductor pillar.

In the first embodiment, Si pillars 6a to 6f are formed. Alternatively, the Si pillars 6a to 6f may be replaced by semiconductor pillars formed of another semiconductor material. The same applies to other embodiments according to the present invention.

The $N^+$ layers $3aa$, $3ab$, $3ba$, $3bb$, $32a$, $32c$, $32d$, and $32f$ and the $P^+$ layers $4aa$, $4bb$, $32b$, and $32e$ in the first embodiment may each be a layer formed of a donor or acceptor impurity-containing Si or another semiconductor material. The same applies to other embodiments according to the present invention.

In the first embodiment, the $N^+$ layers $32a$, $32c$, $32d$, and $32f$ and the $P^+$ layers $32b$ and $32e$ are formed by a selective epitaxial crystal growth method. The $N^+$ layers $32a$, $32c$, $32d$, and $32f$ and the $P^+$ layers $32b$ and $32e$ may be selectively formed by another method, such as a method in which chemical dry etching (CDE) and ordinary epitaxial crystal growth are repeated to form the $N^+$ layers $32a$, $32c$, $32d$, and $32f$ and the $P^+$ layers $32b$ and $32e$ on top portions of the Si pillars $6a$ to $6f$ in the recessed portions $30a$ to $30f$. The same applies to other embodiments according to the present invention.

The SiN layer $27$ on outer peripheral portions of the Si pillars $6a$ to $6f$ in the first embodiment may be another material layer having a single-layer structure or a multilayer structure and containing an organic material or an inorganic material as long as the material is suitable for the object of the present invention. The same applies to other embodiments according to the present invention.

In the first embodiment, the mask semiconductor layer $7$ is formed of a $SiO_2$ layer, an aluminum oxide ($Al_2O_3$, hereinafter referred to as AlO) layer, and a $SiO_2$ layer. The mask semiconductor layer $7$ may be another material layer having a single-layer structure or a multilayer structure and containing an organic material or an inorganic material as long as the material is suitable for the object of the present invention. The same applies to other embodiments according to the present invention.

The material of each of the wiring metal layers XC1, XC2, WL, Vdd, Vss, BL, and RBL in the first embodiment may be not only a metal but also a conductive material such as an alloy or a semiconductor containing an acceptor or donor impurity in a large amount. The layer formed of a conductive material may have a single-layer structure or a multilayer structure. The same applies to other embodiments according to the present invention.

In the first embodiment, as illustrated in FIGS. 10A to 10C, the TiN layers $24a$, $24b$, $24c$, and $24d$ are used as gate conductor layers. The TiN layers $24a$, $24b$, $24c$, and $24d$ may each be a material layer having a single-layer structure or a multilayer structure as long as the material is suitable for the object of the present invention. The TiN layers $24a$, $24b$, $24c$, and $24d$ may each be a conductor layer that at least has a desired work function, such as a metal layer having a single-layer structure or a multilayer structure. Another conductive layer such as a W layer may be formed outside the TiN layers. In this case, the W layer functions as a metal wiring layer for connecting the gate conductor layers. Besides the W layer, a metal layer having a single-layer structure or a multilayer structure may be used. The $HfO_2$ layer $23$ is used as a gate insulating layer; however, another material layer having a single-layer structure or a multilayer structure may be used. The same applies to other embodiments according to the present invention.

In the first embodiment, the shape of each of the Si pillars $6a$ to $6f$ in plan view is a circular shape. For the shapes of some or all of the Si pillars $6a$ to $6f$ in plan view, for example, a shape such as a circular shape, an elliptical shape, or a shape elongated in one direction can be easily formed. In a logic circuit region formed apart from the SRAM cell region, Si pillars having different shapes in plan view can be formed to coexist in the logic circuit region in accordance with the logic circuit design. The same applies to other embodiments according to the present invention.

In the first embodiment, the $N^+$ layers $3aa$, $3ab$, $3ba$, and $3bb$ and the $P^+$ layers $4aa$ and $4bb$ are formed so as to be connected to bottom portions of the Si pillars $6a$ to $6f$. A metal layer or an alloy layer formed of, for example, a silicide may be formed on the upper surfaces of the $N^+$ layers $3aa$, $3ab$, $33ba$, and $3bb$ and the $P^+$ layers $4aa$ and $4bb$. As described above, formation of impurity regions connected to the bottom portions of the Si pillars $6a$ to $6f$ and impurity layer combining regions that connect these impurity layers may be determined in view of the design and production. The $N^+$ layers $3aa$, $3ab$, $3ba$, and $3bb$ and the $P^+$ layers $4aa$ and $4bb$ serve as impurity layers and impurity layer combining regions. The same applies to other embodiments according to the present invention.

In the first embodiment, SGTs are formed on the P layer substrate $1$. Instead of the P layer substrate $1$, a silicon-on-insulator (SOI) substrate may be used. A substrate formed of another material may be used as long as it functions as a substrate. The same applies to other embodiments according to the present invention.

In the first embodiment, a description has been made of SGTs in which sources and drains are constituted by using, on and below the Si pillars $6a$ to $6f$, the $N^+$ layers $32a$, $32c$, $32d$, and $32f$ and the $P^+$ layers $32b$ and $32e$, and the $N^+$ layers $3aa$, $3ab$, $3ba$, and $3bb$ and the $P^+$ layers $4aa$ and $4bb$ that have a conductivity of the same polarity. The present invention is also applicable to tunnel SGTs that have sources and drains having different polarities. The same applies to other embodiments according to the present invention.

In the first embodiment, after formation of the gate $HfO_2$ layer $23$ and the gate TiN layers $24a$, $24b$, $24c$, and $24d$, the $N^+$ layers $32a$, $32c$, $32d$, and $32f$ and the $P^+$ layers $32b$ and $32e$ are formed. By contrast, after formation of the $N^+$ layers $32a$, $32c$, $32d$, and $32f$ and the $P^+$ layers $32b$ and $32e$, the gate $HfO_2$ layer $23$ and the gate TiN layers $24a$, $24b$, $24c$, and $24d$ may be formed. The same applies to other embodiments according to the present invention.

In the vertical NAND flash memory circuit, a plurality of memory cells are stacked in the vertical direction, the memory cells each including a semiconductor pillar serving as a channel and including, around the semiconductor pillar, a tunnel oxide layer, a charge storage layer, an interlayer insulating layer, and a control conductor layer. Semiconductor pillars at both ends of these memory cells include a source line impurity layer corresponding to a source and a bit line impurity layer corresponding to a drain. In addition, when one of memory cells on both sides of a certain memory cell functions as a source, the other functions as a drain. Thus, the vertical NAND flash memory circuit is one of SGT circuits. Accordingly, the present invention is also applicable to mixed circuits with NAND flash memory circuits.

Similarly, in a magnetic memory circuit and a ferroelectric memory circuit, the present invention is applicable to an inverter and a logic circuit used inside or outside a memory cell region.

It is to be understood that various embodiments and modifications of the present invention are possible without departing from the broad spirit and scope of the present invention. The embodiments described above are illustrative examples of the present invention and do not limit the scope of the present invention. The embodiments and modifications can be appropriately combined. Furthermore, some of constituent features of the above embodiments may be omitted as required, and such embodiments still fall within the technical idea of the present invention.

According to the method for producing a pillar-shaped semiconductor device according to the present invention, a high-density pillar-shaped semiconductor device is provided.

What is claimed is:

1. A pillar-shaped semiconductor device comprising:
a first semiconductor pillar formed upright on a substrate;
a second semiconductor pillar formed upright on the substrate adjacent to the first semiconductor pillar;
a first gate insulating layer formed around the first semiconductor pillar;
a second gate insulating layer formed around the second semiconductor pillar;
a first gate conductor layer formed around the first gate insulating layer;
a second gate conductor layer formed around the second gate insulating layer;
a first impurity region formed on a lower portion of the first semiconductor pillar, wherein the first impurity region is doped to have either P or N type conductivity and function as either a source or a drain of the first semiconductor pillar;
a second impurity region formed on a lower portion of the second semiconductor pillar, wherein the second impurity region is doped to have the other of the P or N type conductivity opposite to the conductivity type of the first impurity region and function as either a source or a drain of the second semiconductor pillar, and further wherein the first impurity region and the second impurity region are formed adjacent to each other;
a third impurity region formed on a top portion of the first semiconductor pillar;

a fourth impurity region formed on a top portion of the second semiconductor pillar, wherein the third impurity region and the fourth impurity region have opposite conductivity types;
and a first semiconductor layer formed to isolate the first and second impurity regions from each other and prevent the first or second impurity region from diffusing into the other, wherein the first semiconductor layer has an impurity concentration lower than an impurity concentration of each of the first impurity region and the second impurity region, and the first semiconductor layer has an impurity diffusion coefficient smaller than an impurity diffusion coefficient of each of the first impurity region and the second impurity region.

2. The pillar-shaped semiconductor device according to claim 1, further comprising a second semiconductor layer formed in contact with the first semiconductor layer to further isolate the first and second impurity regions from each other and prevent the first or second impurity region from diffusing into the other, wherein the second semiconductor layer has an impurity concentration lower than the impurity concentration of each of the first impurity region and the second impurity region and has a lattice constant, an etching selectivity ratio, or an impurity diffusion coefficient different from that of the first semiconductor layer.

3. The pillar-shaped semiconductor device according to claim 2, comprising a third semiconductor layer formed, separately from the first semiconductor layer, to isolate one of the first or second impurity region from the substrate and prevent said one of the first and second impurity regions from diffusing into the substrate, wherein the third semiconductor layer has an impurity concentration lower than the impurity concentration of each of the first impurity region and the second impurity region.

* * * * *